(12) United States Patent
Crisp et al.

(10) Patent No.: US 9,423,824 B2
(45) Date of Patent: *Aug. 23, 2016

(54) STUB MINIMIZATION FOR MULTI-DIE WIREBOND ASSEMBLIES WITH PARALLEL WINDOWS

(71) Applicant: Invensas Corporation, San Jose, CA (US)

(72) Inventors: Richard Dewitt Crisp, Hornitos, CA (US); Wael Zohni, San Jose, CA (US); Belgacem Haba, Saratoga, CA (US); Frank Lambrecht, Mountain View, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/545,017

(22) Filed: Mar. 16, 2015

(65) Prior Publication Data

US 2015/0198971 A1    Jul. 16, 2015

Related U.S. Application Data

(63) Continuation of application No. 14/244,060, filed on Apr. 3, 2014, now Pat. No. 8,981,547, which is a continuation of application No. PCT/US2012/057905, filed on Sep. 28, 2012, which is a continuation of (Continued)

(51) Int. Cl.
  *H01L 23/50*  (2006.01)
  *G06F 1/16*  (2006.01)
  (Continued)

(52) U.S. Cl.
  CPC .. *G06F 1/16* (2013.01); *G06F 1/18* (2013.01); *G11C 5/04* (2013.01); *G11C 5/063* (2013.01);
  (Continued)

(58) Field of Classification Search
  CPC ............. H01L 23/50; H01L 23/49838; H01L 23/49827; H01L 25/0652; H01L 25/0657; H01L 25/105

USPC .......................................... 257/686, 690, 707
  See application file for complete search history.

(56) References Cited

U.S. PATENT DOCUMENTS

| 3,670,208 A | 6/1972 | Hovnanian et al. |
| 4,747,081 A | 5/1988 | Heilveil et al. |

(Continued)

FOREIGN PATENT DOCUMENTS

| CN | 1477688 A | 2/2004 |
| CN | 101149964 A | 3/2008 |

(Continued)

OTHER PUBLICATIONS

Kang, et al., 8Gb 3D DDR3 DRAM Using Through-Silicon-Via Technology, IEEE, International Solid-State Circuits Conference, 2009, Samsung Electronics, Hwasung, Korea.

(Continued)

*Primary Examiner* — Michael Lebentritt
(74) *Attorney, Agent, or Firm* — Lerner, David, Littenberg, Krumholz & Mentlik, LLP

(57) ABSTRACT

A microelectronic assembly 5 can include first and second microelectronic packages 10a, 10b mounted to respective first and second opposed surfaces 61, 62 of a circuit panel 60. Each microelectronic package 10a, 10b can include a substrate 20 having first and second apertures 26a, 26b extending between first and second surfaces 21, 22 thereof, first and second microelectronic elements 30a, 30b each having a surface 31 facing the first surface of the substrate and a plurality of contacts 35 exposed at the surface of the respective microelectronic element and aligned with at least one of the apertures, and a plurality of terminals 25a exposed at the second surface in a central region 23 thereof. The apertures 26a, 26b of each substrate 20 can have first and second parallel axes 29a, 29b extending in directions of the lengths of the respective apertures. The central region 23 of the second surface 22 of each substrate 20 can be disposed between the first and second axes 29a, 29b of the respective substrate 20.

22 Claims, 28 Drawing Sheets

Related U.S. Application Data application No. 13/440,515, filed on Apr. 5, 2012, now Pat. No. 8,441,111, which is a continuation-in-part of application No. 13/337,565, filed on Dec. 27, 2011, now Pat. No. 8,436,457, and a continuation-in-part of application No. 13/337,575, filed on Dec. 27, 2011, now Pat. No. 8,345,441, said application No. 14/244,060 is a continuation of application No. PCT/US2012/057895, filed on Sep. 28, 2012, which is a continuation of application No. PCT/US2012/057911, filed on Sep. 28, 2012.

(60) Provisional application No. 61/542,553, filed on Oct. 3, 2011.

(51) Int. Cl.
*G11C 5/04* (2006.01)
*G11C 5/06* (2006.01)
*H01L 25/065* (2006.01)
*H01L 25/10* (2006.01)
*H01L 23/13* (2006.01)
*H01L 23/498* (2006.01)
*G06F 1/18* (2006.01)
*H01L 23/31* (2006.01)
*H01L 23/00* (2006.01)

(52) U.S. Cl.
CPC ............... *G11C 5/066* (2013.01); *H01L 23/13* (2013.01); *H01L 23/49827* (2013.01); *H01L 23/49838* (2013.01); *H01L 23/50* (2013.01); *H01L 25/0652* (2013.01); *H01L 25/0657* (2013.01); *H01L 25/105* (2013.01); *H01L 23/3128* (2013.01); *H01L 24/06* (2013.01); *H01L 24/16* (2013.01); *H01L 24/48* (2013.01); *H01L 24/73* (2013.01); *H01L 2224/0401* (2013.01); *H01L 2224/04042* (2013.01); *H01L 2224/06136* (2013.01); *H01L 2224/06156* (2013.01); *H01L 2224/16225* (2013.01); *H01L 2224/32145* (2013.01); *H01L 2224/32225* (2013.01); *H01L 2224/4824* (2013.01); *H01L 2224/73215* (2013.01); *H01L 2224/73265* (2013.01); *H01L 2225/0651* (2013.01); *H01L 2225/06513* (2013.01); *H01L 2225/06517* (2013.01); *H01L 2225/06562* (2013.01); *H01L 2225/06589* (2013.01); *H01L 2225/107* (2013.01); *H01L 2225/1023* (2013.01); *H01L 2924/01322* (2013.01); *H01L 2924/1431* (2013.01); *H01L 2924/1434* (2013.01); *H01L 2924/15311* (2013.01); *H01L 2924/181* (2013.01); *H01L 2924/18165* (2013.01); *H01L 2924/19041* (2013.01); *H01L 2924/19103* (2013.01); *H01L 2924/3011* (2013.01)

(56) References Cited

U.S. PATENT DOCUMENTS

| | | | |
|---|---|---|---|
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |
| 5,480,840 A | 1/1996 | Barnes et al. |
| 5,679,977 A | 10/1997 | Khandros et al. |
| 5,691,570 A | 11/1997 | Kozuka |
| 5,751,553 A | 5/1998 | Clayton |
| 5,777,391 A | 7/1998 | Nakamura et al. |
| 5,821,614 A | 10/1998 | Hashimoto et al. |
| 5,899,705 A | 5/1999 | Akram |
| 5,929,517 A | 7/1999 | Distefano et al. |
| 5,936,305 A | 8/1999 | Akram |
| 5,949,700 A | 9/1999 | Furukawa et al. |
| 5,973,403 A | 10/1999 | Wark |
| 6,086,386 A | 7/2000 | Fjelstad et al. |
| 6,130,116 A | 10/2000 | Smith et al. |
| 6,159,837 A | 12/2000 | Yamaji et al. |
| 6,177,636 B1 | 1/2001 | Fjelstad |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,313,532 B1 | 11/2001 | Shimoishizaka et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Iwaya et al. |
| 6,461,895 B1 | 10/2002 | Liang et al. |
| 6,462,423 B1 | 10/2002 | Akram et al. |
| 6,518,794 B2 | 2/2003 | Coteus et al. |
| 6,521,981 B2 | 2/2003 | Miyazaki et al. |
| 6,560,134 B2 | 5/2003 | Brox et al. |
| 6,577,004 B1 | 6/2003 | Rumsey et al. |
| 6,611,057 B2 | 8/2003 | Mikubo et al. |
| 6,617,695 B1 | 9/2003 | Kasatani |
| 6,619,973 B2 | 9/2003 | Perino et al. |
| 6,620,648 B2 | 9/2003 | Yang |
| 6,628,528 B2 | 9/2003 | Schoenborn |
| 6,633,078 B2 | 10/2003 | Hamaguchi et al. |
| 6,658,530 B1 | 12/2003 | Robertson et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,943,057 B1 | 9/2005 | Shim et al. |
| 6,977,440 B2 | 12/2005 | Pflughaupt et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,074,696 B1 | 7/2006 | Frankowsky et al. |
| 7,091,064 B2 | 8/2006 | Jiang |
| 7,122,897 B2 | 10/2006 | Aiba et al. |
| 7,123,497 B2 | 10/2006 | Matsui et al. |
| 7,138,709 B2 | 11/2006 | Kumamoto |
| 7,141,879 B2 | 11/2006 | Wakamiya et al. |
| 7,145,226 B2 | 12/2006 | Kumamoto |
| 7,151,319 B2 | 12/2006 | Iida et al. |
| 7,164,149 B2 | 1/2007 | Matsubara |
| 7,170,158 B2 | 1/2007 | Choi et al. |
| 7,262,507 B2 | 8/2007 | Hino et al. |
| 7,272,888 B2 | 9/2007 | DiStefano |
| 7,294,928 B2 | 11/2007 | Bang et al. |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,420,284 B2 | 9/2008 | Miyazaki et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |

(56) References Cited

U.S. PATENT DOCUMENTS

| | | |
|---|---|---|
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,278 B2 | 4/2010 | Periaman et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,855,445 B2 | 12/2010 | Landry et al. |
| 7,989,940 B2 | 8/2011 | Haba et al. |
| RE42,972 E | 11/2011 | Nakamura et al. |
| 8,072,037 B2 | 12/2011 | Murphy et al. |
| 8,138,015 B2 | 3/2012 | Joseph et al. |
| 8,254,155 B1 | 8/2012 | Crisp et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |
| 8,426,983 B2 | 4/2013 | Takeda et al. |
| 8,432,046 B2 | 4/2013 | Miyata et al. |
| 8,436,457 B2 | 5/2013 | Crisp et al. |
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 | 3/2014 | Crisp et al. |
| 8,823,165 B2 | 9/2014 | Haba et al. |
| 8,902,680 B2 | 12/2014 | Yamamoto |
| 8,917,532 B2 | 12/2014 | Crisp et al. |
| 8,981,547 B2 * | 3/2015 | Crisp .................. G11C 5/04 257/686 |
| 2001/0002727 A1 | 6/2001 | Shiraishi et al. |
| 2001/0013662 A1 | 8/2001 | Kudou et al. |
| 2001/0022740 A1 | 9/2001 | Nuxoll et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda et al. |
| 2002/0043719 A1 | 4/2002 | Iwaya et al. |
| 2002/0053727 A1 | 5/2002 | Kimura |
| 2002/0053732 A1 | 5/2002 | Iwaya et al. |
| 2002/0066950 A1 | 6/2002 | Joshi |
| 2002/0105096 A1 | 8/2002 | Hirata et al. |
| 2002/0130412 A1 | 9/2002 | Nagai et al. |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107118 A1 | 6/2003 | Pflughaupt et al. |
| 2003/0107908 A1 | 6/2003 | Jang et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0074930 A1 | 3/2008 | Kanda |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0102428 A1 | 4/2010 | Lee et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0149493 A1 | 6/2011 | Kwon et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0153435 A1 | 6/2012 | Haba et al. |
| 2012/0155049 A1 | 6/2012 | Haba et al. |
| 2012/0206181 A1 | 8/2012 | Lin et al. |
| 2012/0217645 A1 | 8/2012 | Pagaila |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |

(56) References Cited

U.S. PATENT DOCUMENTS

| | | | |
|---|---|---|---|
| 2014/0055941 | A1 | 2/2014 | Crisp et al. |
| 2014/0055942 | A1 | 2/2014 | Crisp et al. |
| 2014/0055970 | A1 | 2/2014 | Crisp et al. |

FOREIGN PATENT DOCUMENTS

| | | | |
|---|---|---|---|
| EP | 1205977 | A2 | 5/2002 |
| JP | 61-093694 | | 5/1986 |
| JP | 63-232389 | | 9/1988 |
| JP | 64-001257 | A | 1/1989 |
| JP | H11-087640 | | 3/1999 |
| JP | 2000315776 | A | 11/2000 |
| JP | 2002-076252 | A | 3/2002 |
| JP | 2002083897 | A | 3/2002 |
| JP | 2003051545 | A | 2/2003 |
| JP | 2004-063767 | A | 2/2004 |
| JP | 2004152131 | A | 5/2004 |
| JP | 2007013146 | A | 1/2007 |
| JP | 2007149977 | A | 6/2007 |
| JP | 2008016666 | A | 1/2008 |
| JP | 2008-198841 | A | 8/2008 |
| JP | 3143893 | U | 8/2008 |
| JP | 2010-098098 | A | 4/2010 |
| JP | 2011155203 | A | 8/2011 |
| KR | 2001-0002214 | A | 1/2001 |
| KR | 2005-0119414 | A | 12/2005 |
| KR | 2006-0120365 | A | 11/2006 |
| KR | 2007-0088177 | A | 8/2007 |
| KR | 2009-0008341 | A | 1/2009 |
| KR | 2009-0086314 | A | 8/2009 |
| TW | 312044 | | 8/1997 |
| TW | 428258 | | 4/2001 |
| TW | 429561 | | 4/2001 |
| TW | 478137 | B | 3/2002 |
| TW | 567593 | B | 12/2003 |
| TW | M338433 | U | 8/2008 |
| TW | 200842998 | A | 11/2008 |
| TW | 200901194 | A | 1/2009 |
| TW | 200926312 | A | 6/2009 |
| TW | M363079 | U | 8/2009 |
| TW | M398313 | | 2/2011 |
| TW | 201115659 | A | 5/2011 |
| TW | 201208004 | | 2/2012 |
| TW | M426922 | U | 4/2012 |
| TW | 201222684 | | 6/2012 |
| TW | 201234556 | A | 8/2012 |
| WO | 2010120310 | A1 | 10/2010 |

OTHER PUBLICATIONS

U.S. Appl. No. 13/306,300, filed Nov. 29, 2011.
U.S. Appl. No. 13/346,201, filed Jan. 9, 2012.
U.S. Appl. No. 13/080,876, filed Apr. 6, 2011.
U.S. Appl. No. 13/306,068, filed Nov. 29, 2011.
U.S. Appl. No. 13/346,185, filed Jan. 9, 2012.
U.S. Appl. No. 13/337,565, filed Dec. 27, 2011.
U.S. Appl. No. 13/440,313, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/439,286, filed Apr. 5, 2012.
U.S. Appl. No. 13/354,747, filed Jan. 20, 2012.
U.S. Appl. No. 13/354,772, filed Jan. 20, 2012.
Kang, et al., 8Gb 3D DDR3 DRAM Using Through-Silicon-Via Technology, IEEE, International Solid-State Circuits Conference, 2009, pp. 130-132.
U.S. Appl. No. 13/337,575, filed Dec. 27, 2011.
U.S. Appl. No. 13/440,515, filed Apr. 5, 2012.
Sandforce, "SF-2200 & SF-2100 Client SSD Processors", 2011.
U.S. Appl. No. 13/439,299, filed Apr. 4, 2012.
U.S. Appl. No. 13/439,354, filed Apr. 4, 2012.
U.S. Appl. No. 13/439,273, filed Apr. 4, 2012.
U.S. Appl. No. 13/439,228, filed Apr. 4, 2012.
U.S. Appl. No. 13/440,299, filed Apr. 5, 2012.
U.S. Appl. No. 13/440,290, filed Apr. 5, 2012.
U.S. Appl. No. 13/440,199, filed Apr. 5, 2012.
U.S. Appl. No. 13/440,280, filed Apr. 5, 2012.
Elpida User's Manual, "Introduction to GDDR5 SGRAM", Document No. E1600E10 (Ver. 1.0), Published Mar. 2010, Japan, URL: http:www.elpida.com.
Hynix, "2GB (64M×32) GDDR5 SGRAM HRGQ2H24AFR", Nov. 2011-Feb. 2012.
Partial International Search Report dated Oct. 26, 2012 in International Patent Appl. No. PCT/US2012/046049.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
US Non-Final Office Action for U.S. Appl. No. 13/440,199 dated Aug. 31, 2012.
US Non-Final Office Action for U.S. Appl. No. 13/440,280 dated Aug. 31, 2012.
US Amendment for U.S. Appl. No. 13/440,280 dated Nov. 30, 2012.
US Amendment for U.S. Appl. No. 13/440,199 dated Nov. 30, 2012.
US Non Final Office Action dated Oct. 18, 2012 for U.S. Appl. No. 13/439,299.
International Search Report and Written Opinion for Application No. PCT/US2012/046049 dated Jan. 10, 2013.
International Search Report and Written Opinion for Application No. PCT/US2012/046049 dated Nov. 29, 2012.
US Amendment for U.S. Appl. No. 13/439,299 dated Jan. 18, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/057170 dated Jan. 31, 2013.
Partial Search Report for Application No. PCT/US2012/000425 dated Jan. 30, 2013.
Partial Search Report for Application No. PCT/US2012/058557 dated Feb. 4, 2013.
International Search Report and Written Opinion for Application No. PCT/US2012/057563 dated Mar. 5, 2013.
International Search Report and Written Opinion for Application No. PCT/US2012/057554 dated Feb. 28, 2013.
International Search Report and Written Opinion for Application No. PCT/US2012/057200 dated Mar. 1, 2013.
International Search Report and Written Opinion for Application No. PCT/US2012/058273 dated Mar. 6, 2013.
International Search Report and Written Opinion for Application No. PCT/US2012/058557 dated Mar. 12, 2013.
International Search Report and Written Opinion for Application No. PCT/US2012/046249 dated Mar. 20, 2013.
International Search Report and Written Opinion for Application No. PCT/US2012/057170 dated Mar. 22, 2013.
Taiwanese Office Action for Application No. 101125193 dated Aug. 4, 2015.
Taiwanese Office Action for Application No. 101136578 dated May 12, 2015.
Taiwanese Office Action for Application No. 101136577 dated May 12, 2015.
Taiwanese Office Action for Application No. 102130519 dated May 7, 2015.
Written Opinion of the International Preliminary Examining Authority for Application No. PCT/US2014/041709 dated Jun. 1, 2015.
International Search Report and Written Opinion for Application No. PCT/US2012/058423 dated Mar. 20, 2013.
International Search Report and Written Opinion dated Mar. 21, 2013 for Application No. PCT/US2012/057911.
International Search Report and Written Opinion for Application No. PCT/US2012/046255 dated Mar. 20, 2013.
International Search Report and Written Opinion dated Mar. 21, 2013 for Application No. PCT/US2012/000425.
International Search Report and Written Opinion for Application No. PCT/US2012/058407 dated Mar. 28, 2013.
International Search Report and Written Opinion for Application No. PCT/US2012/057179 dated Apr. 4, 2013.

(56) References Cited

OTHER PUBLICATIONS

International Search Report and Written Opinion for Application No. PCT/US2012/057895 dated Jun. 10, 2013.
International Search Report and Written Opinion for Application No. PCT/US2012/058434 dated Jun. 21, 2013.
International Search Report and Written Opinion for Application No. PCT/US2012/058398 dated Jul. 4, 2013.
International Search Report and Written Opinion for Application No. PCT/US2012/058229 dated Jul. 3, 2013.
International Search Report and Written Opinion for Application No. PCT/US2012/057810 dated Jul. 23, 2013.
International Search Report for Application No. PCT/US2012/057173 dated Aug. 5, 2013.
International Search Report for Application No. PCT/US2012/057905 dated Aug. 20, 2013.
International Search Report and Written Opinion for Application No. PCT/US2012/057204 dated Aug. 30, 2013.
International Search Report and Written Opinion for Application No. PCT/US2013/056773 dated Dec. 4, 2013.
International Search Report and Written Opinion for Application PCT/US2013/056777 dated Jan. 2, 2014.
U.S. Appl. No. 13/839,402, filed Mar. 15, 2013.
U.S. Appl. No. 13/841,052, filed Mar. 15, 2013.
U.S. Appl. No. 13/840,542, filed Mar. 15, 2013.
U.S. Appl. No. 13/840,353, filed Mar. 15, 2013.
U.S. Appl. No. 61/477,877, filed Apr. 21, 2011.
Office Action from Taiwan for Application No. 101125197 dated May 19, 2014.
Taiwanese Allowance and Search Report for Application No. 101136592 dated Jun. 27, 2014.
Taiwanese Office Action for Application No. 101136594 dated Aug. 13, 2014.
Taiwanese Office Action for Application No. 101136595 dated Oct. 27, 2014.
International Search Report and Written Opinion for Application No. PCT/US2014/041709 dated Nov. 4, 2014.
Taiwanese Office Action for Application No. 101136575 dated Oct. 28, 2014.
International Search Report and Written Opinion for Application No. PCT/US2013/056777 dated Jan. 21, 2015.
Taiwanese Office Action for Application No. 101136585 dated Jan. 21, 2015.
Taiwanese Notice of Allowance for Application No. 102130518 dated Mar. 31, 2015.
Taiwanese Office Action for Application No. 101136606 dated Mar. 27, 2015.
International Search Report and Written Opinion for Application No. PCT/US2015/042726 dated Nov. 12, 2015.
Chinese Office Action for Application No. 201280044481.5 dated Dec. 25, 2015.
Chinese Office Action for Application No. 201280044482.X dated Jan. 25, 2016.
Chinese Office Action for Application No. CN201280043482.8 dated Jan. 19, 2016.

* cited by examiner

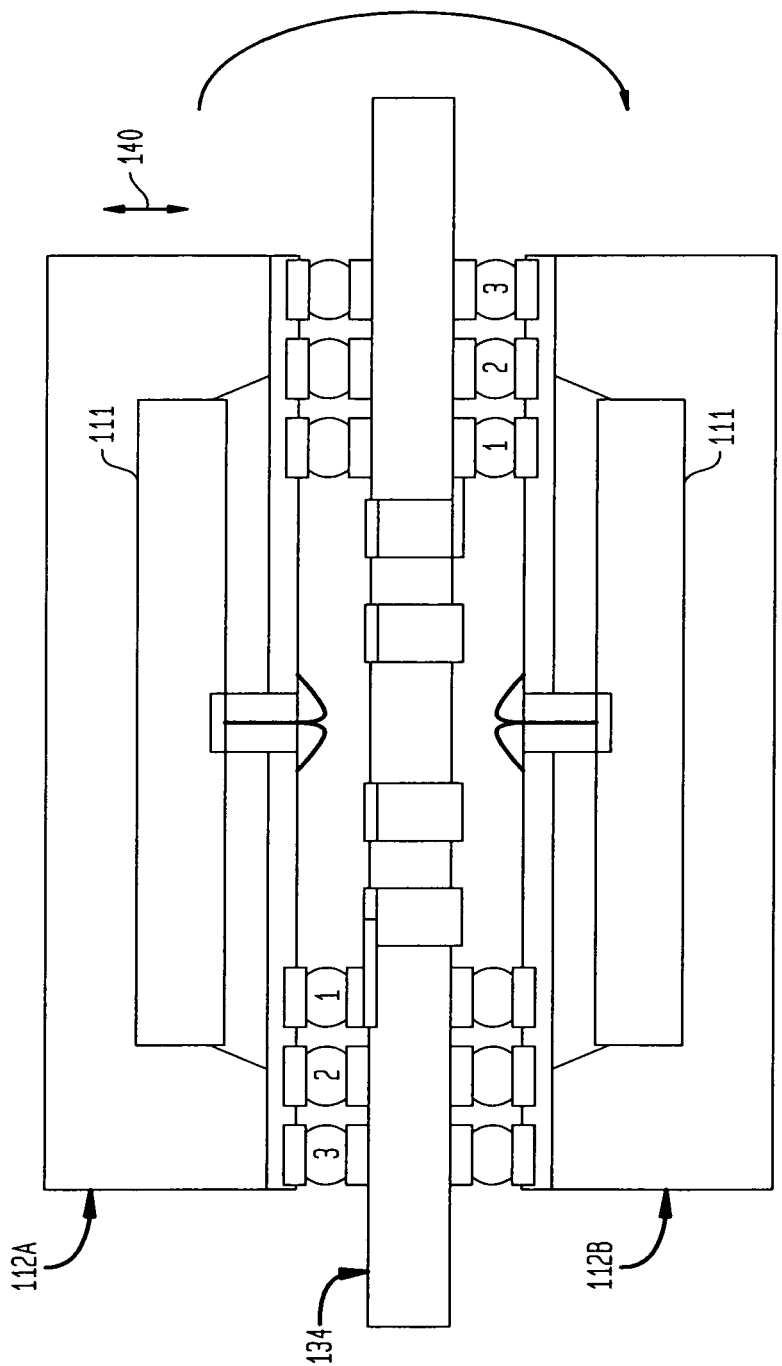

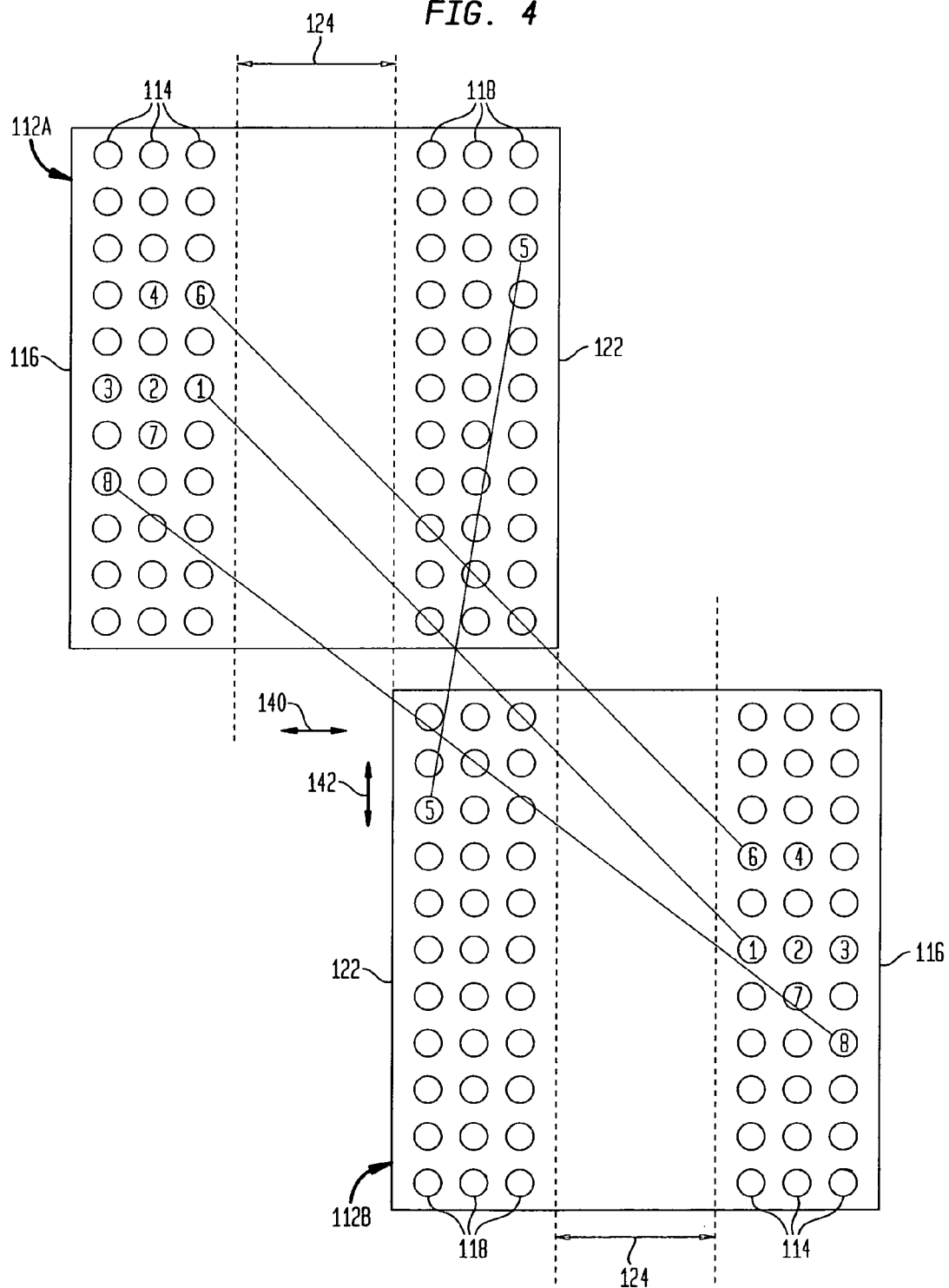

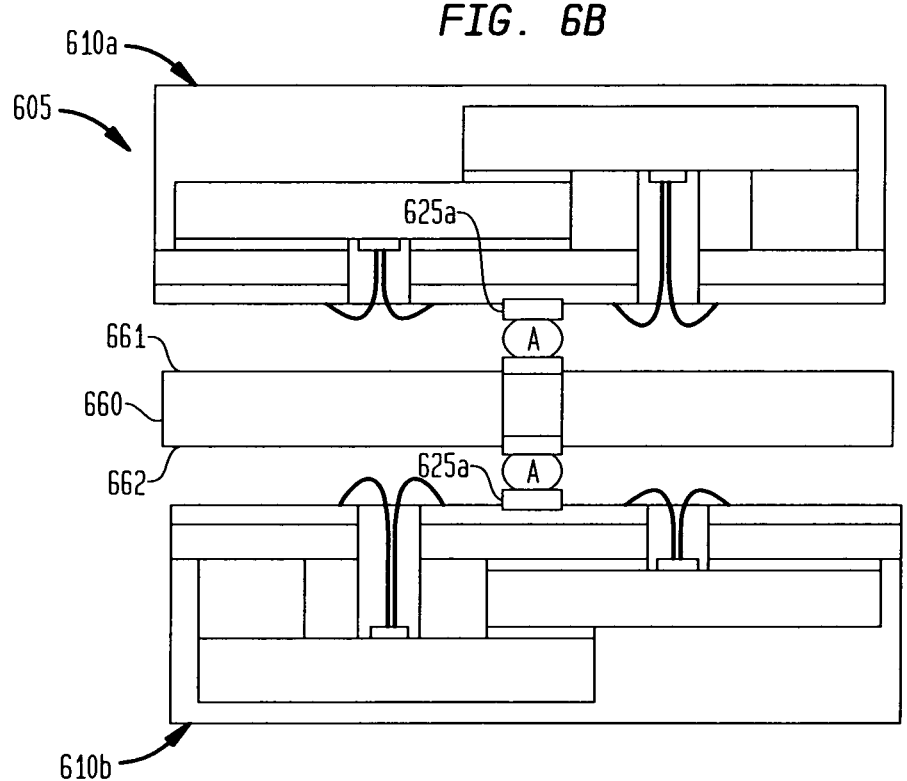

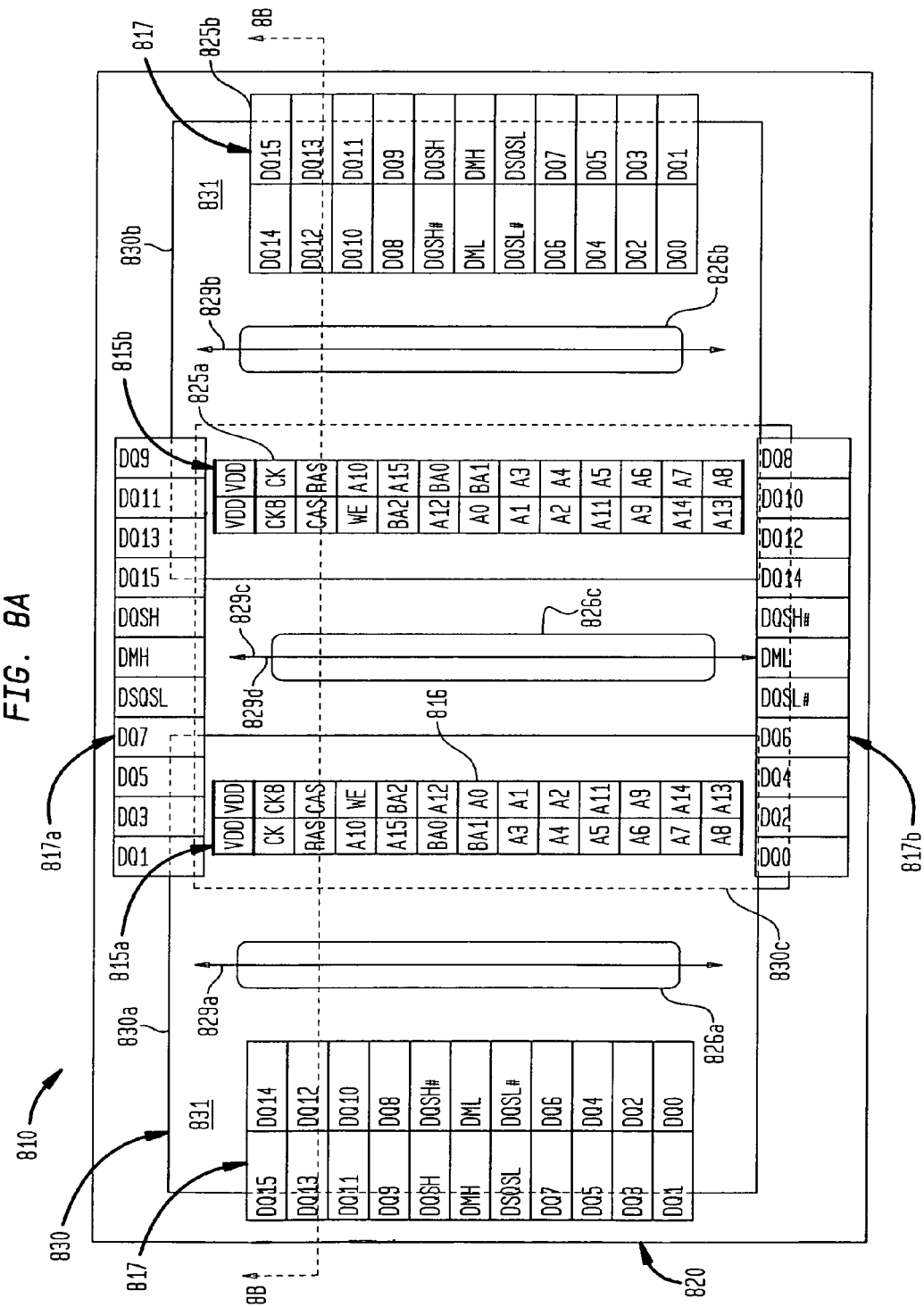

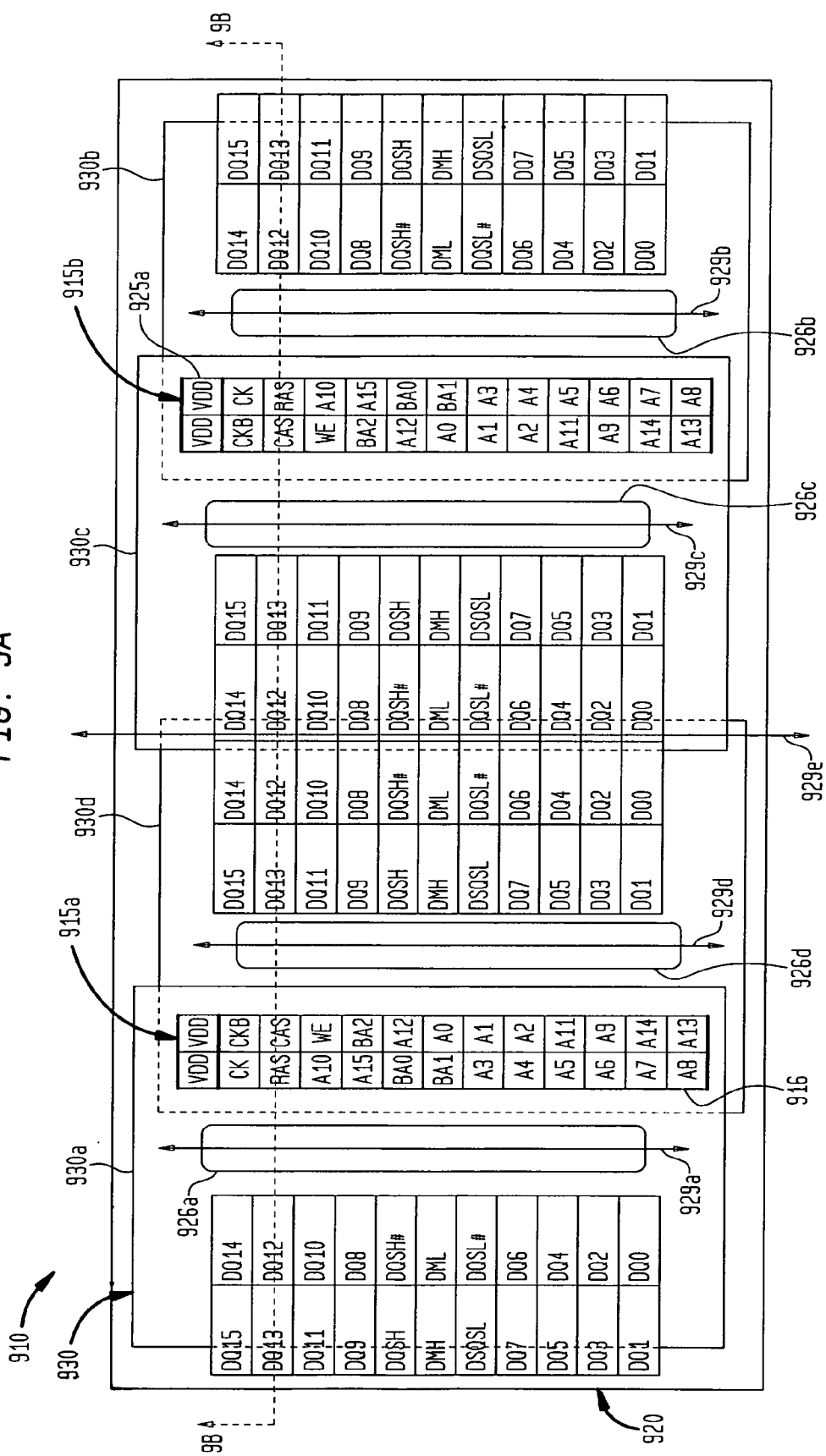

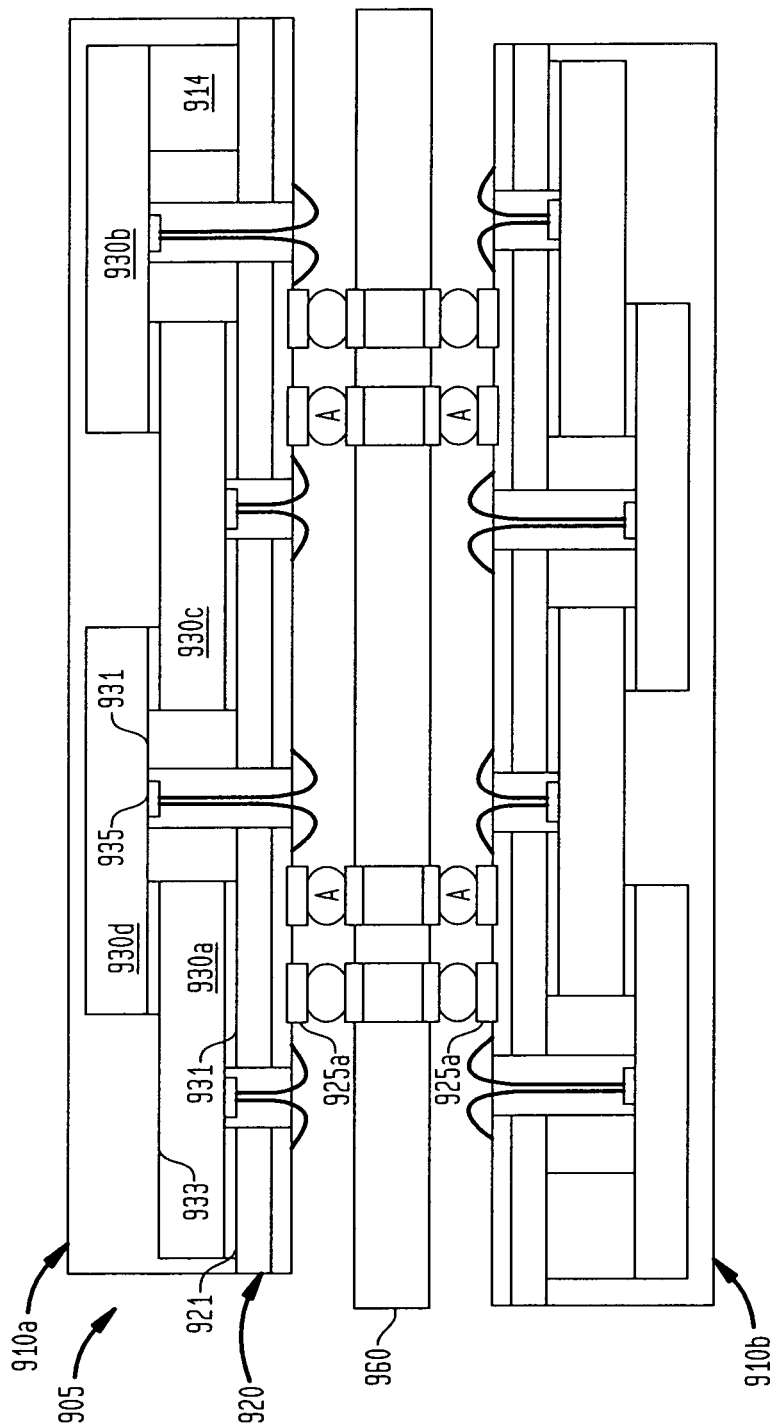

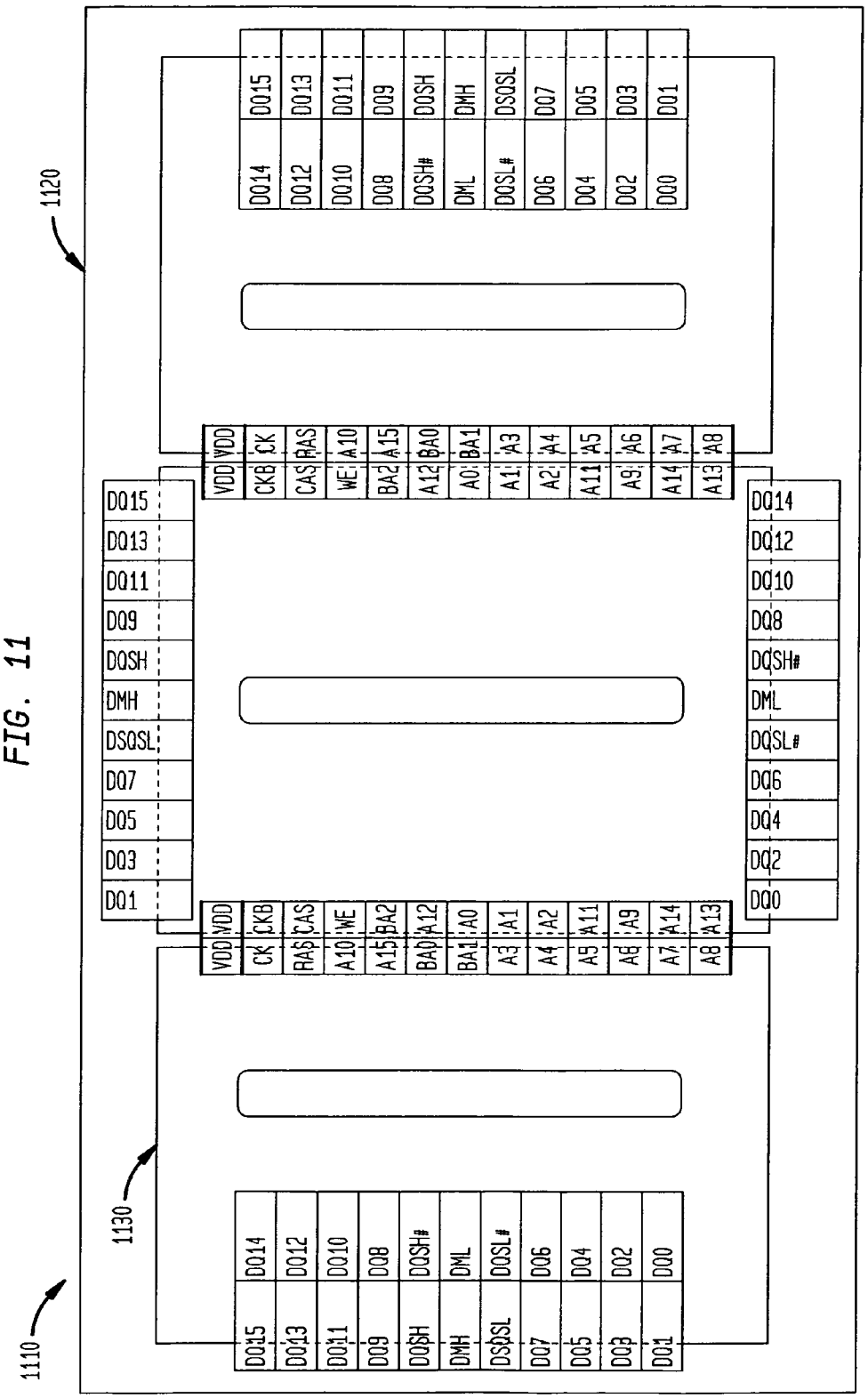

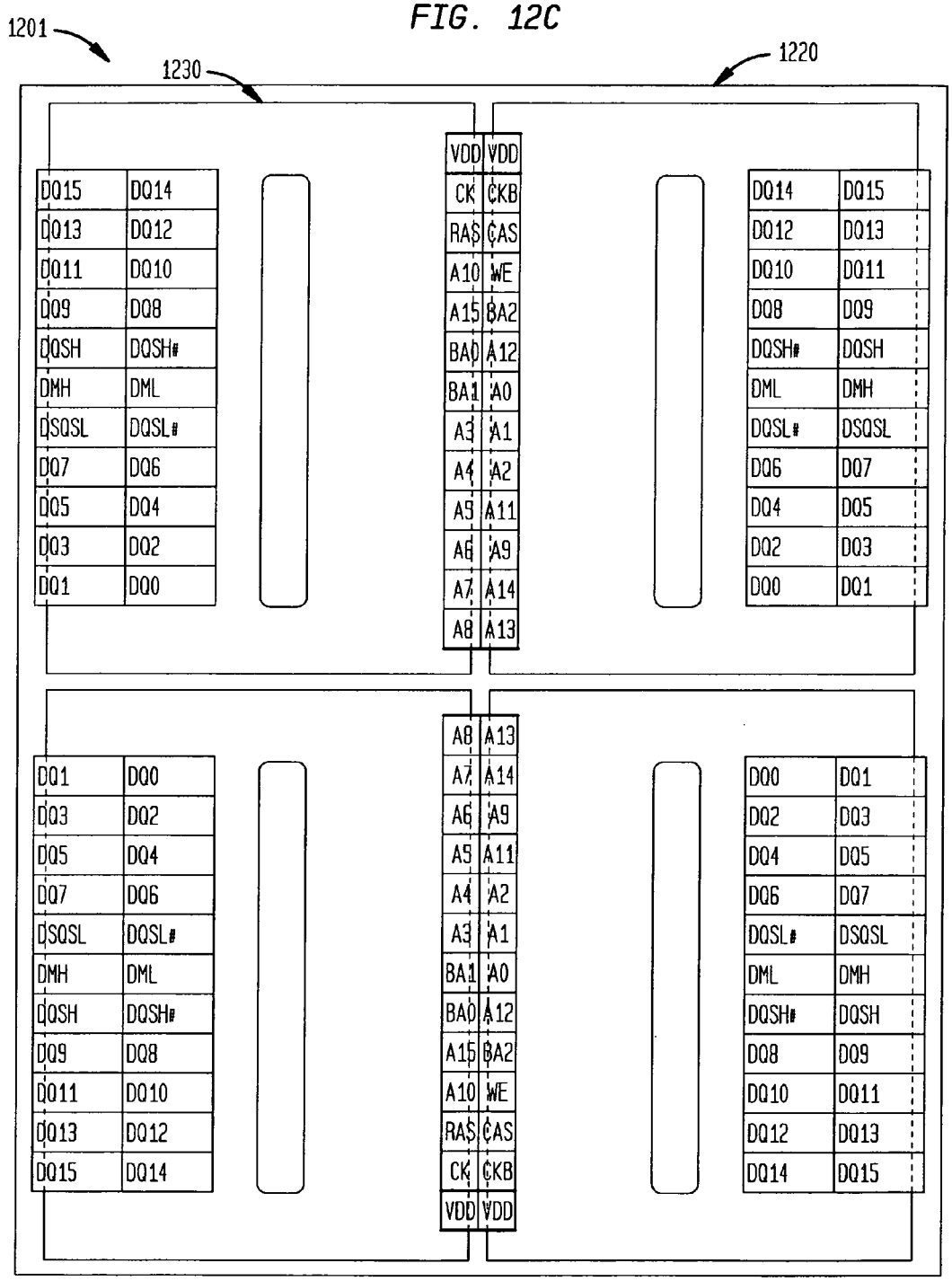

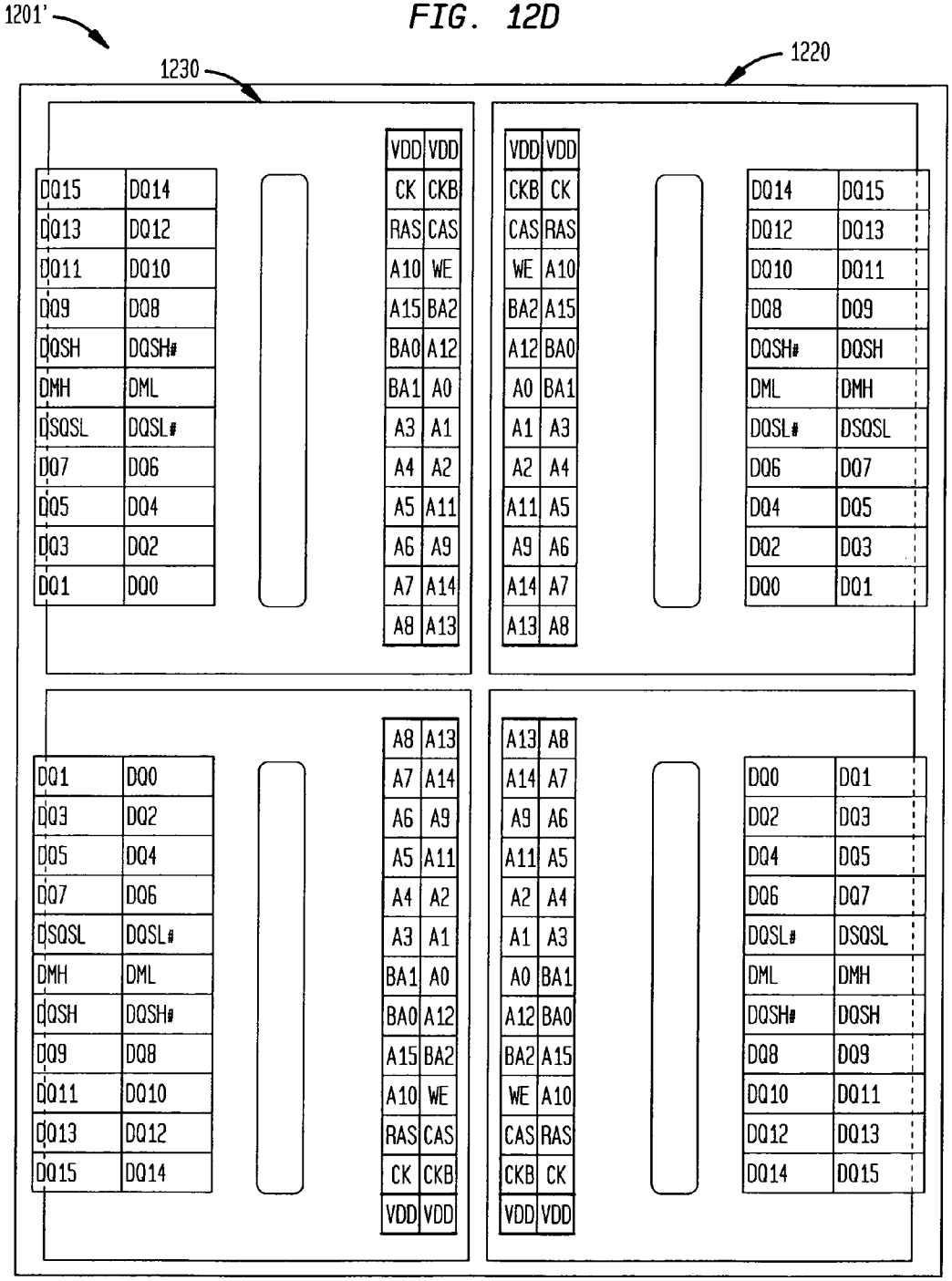

STUB MINIMIZATION FOR MULTI-DIE WIREBOND ASSEMBLIES WITH PARALLEL WINDOWS

CROSS-REFERENCE TO RELATED APPLICATIONS

The present application is a continuation of U.S. patent application Ser. No. 14/244,060, filed Apr. 3, 2014, which is a continuation of International Application Nos. PCT/US2012/057895, PCT/US2012/057905, and PCT/US2012/057911, all filed Sep. 28, 2012, each of which is a continuation of U.S. patent application Ser. No. 13/440,515, filed Apr. 5, 2012, now U.S. Pat. No. 8,441,111, which is a continuation-in-part of U.S. patent application Ser. Nos. 13/337,565 and 13/337,575, both filed Dec. 27, 2011, now U.S. Pat. Nos. 8,436,457 and 8,345,441, respectively, each of which claims the benefit of the filing date of U.S. Provisional Patent Application No. 61/542,553, filed Oct. 3, 2011, all the disclosures of which are hereby incorporated herein by reference.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts on the face of the substrate by solder bumps or other connecting elements. In turn, the substrate can be bonded to a circuit panel through the external terminals that overlie the substrate. The "flip-chip" design provides a relatively compact arrangement. Some flip-chip packages are commonly referred to as "chip-scale packages" in which each package occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips, are commonly packaged in single- or multiple-chip packages and assemblies. Each package has many electrical connections for carrying signals, power, and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

The transmission of signals within packages to chips of multi-chip packages poses particular challenges, especially for signals common to two or more chips in the package such as clock signals, and address and strobe signals for memory chips. Within such multi-chip packages, the lengths of the connection paths between the terminals of the package and the chips can vary. The different path lengths can cause the signals to take longer or shorter times to travel between the terminals and each chip. Travel time of a signal from one point to another is called "propagation delay" and is a function of the conductor length, the conductor's structure, and other dielectric or conductive structure in close proximity therewith.

Differences in the times at which two different signals reach a particular location can also be called "skew". The skew in the arrival times of a particular signal at two or more locations is a result of both propagation delay and the times at which the particular signal starts to travel towards the locations. Skew may or may not impact circuit performance. Skew often has little impact on performance when all signals in a synchronous group of signals are skewed together, in which case all signals needed for operation arrive together when needed. However, this is not the case when different signals of a group of synchronous signals needed for operation arrive at different times. In this case the skew impacts performance because the operation cannot be performed unless all needed signals have arrived. The embodiments described herein can include features that minimize skew that are disclosed in the copending U.S. patent application Ser. No. 13/306,068, the disclosure of which is incorporated by reference herein.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted.

For example, in one conventional microelectronic package 112 seen in FIG. 1, three columns 114 of terminals can be disposed adjacent a first peripheral edge 116 of the package substrate 120 and three other columns 118 of terminals can be disposed adjacent a second peripheral edge 122 of the package substrate 120. A central region 124 of the package substrate 120 in the conventional package does not have any columns of terminals. FIG. 1 further shows a semiconductor chip 111 within the package having element contacts 126 on a face 128 thereof that are electrically interconnected with the columns 114, 118 of terminals of the package 112 through wire bonds 130 extending through an aperture, e.g., bond window, in the central region 124 of the package substrate 120. In some cases, an adhesive layer 132 may be disposed between the face 128 of the microelectronic element 111 and the substrate 120 to reinforce the mechanical connection between the microelectronic element and the substrate, with the wire bonds 130 extending through an opening in the adhesive layer.

In light of the foregoing, certain improvements in the positioning of terminals on microelectronic packages can be made in order to improve electrical performance, particularly in assemblies that include such packages and a circuit panel to which such packages can be mounted and electrically interconnected with one another.

BRIEF SUMMARY OF THE INVENTION

In accordance with an aspect of the invention, a microelectronic package can include a substrate having first and second opposed surfaces and first and second apertures extending between the first and second surfaces, first and second microelectronic elements each having a surface facing the first surface of the substrate and a plurality of contacts exposed at the surface of the respective microelectronic element and aligned with at least one of the apertures, a plurality of terminals exposed at the second surface in a central region thereof, and leads electrically connected between the contacts of each microelectronic element and the terminals. The apertures can have first and second parallel axes extending in directions of the lengths of the respective apertures. The central region of the second surface can be disposed between the first and second axes.

Each microelectronic element can have memory storage array function. The terminals can be configured for connecting the microelectronic package to at least one component external to the package. Each lead can have a portion aligned with at least one of the apertures. The terminals can be configured to carry address information usable by circuitry within the microelectronic package to determine an addressable memory location from among all the available addressable memory locations of a memory storage array of at least one of the microelectronic elements.

In one example, each of the microelectronic elements can embody a greater number of active devices to provide memory storage array function than any other function. In a particular embodiment, the terminals can be configured to carry all of the address information usable by the circuitry within the microelectronic package to determine the addressable memory location. In one example, the terminals can be configured to carry information that controls an operating mode of the microelectronic elements. In an exemplary embodiment, the terminals can be configured to carry all of the command signals transferred to the microelectronic package, the command signals being write enable, row address strobe, and column address strobe signals. In a particular example, the terminals can be configured to carry clock signals transferred to the microelectronic package, the clock signals being clocks used for sampling signals carrying the address information. In one embodiment, the terminals can be configured to carry all of the bank address signals transferred to the microelectronic package. In one example, the substrate can be an element consisting essentially of a material having a CTE in a plane of the substrate less than 12 ppm/° C. In a particular embodiment, the substrate can include a dielectric element consisting essentially of a material having a CTE in a plane of the substrate less than 30 ppm/° C.

In one example, the terminals can be first terminals and the second surface can have peripheral regions between the central region and first and second opposed edges extending between the first and second surfaces of the substrate. The microelectronic package can also include a plurality of second terminals. At least some of the second terminals can be exposed at the second surface in at least one of the peripheral regions. The second terminals can be configured for connecting the microelectronic package to at least one component external to the microelectronic package. In an exemplary embodiment, at least some of the second terminals can be configured to carry information other than the address information. In a particular example, at least some of the second terminals that are configured to carry information other than the address information can be exposed at the second surface in the central region. In one embodiment, at least some of the leads can include wire bonds extending through at least one of the apertures. In an exemplary embodiment, all of the leads can be wire bonds extending through at least one of the apertures. In a particular embodiment, at least some of the leads can include lead bonds.

In one example, the surface of the first microelectronic element can confront the first surface of the substrate. The surface of the second microelectronic element can at least partially overlie a rear surface of the first microelectronic element. In an exemplary embodiment, the surfaces of all of the microelectronic elements can be arranged in a single plane parallel to the first surface of the substrate. In one example, the microelectronic package can also include a heat spreader in thermal communication with at least one of the microelectronic elements. In a particular example, each of the microelectronic elements' memory storage array function can be implemented in NAND flash, resistive RAM, phase-change memory, magnetic RAM, static RAM, dynamic RAM, spin-torque RAM, or content-addressable memory technology. In one example, each of the microelectronic elements can include a dynamic random access memory ("DRAM") integrated circuit chip. In a particular example, each of the microelectronic elements can be functionally and mechanically equivalent to the other ones of the microelectronic elements. In one embodiment, the microelectronic package can also include a semiconductor element electrically connected to at least some of the terminals and one or more of the microelectronic elements in the microelectronic package. The semiconductor element can be configured to at least one of: regenerate or at least partially decode at least one signal received at one or more of the terminals of the microelectronic package.

In a particular embodiment, the terminals may be arranged in no more than four columns. In one example, the columns can be parallel to the axes of the apertures. In an exemplary embodiment, the terminals may be arranged in no more than two columns. In one embodiment, the terminals can be arranged in first and second parallel columns. In one example, the terminals can be arranged in a single column. In a particular embodiment, the contacts of each of the first and second microelectronic elements can be arranged in a single column.

In one example, the microelectronic package can also include a third microelectronic element having a surface facing the first surface of the substrate. The third microelectronic element can have memory storage array function. In one embodiment, the substrate can have a third aperture having a third axis extending in a direction of the length of the third aperture. The third axis can be parallel to the first and second axes. The third microelectronic element can have a plurality of contacts exposed at the surface thereof and aligned with at least one of the apertures. The microelectronic package can also include second leads electrically connected between the contacts of the third microelectronic element and the terminals. Each of the second leads can have a portion aligned with at least one of the apertures. In an exemplary embodiment, the microelectronic package can also include a fourth microelectronic element having a surface facing the first surface of the substrate. The fourth microelectronic element can have memory storage array function. In a particular example, the substrate can have third and fourth apertures. The third and fourth microelectronic elements can each have a plurality of contacts exposed at the surface thereof and aligned with at least one of the apertures. The microelectronic package can also include second leads electrically connected between the contacts of each of the third and fourth microelectronic elements and the terminals. Each of the second leads can have a portion aligned with at least one of the apertures.

In one embodiment, the third and fourth apertures can have third and fourth respective parallel axes extending in directions of the lengths of the apertures. The third axis can be parallel to the first axis. In a particular embodiment, the first axis can extend in a direction of the length of the third aperture. The second axis can extend in a direction of the length of the fourth aperture. In one example, the surfaces of the first and third microelectronic elements can be arranged in a single plane parallel to the second surface of the substrate. The surface of each of the second and fourth microelectronic elements can at least partially overlie a rear surface of at least one of the third and first microelectronic elements.

In accordance with another aspect of the invention, a microelectronic package can include a substrate having first and second opposed surfaces and first and second apertures extending between the first and second surfaces, first and second microelectronic elements each having a surface facing the first surface of the substrate and a plurality of contacts at the surface of the respective microelectronic element aligned with at least one of the apertures, a plurality of terminals exposed at the second surface in a central region thereof, and leads electrically connected between the contacts of each microelectronic element and the terminals. The apertures can have first and second parallel axes extending in directions of the lengths of the respective apertures. The central region of the second surface can be disposed between the first and second axes.

Each microelectronic element can embody a greater number of active devices to provide memory storage array function than any other function. The terminals can be configured for connecting the microelectronic package to at least one component external to the package. Each lead can have a portion aligned with at least one of the apertures. The terminals can be configured to carry a majority of the address information usable by circuitry within the microelectronic package to determine an addressable memory location from among all the available addressable memory locations of a memory storage array within the microelectronic elements.

In a particular example, the terminals can be configured to carry at least three-quarters of the address information usable by the circuitry within the microelectronic package to determine the addressable memory location.

In accordance with an aspect of the invention, a microelectronic package can include a substrate having first and second opposed surfaces and first and second apertures extending between the first and second surfaces, first and second microelectronic elements each having a surface facing the first surface of the substrate and a plurality of contacts exposed at the surface of the respective microelectronic element and aligned with at least one of the apertures, a plurality of terminals exposed at the second surface in a central region thereof, and leads electrically connected between the contacts of each microelectronic element and the terminals. The apertures can have first and second parallel axes extending in directions of the lengths of the respective apertures. The central region of the second surface can be disposed between the first and second axes.

Each microelectronic element can have memory storage array function. Each lead can have a portion aligned with at least one of the apertures. The terminals can be configured for connecting the microelectronic package to at least one component external to the package. The terminals can include a first set thereof disposed on a first side of a theoretical third axis and a second set thereof disposed on a second side of the third axis opposite from the first side. Each of the first and second sets of terminals can be configured to carry address information usable by circuitry within the microelectronic package to determine an addressable memory location from among all the available addressable memory locations of a memory storage array of at least one of the microelectronic elements. The signal assignments of the first terminals in the first set can be a mirror image of the signal assignments of the first terminals in the second set.

In one example, each of the microelectronic elements can embody a greater number of active devices to provide memory storage array function than any other function. In an exemplary embodiment, the terminals of each of the first and second sets can be configured to carry all of the address information usable by the circuitry within the microelectronic package to determine the addressable memory location. In a particular example, the terminals of each of the first and second sets can be configured to carry information that controls an operating mode of the microelectronic elements. In one embodiment, the terminals of each of the first and second sets can be configured to carry all of the command signals transferred to the microelectronic package, the command signals being write enable, row address strobe, and column address strobe signals.

In a particular embodiment, the terminals of each of the first and second sets can be configured to carry clock signals transferred to the microelectronic package, the clock signals being clocks used for sampling signals carrying the address information. In one example, the terminals of each of the first and second sets can be configured to carry all of the bank address signals transferred to the microelectronic package. In an exemplary embodiment, the terminals of the first and second sets can be disposed at positions within respective first and second grids, and columns of terminals in the first and second grids can extend in a direction parallel to first and second opposed edges of the substrate. In a particular example, the third axis may be not more than a distance of three and one-half times a minimum pitch between any two adjacent columns of the terminals from a line parallel to and equidistant from the first and second edges of the substrate.

In one embodiment, the third axis may be not more than a distance of a minimum pitch between any two adjacent columns of the terminals from a line parallel to and equidistant from the first and second edges of the substrate. In a particular embodiment, the terminals of the first and second sets can be disposed at positions within respective first and second grids, and columns of terminals in the first and second grids can extend in a direction parallel to the first and second axes. In one example, a column axis which extends through centers of a majority of the terminals of a particular column containing at least some terminals may not extend through the center of one or more of the terminals of such column. In an exemplary embodiment, the column axis may not extend through at least one of the one or more non-centered terminals of the column.

In a particular example, the terminals of the first and second sets can be disposed at positions within respective first and second grids, and each of the first and second grids can include first and second parallel columns of the terminals. In one embodiment, at least one of the first or second grids can include at least one terminal between the first and second parallel columns of such grid. In a particular embodiment, the terminals of the first and second sets can be disposed at positions within respective first and second grids, and each of the first and second grids can include first and second adjacent parallel columns of the terminals. In one example, the terminals can be first terminals. The microelectronic package can also include a plurality of second terminals exposed at the second surface of the substrate, at least some of the second terminals being configured to carry information other than the address information.

In an exemplary embodiment, at least some of the second terminals that are configured to carry information other than the address information can be exposed at the second surface in the central region. In a particular example, the first terminals of the first and second sets can be disposed at positions within respective first and second grids, and the second terminals can be disposed at positions on the second surface other than in the first and second grids. In one embodiment, the first terminals of the first and second sets can be disposed at positions within respective first and second grids, and at least some of the second terminals can be disposed within the first and second grids. In a particular embodiment, the first terminals of the first and second sets can be disposed at positions within respective first and second grids. One portion of the second terminals can be arranged in a third grid and another portion of the second terminals can be arranged in a fourth grid. Columns of terminals in the third and fourth grids can be parallel to one another and to columns of terminals in the first and second grids. The signal assignments of the second terminals in the third grid can be a mirror image of the signal assignments of the second terminals in the fourth grid.

In one example, the first and second grids can separate the third and fourth grids from one another. In an exemplary embodiment, the terminals can be first terminals and the second surface can have peripheral regions between the central region and first and second opposed edges extending between the first and second surfaces of the substrate. The microelectronic package can also include a plurality of second terminals. At least some of the second terminals can be exposed at the second surface in at least one of the peripheral regions. The second terminals can be configured for connecting the microelectronic package to at least one component external to the microelectronic package. In a particular example, the surface of the first microelectronic element can confront the first surface of the substrate, and the surface of the second microelectronic element can at least partially overlie a rear surface of the first microelectronic element.

In one embodiment, the surfaces of the first and second microelectronic elements can be arranged in a single plane parallel to the first surface of the substrate. In a particular embodiment, the terminals of the first set can be electrically connected with the first microelectronic element, and the terminals of the second set can be electrically connected with the second microelectronic element. In one example, the terminals of the first and second sets can be electrically connected with each of the first and second microelectronic elements. In an exemplary embodiment, the first terminals of the first set can be electrically connected with the first microelectronic element and may not be electrically connected with the second microelectronic element, and the first terminals of the second set can be electrically connected with the second microelectronic element and may not be electrically connected with the first microelectronic element.

In a particular example, the substrate can include a dielectric element having a coefficient of thermal expansion ("CTE") in the plane of the dielectric element of less than 30 parts per million per degree Celsius ("ppm/° C."). In one embodiment, the substrate can include an element having a CTE of less than 12 ppm/° C. In a particular embodiment, at least some of the leads can include wire bonds extending through at least one of the apertures. In one example, at least some of the leads can include lead bonds. In an exemplary embodiment, each of the microelectronic elements' memory storage array function can be implemented in NAND flash, resistive RAM, phase-change memory, magnetic RAM, static RAM, dynamic RAM, spin-torque RAM, or content-addressable memory technology.

In one embodiment, the microelectronic package can also include a third microelectronic element having a surface facing the first surface of the substrate. The third microelectronic element can have memory storage array function. In a particular embodiment, the substrate can have a third aperture having a fourth axis extending in a direction of the length of the third aperture. The fourth axis can be parallel to the first and second axes. The third microelectronic element can have a plurality of contacts exposed at the surface thereof and aligned with at least one of the apertures. The microelectronic package can also include second leads electrically connected between the contacts of the third microelectronic element and the terminals. Each of the second leads can have a portion aligned with at least one of the apertures. In one example, the microelectronic package can also include a fourth microelectronic element having a surface facing the first surface of the substrate. The fourth microelectronic element can have memory storage array function.

In an exemplary embodiment, the substrate can have third and fourth apertures. The third and fourth microelectronic elements can each have a plurality of contacts exposed at the surface thereof and aligned with at least one of the apertures. The microelectronic package can also include second leads electrically connected between the contacts of each of the third and fourth microelectronic elements and the terminals. Each of the second leads can have a portion aligned with at least one of the apertures. In a particular example, the third and fourth apertures can have fourth and fifth respective parallel axes extending in directions of the lengths of the apertures, the fourth axis being parallel to the first axis. In one embodiment, the first axis can extend in a direction of the length of the third aperture, and the second axis can extend in a direction of the length of the fourth aperture. In a particular embodiment, the surfaces of the first and third microelectronic elements can be arranged in a single plane parallel to the second surface of the substrate, and the surface of each of the second and fourth microelectronic elements can at least partially overlies a rear surface of at least one of the third and first microelectronic elements.

In accordance with an aspect of the invention, a microelectronic assembly can include first and second microelectronic packages and a circuit panel having first and second opposed surfaces and panel contacts exposed at each of the first and second opposed surfaces. Each of the first and second microelectronic packages can include a substrate having first and second opposed surfaces and first and second apertures extending between the first and second surfaces, first and second microelectronic elements each having a surface facing the first surface of the substrate and a plurality of contacts exposed at the surface of the respective microelectronic element and aligned with at least one of the apertures, a plurality of terminals exposed at the second surface in a central region thereof, and leads electrically connected between the contacts of each microelectronic element and the terminals. The apertures of each substrate can have first and second parallel axes extending in directions of the lengths of the respective apertures. The central region of the second surface of each substrate can be disposed between the first and second axes of the respective substrate.

Each microelectronic element can have memory storage array function. The terminals of each microelectronic package can be configured for connecting the respective microelectronic package to at least one component external to the microelectronic package. Each lead can have a portion aligned with at least one of the apertures of the respective substrate. The terminals can be configured to carry address information usable by circuitry within the respective microelectronic package to determine an addressable memory location from among all the available addressable memory locations of a memory storage array of at least one of the microelectronic elements of the microelectronic package. At least some of the terminals of the first and second microelectronic packages can be mounted to the panel contacts exposed at the respective first and second surfaces and can be electrically connected therethrough.

In one example, each of the microelectronic elements of each microelectronic package can embody a greater number of active devices to provide memory storage array function than any other function. In one embodiment, the terminals of each microelectronic package can be configured to carry all of the address information usable by the circuitry within the respective microelectronic package to determine the addressable memory location. In a particular example, the terminals of each microelectronic package can be configured to carry information that controls an operating mode of the microelectronic elements of the respective microelectronic package. In an exemplary embodiment, the terminals of each microelectronic package can be configured to carry all of the command signals transferred to the respective microelectronic package, the command signals being write enable, row address strobe, and column address strobe signals. In one example, the terminals of each microelectronic package can be configured to carry clock signals transferred to the respective microelectronic package, the clock signals being clocks used for sampling signals carrying the address information. In a particular embodiment, the terminals of each microelectronic package can be configured to carry all of the bank address signals transferred to the respective microelectronic package.

In one embodiment, the circuit panel can include a bus having a plurality of conductors configured to carry all of the address information transferred to each of the microelectronic packages. The conductors can extend in a first direction parallel to the first and second surfaces. The first direction can be transverse to the axes of the apertures. In a particular example, the terminals of each microelectronic package can be first terminals and the second surface of each microelectronic package can have peripheral regions between the central region and first and second opposed edges extending between the first and second surfaces of the respective substrate. Each microelectronic package can also include a plurality of second terminals. At least some of the second terminals can be exposed at the second surface of the respective substrate in at least one of the peripheral regions. The second terminals can be configured for connecting the respective microelectronic package to at least one external component.

In an exemplary embodiment, at least some of the second terminals can be configured to carry information other than the address information. In one example, at least some of the leads can include wire bonds extending through at least one of the apertures. In an exemplary embodiment, all of the leads can be wire bonds extending through at least one of the apertures. In a particular embodiment, at least some of the leads can include lead bonds. In one embodiment, the surface of the first microelectronic element of each microelectronic package can confront the first surface of the respective substrate. The surface of the second microelectronic element of each microelectronic package can at least partially overlie a rear surface of the respective first microelectronic element. In a particular example, the surfaces of all of the microelectronic elements of each microelectronic package can be arranged in a single plane parallel to the first surface of the respective substrate. In one example, at least one of the microelectronic packages can include a heat spreader in thermal communication with at least one of the microelectronic elements of the respective microelectronic package. In an exemplary embodiment, each of the microelectronic elements' memory storage array function can be implemented in NAND flash, resistive RAM, phase-change memory, magnetic RAM, static RAM, dynamic RAM, spin-torque RAM, or content-addressable memory technology.

In one embodiment, each of the microelectronic elements can include a dynamic random access memory ("DRAM") integrated circuit chip. In particular example, each of the microelectronic elements can be functionally and mechanically equivalent to the other ones of the microelectronic elements. In one example, each microelectronic package can include third and fourth microelectronic elements each having a surface facing the first surface of the substrate. The third and fourth microelectronic elements can each have memory storage array function. The substrate of each microelectronic package can have third and fourth apertures. The third and fourth microelectronic elements of each microelectronic package can each have a plurality of contacts exposed at the surface thereof and aligned with at least one of the apertures of the respective substrate. Each microelectronic package can also include second leads electrically connected between the contacts of each of the third and fourth microelectronic elements and the terminals. Each of the second leads can have a portion aligned with at least one of the apertures.

In a particular embodiment, the third and fourth apertures of the substrate of each microelectronic package can have third and fourth respective parallel axes extending in directions of the lengths of the apertures. Each third axis can be parallel to the first axis of the first aperture of the respective substrate. In one embodiment, the terminals of the first and second microelectronic packages can be arranged at positions of first and second grids. The first and second grids can be aligned with one another in x and y orthogonal directions parallel to the first and second circuit panel surfaces. The alignment can be within a distance equal to a minimum pitch between adjacent terminals of the grids. In a particular example, the grids can be aligned with one another in the x and y orthogonal directions such that the terminals of the grids are coincident with one another in the x and y directions. In one embodiment, the terminals of each grid may be arranged in no more than four columns. In one example, all of the positions of each grid can be occupied by a corresponding one of the terminals. In a particular embodiment, at least one of the positions of each grid may not be occupied by a terminal. In an exemplary embodiment, the grids of the first and second packages can overlie at least 90% of one another.

In one example, the terminals of each of the first and second microelectronic packages can be arranged at positions of first and second grids. The first grid of the first package and the second grid of the second package can be aligned with one another. The second grid of the first package and the first grid of the second package can be aligned with one another. The alignments can be in x and y orthogonal directions parallel to the first and second circuit panel surfaces. The alignments can be within a distance equal to a minimum pitch between adjacent terminals of the grids.

In one embodiment, the terminals of each of the first and second microelectronic packages can include a first set thereof disposed on a first side of a theoretical third axis of the respective substrate and a second set thereof disposed on a second side of the third axis opposite from the first side. Each of the first and second sets of each microelectronic package can be configured to carry the address information. The signal assignments of the first terminals in the first set of each microelectronic package can be a mirror image of the signal assignments of the first terminals in the second set of the same microelectronic package. In an exemplary embodiment, the terminals of the first and second sets of each microelectronic package can be disposed at positions within respective first and second grids. Columns of terminals in the first and second grids of each microelectronic package can extend in a direction parallel to first and second opposed edges of the respective substrate.

In a particular embodiment, stub lengths of the electrical connections through the circuit panel between one of the terminals of the first microelectronic package and a corresponding one of the terminals of the second microelectronic package connected thereto can be less than seven times a minimum pitch of the terminals of the first microelectronic package. In one embodiment, at least some of the electrical connections through the circuit panel between the terminals of the first and second microelectronic packages can have an electrical length of approximately a thickness of the circuit panel.

In a particular example, the panel contacts can include first panel contacts arranged in first and second linearly extending columns exposed at a first surface of the circuit panel, and second panel contacts arranged in first and second linearly extending columns exposed at a second surface of the circuit panel. The first panel contacts can be joined to the terminals of the first microelectronic element. The second panel contacts can be joined to the terminals of the second microelectronic element. The first column of the first panel contacts can be aligned with the second column of the second panel contacts in x and y orthogonal directions parallel to the first and second circuit panel surfaces. The second column of the first panel contacts can be aligned with the first column of the second panel contacts in the x and y orthogonal directions. Each contact in the first column of the first panel contacts can be coupled to a corresponding contact of the first column of the second panel contacts. Each contact in the second column of the first panel contacts can be coupled to a corresponding contact in the second column of the second panel contacts.

In an exemplary embodiment, the terminals of each microelectronic package can be arranged in a single column. The circuit panel may include no more than one routing layer for routing of the address information between respective connection sites on the circuit panel at which the terminals of one or more of the microelectronic packages are electrically connected. In one example, the terminals of each microelectronic package can be arranged in two parallel columns. The circuit panel may include no more than two routing layers for routing of the address information between respective connection sites on the circuit panel at which the terminals of one or more of the microelectronic packages are electrically connected. In one example, the circuit panel can include an element having a CTE in a plane of the circuit panel less than 30 ppm/° C.

In a particular embodiment, a module can include a plurality of microelectronic assemblies as described above, each microelectronic assembly mounted to, and electrically connected with a second circuit panel for transport of signals to and from each microelectronic assembly. In one embodiment, a system can include a microelectronic assembly as described above and one or more other electronic components electrically connected to the microelectronic assembly. In a particular example, the system can also include a housing, the microelectronic assembly and the one or more other electronic components being assembled with the housing.

In accordance with another aspect of the invention, a microelectronic assembly can include first and second microelectronic packages and a circuit panel having first and second opposed surfaces and panel contacts exposed at each of the first and second opposed surfaces. Each of the first and second microelectronic packages can include a substrate having first and second opposed surfaces and first and second apertures extending between the first and second surfaces, first and second microelectronic elements each having a surface facing the first surface of the substrate and a plurality of contacts at the surface of the respective microelectronic element aligned with at least one of the apertures, a plurality of terminals exposed at the second surface in a central region thereof, and leads electrically connected between the contacts of each microelectronic element and the terminals. The apertures of each substrate can have first and second parallel axes extending in directions of the lengths of the respective apertures. The central region of the second surface of each substrate can be disposed between the first and second axes of the respective substrate.

Each microelectronic element can embody a greater number of active devices to provide memory storage array function than any other function. The terminals of each microelectronic package can be configured for connecting the respective microelectronic package to at least one component external to the microelectronic package. Each lead can have a portion aligned with at least one of the apertures of the respective substrate. The terminals can be configured to carry a majority of the address information usable by circuitry within the respective microelectronic package to determine an addressable memory location from among all the available addressable memory locations of a memory storage array within the microelectronic elements of the microelectronic package. At least some of the terminals of the first and second microelectronic packages can be mounted to the panel contacts of the respective first and second surfaces and can be electrically connected therethrough. In a particular example, the terminals of each microelectronic package can be configured to carry at least three-quarters of the address information usable by the circuitry within the respective microelectronic package to determine the addressable memory location.

BRIEF DESCRIPTION OF THE DRAWINGS

FIG. 3 is a side sectional view of the microelectronic assembly of FIG. 2.

FIG. 4 diagrammatic bottom plan view of the electrical connections between terminals of the microelectronic packages of FIG. 3.

FIG. 6B is a possible side sectional view of a microelectronic assembly including two microelectronic packages as shown in FIG. 6A, taken along the line 6B-6B of FIG. 6A.

FIG. 8A is a diagrammatic bottom plan view of a microelectronic package according to still another embodiment having three microelectronic elements.

FIG. 9A is a diagrammatic bottom plan view of a microelectronic package according to another embodiment having four microelectronic elements.

FIG. 9B is a possible side sectional view of a microelectronic assembly including two microelectronic packages as shown in FIG. 9A, taken along the line 9B-9B of FIG. 9A.

FIG. 11 is a diagrammatic bottom plan view of a microelectronic package according to still another embodiment having three microelectronic elements oriented in a single plane.

FIGS. 12A-12D are diagrammatic bottom plan views of microelectronic packages according to alternative embodiments having four microelectronic elements oriented in a single plane.

DETAILED DESCRIPTION

Figure 1:
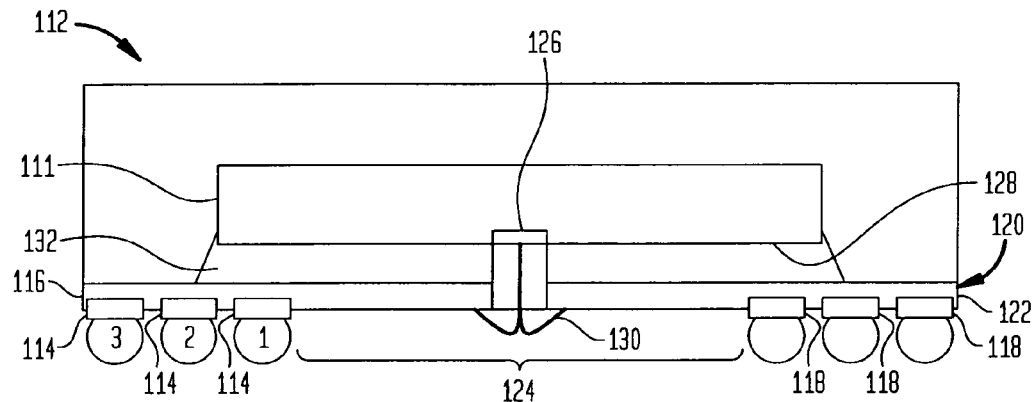
FIG. 1 is a side sectional view of a prior art microelectronic package.

In view of the illustrative conventional microelectronic package 112 described relative to FIG. 1, the inventors have recognized improvements which can be made that may help improve the electrical performance of a microelectronic package incorporating a memory storage array chip, and a microelectronic assembly that incorporates such microelectronic package.

Figure 2:
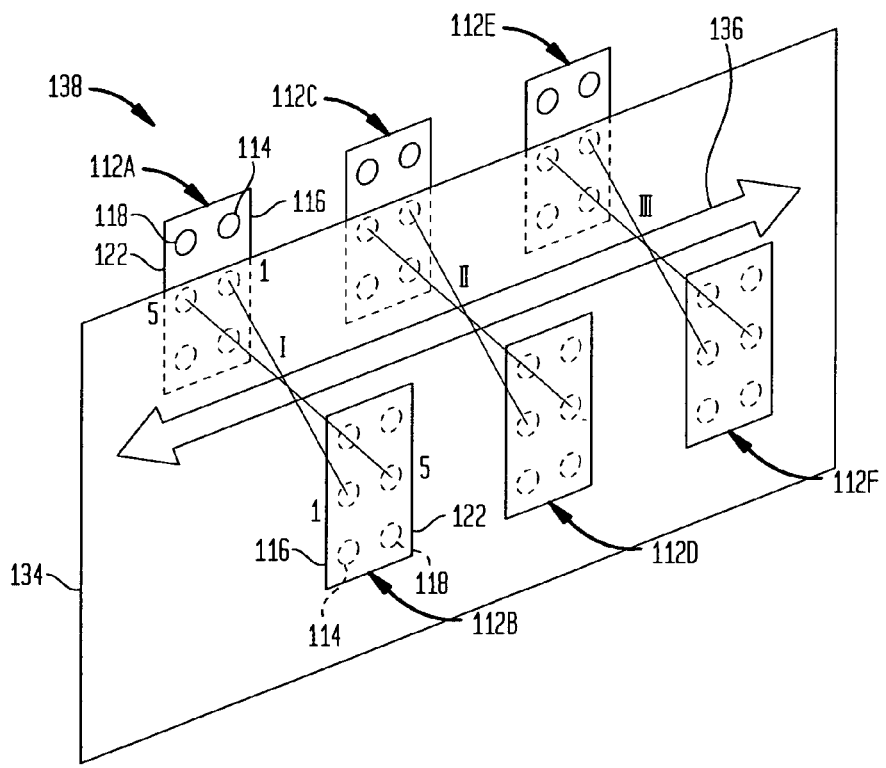
FIG. 2 is a diagrammatic perspective view of a microelectronic assembly showing electrical connections between terminals of the microelectronic packages.

Improvements can be made particularly for use of a microelectronic package when provided in an assembly such as shown in FIGS. 2-4, in which a package 112A is mounted to a surface of a circuit panel with another like package 112B mounted opposite thereto on an opposite surface of the circuit panel. The packages 112A, 112B typically are functionally and mechanically equivalent to one another. Other pairs 112C and 112D; and 112E and 112F, of functionally and mechanically equivalent packages typically are also mounted to the same circuit panel 134. The circuit panel and the packages assembled thereto may form a portion of an assembly commonly referred to as a dual in-line memory module ("DIMM"). The packages in each oppositely mounted pair of packages, e.g., packages 112A, 112B, connect to contacts on opposite surfaces of the circuit panel so that the packages in each pair overlie one another typically by more than 90% of their respective areas. Local wiring within the circuit panel 134 connects terminals, e.g., the terminals labeled "1" and "5" on each package to global wiring on the circuit panel. The global wiring includes the signal conductors of a bus 136 used to conduct some signals to connection sites on the circuit panel 134 such as sites I, II and III. For example, the packages 112A, 112B are electrically connected to the bus 136 by local wiring coupled to a connection site I, the packages 112C, 112D are electrically connected to the bus by local wiring coupled to connection site II, and the packages 112E, 112F are electrically connected to the bus by local wiring coupled to connection site III.

The circuit panel 134 electrically interconnects the terminals of the respective packages 112A, 112B using local interconnect wiring that appears similar to a crisscross or "shoelace" pattern in which a terminal labeled "1" near one edge 116 of package 112A connects through the circuit panel 134 to a terminal labeled "1" of package 112B near the same edge 116 of package 112B. However, the edge 116 of the package 112B as assembled to the circuit panel 134 is far from the edge 116 of the package 12A. FIGS. 2-4 further show that a terminal labeled "5" near an edge 122 of the package 112A is connected through the circuit panel 134 to a terminal labeled "5" of the package 112B near the same edge 122 of the package 112B. In the assembly 138, the edge 122 of the package 112A is far from the edge 122 of the package 112B.

Connections through the circuit panel between terminals on each package, e.g., the package 112A, to the corresponding terminals on the package mounted opposite thereto, i.e., the package 112B, are fairly long. As further seen in FIG. 3, in such assembly of like microelectronic packages 112A, 121B, the circuit panel 134 may electrically interconnect a signal conductor of the bus 136 with the terminal of the package 112A marked "1" and the corresponding terminal of the package 112B marked "1", when the same signal from the bus is to be transmitted to each package. Similarly, the circuit panel 134 may electrically interconnect another signal conductor of the bus 136 with the terminal of the package 112A marked "2" and the corresponding terminal of the package 112B marked "2". The same connection arrangement may also apply to other signal conductors of the bus and corresponding terminals of each package.

Local wiring between the bus 136 on the circuit panel 134 and each package of the respective pair of packages, e.g., the packages 112A, 112B (FIG. 2) at a connection site I of the board can be in form of unterminated stubs. Such local wiring, when relatively long, may in some cases impact the performance of the assembly 138 as discussed below. Moreover, the circuit panel 134 also requires local wiring to electrically interconnect certain terminals of other packages: the pair of packages 112C and 112D and the pair of packages 112E and 112F to the global wiring of the bus 136, and such wiring can also impact the performance of the assembly in the same way.

FIG. 4 further illustrates the interconnection between the microelectronic packages 112A, 112B of respective pairs of terminals assigned to carry signals "1", "2", "3", "4", "5", "6", "7", and "8". As seen in FIG. 4, all of the columns 114, 118 of terminals are exposed near the edges 116, 122, respectively, of each package 112A, 121B, rather than in a central region 124 of the surface of the substrate, the wiring needed to traverse the circuit panel 134 in a direction 140 transverse to the direction 142 in which the columns 114, 118 of terminals extend can be quite long. In recognition that the length of a DRAM chip can be in the range of ten millimeters on each side, the length of the local wiring in a circuit panel 134 in an assembly 138 seen in FIGS. 2-4 required for some signals to route the same signal to the corresponding terminals of two oppositely mounted packages 112A, 112B can range between five and ten millimeters and may typically be about seven millimeters.

In some cases, relatively long unterminated wiring on a circuit panel that connects the terminals of a package may not severely impact the electrical performance of the assembly 138. However, when a signal is transferred from a bus 136 of the circuit panel to each of multiple pairs of packages connected to the circuit panel as shown in FIG. 2, the inventors recognize that the electrical lengths of the stubs, i.e., the local wiring, that extend from the bus 136 to the terminal connected thereto on each package potentially impacts the performance of the assembly 138. Signal reflections on the unterminated stubs can travel in the reverse direction from the connected terminals of each package back onto the bus 136, and thus degrade the signals being transferred from the bus to the packages. The impacts may be tolerable for some packages containing microelectronic elements of current manufacture. However, in present or future assemblies that operate with increased signal switching frequencies, low voltage swing signals, or both, the inventors recognize that the impacts can become severe. For these assemblies, settling time, ringing, jitter, or intersymbol interference of a transmitted signal may increase to an unacceptable degree.

The inventors further recognize that the electrical lengths of the unterminated stubs are usually longer than the local wiring that connects the bus 136 on the circuit panel with the terminals of the packages mounted thereto. Unterminated wiring within each package from the package terminals to the semiconductor chip therein adds to the lengths of the stubs.

In a specific example, the bus 136 is a command-address bus of an assembly having a predominant memory storage array function such as a DIMM. The command-address bus 136 can be configured to carry address information transferred to the microelectronic packages that is usable by circuitry within the packages, e.g., row address and column address decoders, and bank selection circuitry, if present, to determine an addressable memory location from among all the available addressable memory locations of a memory storage array within a microelectronic element in the microelectronic packages. The command-address bus 136 can be configured to carry the above-noted address information to connection sites, e.g., sites I, II, and III shown in FIG. 2. This above-noted address information can then be distributed by local wiring to respective sets of panel contacts on opposite surfaces of the circuit panel, to which packages 112A, 112B, 112C, 112D, 112E, and 112F are connected.

In a particular example, when the microelectronic element is or includes a DRAM chip, the command-address bus 136 can be configured to carry all of a group of signals of a command-address bus of the microelectronic element, i.e., command signals, address signals, bank address signals, and clock signals that are transferred to the microelectronic packages, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

Accordingly, certain embodiments of the invention described herein provide a microelectronic package configured so as to permit the lengths of stubs to be reduced when first and second such packages are mounted opposite one another on opposite surfaces of a circuit panel, e.g., a circuit board, module board or card, or flexible circuit panel. Assemblies that incorporate first and second microelectronic packages mounted opposite one another on a circuit panel can have significantly reduced stub lengths between the respective packages. The reductions in the lengths of these electrical connections can reduce stub lengths in the circuit panel and the assembly, which can help improve the electrical performance, such as reducing settling time, ringing, jitter, or intersymbol interference, among others, for the above-noted signals which are carried by the first terminals and which are transferred to microelectronic elements in both the first and second packages. Moreover, it may be possible to obtain other benefits as well, such as simplifying the structure of the circuit panel or reducing the complexity and cost of designing or manufacturing the circuit panel.

Certain embodiments of the invention provide a package or microelectronic assembly in which a microelectronic element, e.g., a semiconductor chip, or stacked arrangement of semiconductor chips, is configured to predominantly provide a memory storage array function. In such microelectronic element, the number of active devices, e.g., transistors, therein that are configured, i.e., constructed and interconnected with other devices, to provide the memory storage array function, is greater than the number of active devices that are configured to provide any other function. Thus, in one example, a microelectronic element such as a DRAM chip may have memory storage array function as its primary or sole function. Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

In one embodiment, terminals of the package can include first terminals that are disposed at a central region of the second surface of a substrate or dielectric layer that faces away from the microelectronic assembly, the central region being disposed between peripheral regions adjacent to first and second peripheral edges of the substrate or dielectric layer. The central region may be such that it is not wider than three and one-half times a minimum pitch between adjacent ones of parallel columns of the terminals.

In certain embodiments of the invention, the first terminals in the central region are configured to carry all of a group of signals of a command-address bus of the microelectronic element; i.e., command signals, address signals, bank address signals, and clock signals that are transferred to the microelectronic package, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

On a circuit panel, e.g., a printed circuit board, module card, etc., these above-noted signals of the command-address bus: i.e., command signals, address signals, bank address signals, and clock signals, can be bussed to multiple microelectronic packages that are connected thereto in parallel, particularly to first and second microelectronic packages mounted to opposite surfaces of the circuit panel. For certain embodiments herein, by placing terminals that carry command-address bus signals in the central region of the package surface, rather than in peripheral regions near the edges of the microelectronic package, it is possible to reduce the lengths of stubs used to carry signals from the command-address bus 136 (FIG. 2) on the circuit panel to the individual connection sites on the surfaces of the circuit panel where the microelectronic packages are electrically connected. The reductions in the lengths of these electrical connections can reduce stub lengths in the circuit panel and the assembly, which can help improve the electrical performance, such as reducing settling time, ringing, jitter, or intersymbol interference, among others, for the above-noted signals that are carried by the first terminals and that are transferred to microelectronic elements in both the first and second packages. Moreover, it may be possible to obtain other benefits as well, such as simplifying the structure of the circuit panel or reducing the complexity and cost of designing or manufacturing the circuit panel.

In some embodiments, the microelectronic package may have no more than four columns of terminals in the central region configured to carry all of the command signals, address signals, bank address signals, and clock signals as described above. In certain embodiments, there may be only two columns of such terminals. In other embodiments there may only be one column of such terminals.

Moreover, it may be possible to reduce the number of routing layers of wiring on the circuit panel required to route the signals from the above-noted signals carried by the first terminals, e.g., command-address bus signals, between connection sites where respective pairs of microelectronic packages are connected. Specifically, the number of routing layers required to route such signals along the circuit panel may in some cases be reduced to four or fewer routing layers. In a particular example, the number of routing layers required to route such signals along the circuit panel may in some cases be reduced to four, two, or one routing layers. However, on the circuit panel, there may be a greater number of routing layers that carry other signals than the number of routing layers that carry the above-noted address or command-address bus signals.

The microelectronic package may also have second terminals other than the first terminals, such terminals typically being configured to carry signals other than the above-noted command-address bus signal terminals. In one embodiment, such second terminals can be disposed in one or more of the peripheral regions and can be configured to carry data signals. For example, the second terminals can include terminals used for carrying uni-directional or bi-directional data signals to and/or from the microelectronic element, and data strobe signals, as well as data masks and ODT or "on die termination" signals used to turn on or off parallel terminations to termination resistors. Signals or reference potentials such as chip select, reset, power supply voltages, e.g., Vdd, Vddq, and ground, e.g., Vss and Vssq, can be carried by the second terminals; none of the signals or reference potentials needs to be carried by the first terminals. In some embodiments, it is possible for some or all terminals configured to carry signals other than the above-noted address or command-address bus signals to be disposed as second terminals in whichever locations on the package they can be placed.

Embodiments of the invention herein provide packages that have more than one semiconductor chip, i.e., a microelectronic element therein. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets that typically combine the function of personal computers with wireless connectivity to the broader world. Multi-chip packages can be particularly useful for making large amounts of relatively inexpensive memory available to a system, such as advanced high performance dynamic random access memory ("DRAM") chips, e.g., in DDR3 type DRAM chips and its follow-ons.

The amount of area of the circuit panel needed to connect the multi-chip package thereto can be reduced by providing common terminals on the package through which at least some signals travel on their way to or from two or more chips within the package. However, doing so in a way that supports high performance operation presents challenges. To avoid undesirable effects such as undesirable reflections of the signal due to unterminated stubs, the traces, vias, and other conductors on a circuit panel that electrically connect the terminals at the exterior of the package with the global wiring on the circuit panel such as the bus 136 (FIG. 2) must not be too long. Heat dissipation also presents a challenge for advanced chips, such that it is desirable for at least one of the large flat surfaces of each chip to be coupled to a heat spreader or be exposed to or in thermal communication with a flow or air within an installed system. The packages described below can help to further these goals.

Embodiments of the invention herein can provide ways of reducing stub lengths of signals on the assemblies. Thus, corresponding contacts of multiple chips within the package can be electrically connected with a single common terminal of the package that is configured for connection with a component external to the package, e.g., a circuit panel such as printed circuit board, external microelectronic element, or other component, and a plurality of such microelectronic packages can be mounted to opposite surfaces of a circuit panel.

For example, the electrical lengths of stubs on a circuit panel 60 (FIG. 5E) that electrically connect a first terminal 25a of the first column of a first microelectronic package 10a with the corresponding first terminal of the first column of a second microelectronic package 10b can be less than seven times a minimum pitch of the first terminals on each package: for example, less than seven times the pitch between adjacent columns of first terminals. Stated another way, the total combined length of the conductive elements connecting a pair of electrically coupled first and second panel contacts 65a, 65b exposed at the first and second surfaces of the circuit panel 60 to the corresponding signal conductor of the command-address bus on the circuit panel can be less than seven times a smallest pitch of the panel contacts. In yet another example, the electrical length of the connection between a first terminal 25a of the first microelectronic package 10a with the corresponding first terminal on the second microelectronic package 10b may be approximately the same as a thickness of the circuit panel 60 between first and second surfaces 61, 62.

Figure 5A:
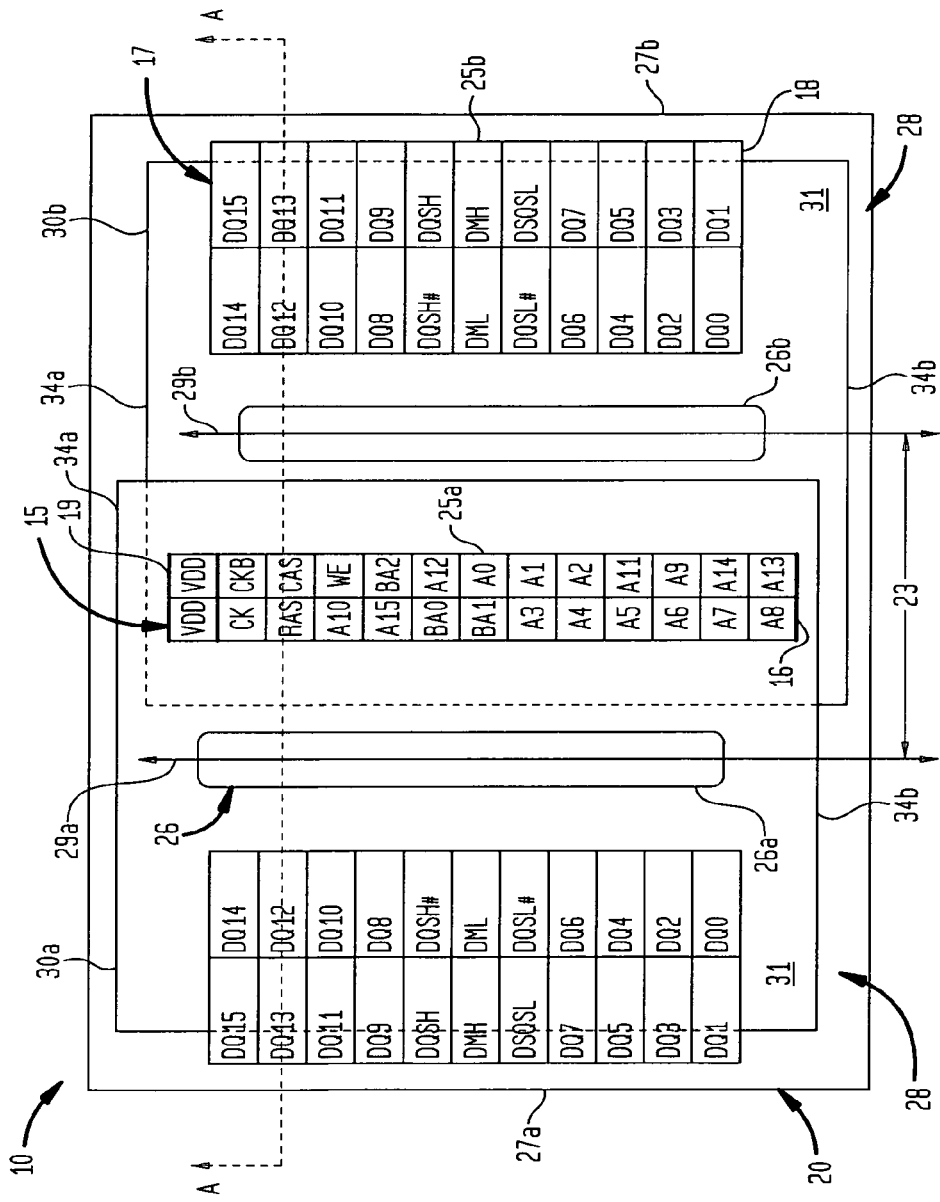
FIG. 5A is a diagrammatic bottom plan view of a microelectronic package according to an embodiment of the present invention.
Figure 5B:
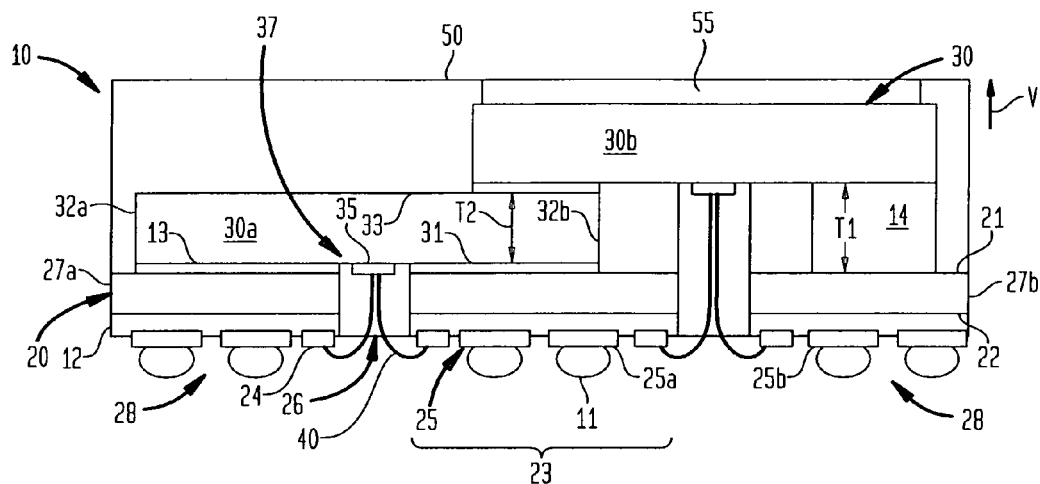
FIG. 5B is a side sectional view of the microelectronic assembly of FIG. 5A, taken along the line A-A of FIG. 5A.

FIGS. 5A and 5B illustrate a particular type of microelectronic package 10 configured so as to permit the lengths of stubs to be reduced when first and second such packages are mounted opposite one another on opposite surfaces of a circuit panel; e.g., a circuit board, module board or card, or flexible circuit panel. As seen in FIGS. 5A and 5B, the microelectronic package 10 can include packaging structure, for example, a substrate 20 having first and second opposed surfaces 21 and 22. The first and second surfaces 21, 22 face in opposite directions, and thus, are opposed relative to one another, and are "opposed surfaces."

In FIG. 5A and in all of the other diagrammatic bottom plan views of microelectronic packages described herein, the substrate 20 and the terminal grids are shown as transparent. This is done so that the relative positions of the microelectronic elements can be seen from a bottom view more clearly, while still showing of the location of the substrate and terminal grids relative to the microelectronic elements in x-y directions parallel to a plane of the substrate.

In some cases, the substrate 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the substrate, i.e., in a direction along its surface.

In FIGS. 5A and 5B, the directions parallel to the first surface 21 of the substrate 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

At least one aperture 26 can extend between the first and second surfaces 21, 22 of the substrate 20. As can be seen in FIG. 5A, the substrate 20 can have two apertures 26a and 26b extending therethrough. The longest dimensions of the apertures 26a and 26b can define first and second parallel axes 29a and 29b (collectively axes 29). The first and second parallel axes 29a and 29b can define a central region 23 of the second surface 22 of the substrate 20 located between the axes 29a and 29b. Peripheral regions 28 of the second surface 22 of the substrate 20 can lie outside of the central region 23. Such peripheral regions 28 can extend between the central region 23 and first and second opposed edges 27a and 27b of the second surface 22 of the substrate 20.

The substrate 20 can have a plurality of terminals 25, e.g., conductive pads, lands, or conductive posts exposed at a surface of the substrate. As can be seen in FIG. 5B, such terminals 25 can be exposed at the second surface 22 of the substrate 20. The terminals 25 can function as endpoints for the connection of the microelectronic package 10 with corresponding electrically conductive elements of an external component such as a circuit panel, e.g., printed wiring board, flexible circuit panel, socket, other microelectronic assembly or package, interposer, or passive component assembly, among others (e.g., the circuit panel shown in FIGS. 5E and 5F). In one example, such a circuit panel can be a motherboard or DIMM module board.

The microelectronic package 10 can include joining units 11 attached to the terminals 25 for connection with an external component. The joining units 11 can be, for example, masses of a bond metal such as solder, tin, indium, a eutectic composition or combination thereof, or another joining material such as a conductive paste or a conductive adhesive. In a particular embodiment, the joints between the terminals 25 and contacts of an external component (e.g., the circuit panel 60 shown in FIG. 5E) can include an electrically conductive matrix material such as described in commonly owned U.S. patent application Ser. Nos. 13/155,719 and 13/158,797, the disclosures of which are hereby incorporated herein by reference. In a particular embodiment, the joints can have a similar structure or be formed in a manner as described therein.

As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

The terminals 25 can include first terminals 25a exposed at the central region 23 of the second surface 22 of the substrate 20 and second terminals 25b exposed at at least one of the peripheral regions 28 of the second surface. In certain embodiments of the invention, the first terminals 25a can be configured to carry certain signals of the command-address bus, that is, specifically all of a set of address signals of the microelectronic elements 30 (described below) configured to provide dynamic memory storage function in a microelectronic package 10.

For example, when the microelectronic elements 30 include or are DRAM semiconductor chips, the first terminals 25a can be configured to carry sufficient address information transferred to the microelectronic package 10 that is usable by circuitry within the package, e.g., row address and column address decoders, and bank selection circuitry, if present, to determine an addressable memory location from among all the available addressable memory locations of a memory storage array within a microelectronic element in the package. In a particular embodiment, the first terminals 25a can be configured to carry all the address information used by such circuitry within the microelectronic package 10 to determine an addressable memory location within such memory storage array.

In a variation of such embodiment, the first terminals 25a can be configured to carry a majority of the address information that is used by such circuitry within the microelectronic package 10 to determine an addressable memory location within such memory storage array, and then other terminals such as at least some of the above-referenced second terminals 25b on the microelectronic package would then be configured to carry the remaining part of the address information. In such variation, in a particular embodiment, the first terminals 25a can be configured to carry three-quarters or more of the address information that is used by such circuitry within the microelectronic package 10 to determine an addressable memory location within such memory storage array.

In a particular embodiment, the first terminals 25a may not be configured to carry chip select information, e.g., information usable to select a particular chip within the microelectronic package 10 for access to a memory storage location within the chip. In another embodiment, at least one of the first terminals 25a may indeed carry chip select information.

Typically, when the microelectronic elements 30 in the microelectronic package 10 include DRAM chips, the address signals in one embodiment can include all address signals that are transferred to the package from a component external to the package, e.g., a circuit panel such as the circuit panel described below, that are used for determining a random access addressable memory location within the microelectronic package for read access thereto, or for either read or write access thereto.

At least some of the second terminals 25b can be configured to carry signals other than the address signals that are carried by the first terminals 25a. Signals or reference potentials such as chip select, reset, power supply voltages, e.g., Vdd, Vddq, and ground, e.g., Vss and Vssq, can be carried by the second terminals 25b; none of these signals or reference potentials needs to be carried by the first terminals 25a in any of the embodiments referred to herein, unless otherwise noted.

In a particular embodiment, each of the first terminals 25a can be configured to carry information that controls an operating mode of at least one of the microelectronic elements 30. More specifically, the first terminals 25a can be configured to carry all of a particular set of command signals and/or clock signals transferred to the microelectronic package 10. In such an embodiment, the first terminals 25a can be configured to carry all of the command signals, address signals, bank address signals, and clock signals transferred to the microelectronic package 10 from an external component, wherein the command signals include row address strobe, column address strobe and write enable.

In an embodiment in which one or more of the microelectronic elements are configured to provide dynamic memory storage array function, such as provided by a dynamic random access memory ("DRAM") semiconductor chip, or an assembly of DRAM chips, the command signals are write enable, row address strobe, and column address strobe signals. Other signals such as ODT (on die termination), chip select, clock enable, are not part of the command signals that need to be carried by the first terminals 25a. The clock signals can be clocks used by one or more of the microelectronic elements for sampling the address signals. For example, as seen in FIG. 5A, the first terminals 25a can include clock signals CK and CKB, row address strobe RAS, column address strobe CAS and write enable signals WE, as well as address signals A0 through A15 inclusive, and bank address signals BA0, BA1 and BA2.

In this embodiment, at least some of the second terminals 25b can be configured to carry signals other than the command signals, address signals, and clock signals that are carried by the first terminals 25a. Signals or reference potentials such as chip select, reset, power supply voltages, e.g., Vdd, Vddq, and ground, e.g., Vss and Vssq, can be carried by the second terminals 25b; none of these signals or reference potentials needs to be carried by the first terminals 25a in any of the embodiments referred to herein, unless otherwise noted.

In another embodiment, when one or more of the microelectronic elements are configured to provide memory storage array function implemented in a technology other than for DRAM, such as NAND flash memory, for example, the particular command signals that need to be carried by the first terminals 25a can be a different set of signals other than the group of write enable, address strobe, and column address strobe signals that need to be carried in the DRAM case.

In a particular example, such as the example shown in FIGS. 5A and 5B, the second terminals 25b can be disposed in at least one column in each of the peripheral regions 28. In one embodiment, at least some of the second terminals 25b that are configured to carry signals other than the command signals, address signals, and clock signals can be exposed in the central region 23 of the second surface 22 of the substrate 20.

Although particular configurations of second terminals are shown in the figures, such as the second terminals 25b shown in FIGS. 5A and 5B, the particular configurations shown are for illustrative purposes and are not meant to be limiting. For example, the second terminals 25b can also include terminals that are configured to be connected to power or ground signals. Although the second terminals 25b are shown arranged in two grids of two columns each, the second terminals 25b in each grid can be arranged in three columns, for example, wherein the third column that is not shown contains some second terminals that are configured to be connected to power or ground.

The substrate 20 can further optionally include a dielectric layer 12 overlying the first and/or second surfaces 21, 22. As shown in FIG. 5B, a dielectric layer 12 can overlie the second surface 22 of the substrate. Such a dielectric layer 12 can electrically insulate conductive elements such as the conductive elements 24 and the terminals from the substrate 20, if such electrical insulation is needed. This dielectric layer 12 can be referred to as a "passivation layer" of the substrate 20. The dielectric layer 12 can include an inorganic or organic dielectric material or both. The dielectric layer 12 may include an electrodeposited conformal coating or other dielectric material, for example, a photoimageable polymeric material, for example, a solder mask material. In a particular example, the dielectric layer 12 can be a layer of compliant material such as an elastomeric material having a structure and function similar to that described in U.S. Pat. No. 5,679,977, the disclosure of which is hereby incorporated herein by reference.

In the embodiments described herein, a dielectric layer 12 overlying the first or second surface 21 or 22 of the substrate 20 can have a thickness that is substantially less than a thickness of the substrate, such that the substrate can have an effective CTE that is approximately equal to the CTE of the material of the substrate, even if the CTE of the dielectric layer is substantially higher than the CTE of the substrate material. In one example, the substrate 20 can have an effective CTE less than 12 ppm/° C.

The microelectronic package 10 can also include a plurality of microelectronic elements 30 each having a front surface 31 facing the first surface 21 of the substrate 20. Although the microelectronic elements 30 are shown in FIG. 5A and the other figures as being offset from one another in a direction of the axes 29, that need not be the case. Such an offset of the microelectronic elements 30 is shown in the figures for improved clarity of the overlying location of the microelectronic elements with respect to one another. In a particular embodiment, peripheral edges 34a of each of the microelectronic elements 30 can be aligned in a first common plane, and peripheral edges 34b opposite the peripheral edges 34a of each of the microelectronic elements can be aligned in a second common plane.

In one example, one or more of the microelectronic elements 30 can be bare chips or microelectronic units each having a memory storage array function. However, in a particular example, one or more of the microelectronic elements 30 can incorporate a memory storage element such as a dynamic random access memory ("DRAM") storage array or can be configured to predominantly function as a DRAM storage array (e.g., a DRAM integrated circuit chip). In the latter case, one or more of the first and second microelectronic elements can have a greater number of active devices, e.g., transistors, configured to provide memory storage array function than any other function. As used herein, a "memory storage element" refers to a multiplicity of memory cells arranged in an array, together with circuitry usable to store and retrieve data therefrom, such as for transport of the data over an electrical interface. In a particular example, the microelectronic package 10 can be included in a single in-line memory module ("SIMM") or a dual in-line memory module ("DIMM").

In any of the embodiments described herein, one or more of the microelectronic elements 30 can be implemented in one or more of the following technologies: DRAM, NAND flash memory, RRAM ("resistive RAM" or "resistive random access memory"), phase-change memory ("PCM"), magnetoresistive random access memory, e.g. such as may embodiment tunnel junction devices, static random access memory ("SRAM"), spin-torque RAM, or content-addressable memory, among others.

In a particular example, a microelectronic element 30 that includes a memory storage element can have at least a memory storage array function, but the microelectronic element may not be a full-function memory chip. Such a microelectronic element may not have a buffering function itself, but it may be electrically connected to other microelectronic elements in a stack of microelectronic elements, wherein at least one microelectronic element in the stack has a buffering function (the buffering microelectronic element could be a buffer chip, a full-function memory chip, or a controller chip).

In other examples, one or more of the microelectronic elements in any of the packages described herein can be configured to predominantly provide memory storage array function, in that one or more of the microelectronic elements can have a greater number of active devices, e.g., transistors, configured to provide memory storage array function than any other function, e.g., as flash memory, DRAM or other type of memory, and can be arranged in a package together with another microelectronic element or "logic chip" that is configured to predominantly provide logic function. In a particular embodiment, the logic chip can be a programmable or processor element such as a microprocessor or other general purpose computing element. The logic chip can be a microcontroller element, graphics processor, floating point processor, co-processor, digital signal processor, etc. In a particular embodiment, the logic chip can predominantly perform hardware state machine functions, or otherwise be hard-coded to serve a particular function or purpose. Alternatively, the logic chip can be an application specific integrated circuit ("ASIC") or field programmable gate array ("FPGA") chip. In such variation, the package then may be a "system in a package" ("SIP").

In another variation, a microelectronic element in any of the packages described herein can have both logic and memory function embedded therein, such as a programmable processor having one or more associated memory storage arrays embedded therewith in the same microelectronic element. Such microelectronic element is sometimes referred to as a "system-on-a-chip" ("SOC"), in that logic such as a processor is embedded together with other circuitry such as a memory storage array or circuitry for performing some other function that may be a specialized function.

Figure 5C:
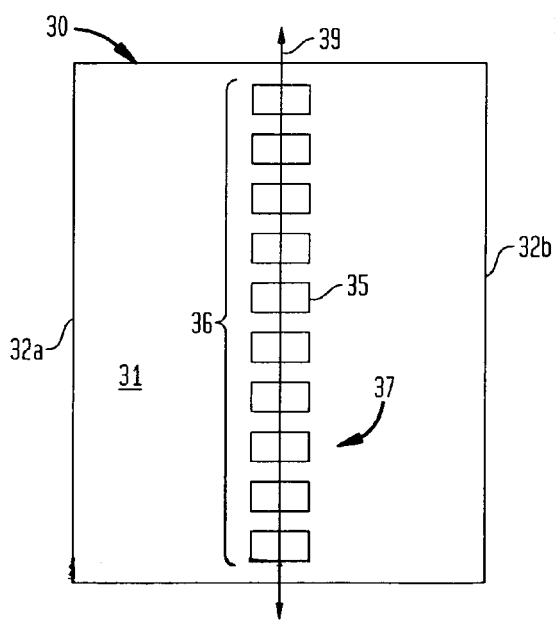
FIG. 5C is a diagrammatic bottom plan view of one of the microelectronic elements shown in FIG. 5A.
Figure 5D:
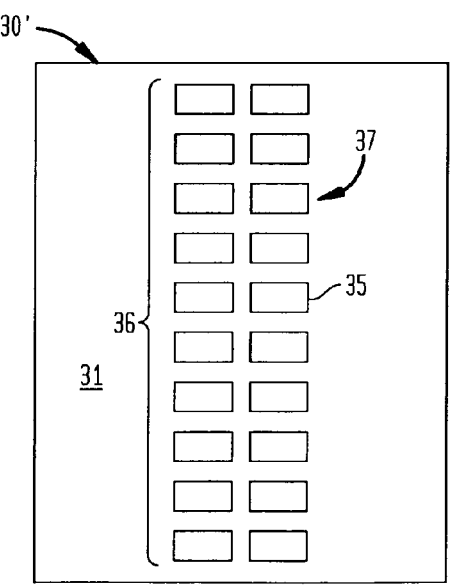
FIG. 5D is a diagrammatic bottom plan view of an alternate embodiment of one of the microelectronic elements shown in FIG. 5A.

Each microelectronic element 30 can have a plurality of electrically conductive element contacts 35 exposed at the front surface 31 thereof. As shown in FIGS. 5C and 5D, the contacts 35 of each microelectronic element 30 can be arranged in one (FIG. 5C) or more (FIG. 5D) columns 36 disposed in a central region 37 of the front surface 31 that occupies a central portion of an area of the front surface. The central region 37, for example, may occupy an area of the front surface 31 that includes a middle third of the shortest distance between opposed peripheral edges 32a, 32b of the microelectronic element 30. In the particular example shown in FIG. 5C, when the contacts 35 of each microelectronic element 30 are arranged in a central region 37 of the microelectronic element, the contacts can be arranged along an axis 39 that bisects the microelectronic element. As shown in FIG. 5B, the contacts 35 of each microelectronic elements 30 can be aligned with at least one of the apertures 26.

In one type of such microelectronic element 30, each one of some contacts of the element contacts 35 is dedicated to receiving a respective address signal of the plurality of address signals supplied to the microelectronic element. In this case, each of such contacts 35 is able to receive one respective address signal of the plurality of address signals supplied to the microelectronic element 30 from the outside.

In one particular example of this type of microelectronic element 30, each of the plurality of address signals present at the element contacts 35 can be sampled relative to an edge of a clock used by the respective microelectronic element, i.e., upon on a transition of the clock between first and second different voltage states. That is, each address signal can be sampled upon a rising transition between a lower voltage state and a higher voltage state of the clock, or upon a falling transition between a higher voltage state and a lower voltage state of the clock. Thus, the plurality of address signals may all be sampled upon the rising transition of the clock, or such address signals may all be sampled upon the falling transition of the clock, or in another example, the address signal at one of the element contacts 35 can be sampled upon the rising transition of the clock and the address signal at one other external contact can be sampled upon the falling transition of the clock.

In another type of microelectronic element 30 configured to predominantly provide memory storage array function, one or more of the address contacts thereon can be used in a multiplexed manner. In this example, a particular element contact 35 of the respective microelectronic element 30 can receive two or more different signals supplied to the microelectronic element from the outside. Thus, a first address signal can be sampled at the particular contact 35 upon a first transition of the clock between the first and second different voltage states (e.g., a rising transition), and a signal other than the first address signal can be sampled at the particular contact upon a second transition of the clock (e.g., a falling transition) between the first and second voltage states that is opposite the first transition.

In such a multiplexed manner, two different signals can be received within the same cycle of the clock on the same element contact 35 of the respective microelectronic element 30. In a particular case, multiplexing in this manner can allow a first address signal and a different signal to be received in the same clock cycle on the same element contact of the respective microelectronic element 30. In yet another example, multiplexing in this manner can allow a first address signal and a second different address signal to be received in the same clock cycle on the same element contact 35 of the respective microelectronic element 30.

In a particular example, each of the microelectronic elements 30 can be functionally and mechanically equivalent to the other ones of the microelectronic elements, such that each microelectronic element can have the same pattern of electrically conductive contacts 35 exposed at the front surface 31 with the same function, although the particular dimensions of the length, width, and height of each microelectronic element can be different than that of the other microelectronic elements.

In the specific arrangement shown in FIGS. 5A and 5B, the microelectronic package 10 can be configured to route a signal that is common to multiple microelectronic elements 30 through a common first terminal 25*a* of the package, rather than through two or more terminals 25 of the package each dedicated to a specific one of the microelectronic elements 30, such as the second terminals 25*b*. In this way, it may be possible to reduce the number of contacts on a circuit panel (e.g., the circuit panel 60 shown in FIG. 5E) to which the microelectronic package 10 can be connected. Furthermore, it may be possible to reduce the number of contacts, metalized vias, and routing layers underlying the microelectronic package 10 on a circuit panel, which may simplify the design of the circuit panel and reduce its manufacturing complexity and cost.

As shown in FIG. 5A, the first terminals 25*a* of the microelectronic package 10 can be disposed in one or more sets of first terminals arranged at positions of one or more grids 15 in the central region 23 of the second surface 22 of the substrate 20. Each set of first terminals 25*a* arranged at positions of a grid 15 can include one or more columns 16 of the first terminals. As shown in FIG. 5A, all of the positions of the grid 15 can be occupied by a corresponding one of the first terminals 25*a*. Alternatively (not shown), at least one of the positions of one or more columns 16 of the grid 15 may not be occupied by a first terminal 25*a*. For example, such a position that is not occupied by a first terminal 25*a* can be occupied by a second terminal 25*b*, or such position can be unoccupied by any terminal. As shown in FIG. 5A, the microelectronic package 10 can include two parallel columns 16 of the first terminals 25*a*. Such columns 16 can be oriented parallel to the axes 29 of the apertures 26.

The second terminals 25*b* of the microelectronic package 10 can be disposed in one or more sets of second terminals arranged at positions of one or more grids 17 in the peripheral regions 28 of the second surface 22 of the substrate 20. Each set of second terminals 25*b* arranged at positions of a grid 17 can include one or more columns 18 of the second terminals. As shown in FIG. 5A, all of the positions of the grid 17 can be occupied by a corresponding one of the second terminals 25*b*. Alternatively (not shown), at least one of the positions of the grid 17 may not be occupied by a second terminal 25*b*. As shown in FIG. 5A, each grid 17 of the microelectronic package 10 can include two parallel columns 18 of the second terminals 25*b*. Such columns 18 can be oriented parallel to the axes 29 of the apertures 26, as shown in FIG. 5A, or in other examples, the columns 18 can have other orientations (e.g., as shown in FIG. 4A).

In one embodiment, at least some of the second terminals 25*b* that are configured to carry signals other than the address signals can be arranged at positions within the grids 15 that also contain the first terminals 25*a*. In one example, at least some of the second terminals 25*b* that are configured to carry signals other than the command signals, address signals, and clock signals can be arranged at positions within the grids 15 that also contain the first terminals 25*a*.

Although the first and second terminals 25*a* and 25*b* are shown at the same relative position in a direction of the axes 29 within adjacent columns 16 or 18, such terminals may in fact be disposed at positions which are somewhat offset in the direction of the axes 29. For example, although not shown in FIG. 5A, at least one of the first and second terminals 25*a*, 25*b* may be disposed between adjacent columns of terminals. In another example, one or more of the grids 15, 17 may include a column of terminals for which a column axis extends through a majority of the terminals 25 of such column, i.e., is centered relative thereto. However, in such column, one or more of the terminals might not be centered relative to the column axis. In this case, these one or more terminals are considered part of a particular column, even though such terminal might not be centered relative to the column axis because they are closer to the axis of that particular column than to the axis of any other column. The column axis may extend through these one or more terminals that are not centered relative to the column axis, or, in some cases, the non-centered terminals may be farther from the column axis such that the column axis may not even pass through these non-centered terminals of the column. There may be one, several or many terminals in one column or even in more than one column which are not centered with respect to a column axis of the respective column in a grid. Moreover, it is possible for the grids 15, 17 of terminals 25 to contain arrangements of terminals in groupings other than columns, such as in arrangements shaped like rings, polygons or even scattered distributions of terminals.

In other embodiments, the microelectronic package 10 can include other amounts and configurations of columns 16 and columns 18, as will be shown and described below with reference to FIGS. 6A through 9H. For example, in some of the embodiments described herein, the first terminals can be arranged in no more than four columns or in no more than two columns. Although grids having one and two columns of terminals are shown in the figures, the grids of in any of the embodiments described herein can have any number of columns of terminals.

Electrical connections between the contacts 35 and the terminals 25 can include optional leads, e.g., wire bonds 40, or other possible structure in which at least portions of the leads are aligned with at least one of the apertures 26. For example, as seen in FIG. 5B, at least some of the electrical connections can include a wire bond 40 that extends beyond an edge of an aperture 26 in the substrate, and is joined to the contact 35 and a conductive element 24 of the substrate. In one embodiment, at least some of the electrical connections can include lead bonds. Such connections can include leads that extend along either or both of the first and second surfaces 21, 22 of the substrate 20 between the conductive elements 24 and the terminals 25. In a particular example, such leads can be electrically connected between the contacts 35 of each microelectronic element 30 and the first terminals 25a, each lead having a portion aligned with at least one of the apertures 26.

At least some signals that pass through the first terminals 25a of the package can be common to at least two of the microelectronic elements 30. These signals can be routed through connections such as conductive traces extending on or within the substrate 20 in directions parallel to the first and second surfaces 21, 22 of the substrate from the terminals 25 to the corresponding contacts 35 of the microelectronic elements 30. For example, a first terminal 25a disposed in the central region 23 of the second surface 22 of the substrate 20 can be electrically connected with a conductive contact 35 of each microelectronic element 30 through a conductive trace, a conductive element 24, e.g., a bond pad, and a wire bond 40 joined to the conductive element 24 and the contact 35.

As shown in FIGS. 5A and 5B, the microelectronic package 10 can include two microelectronic elements 30 including first and second microelectronic elements 30a and 30b that are stacked relative to one another. In the embodiment shown in FIGS. 5A and 5B, the front surface 31 of the first microelectronic element 30a can confront the first surface 21 of the substrate 20, and the front surface 31 of the second microelectronic element 30b and a rear surface 33 of the first microelectronic element 30a can face one another. At least a portion of the front surface 31 of the second microelectronic element 30b can overlie at least a portion of the rear surface 33 of the first microelectronic element 30a. At least a portion of the central region 37 of the front surface 31 of the second microelectronic element 30b can project beyond a lateral edge 32b of the first microelectronic element 30a. Accordingly, the contacts 35 of the second microelectronic element 30b can be positioned in a location projecting beyond the lateral edge 32b of the first microelectronic element 30a.

A spacer 14 can be positioned between the front surface 31 of the second microelectronic element 30b and a portion of the first surface 21 of the substrate 20. Such a spacer 14 can be made, for example, from a dielectric material such as silicon dioxide, a semiconductor material such as silicon, or one or more layers of adhesive. If the spacer 14 includes adhesives, the adhesives can connect the second microelectronic element 30b to the substrate 20. In one embodiment, the spacer 14 can have substantially the same thickness T1 in a vertical direction V substantially perpendicular to the first surface 21 of the substrate 20 as the thickness T2 of the first microelectronic element 30a between the front and rear surfaces 31, 33 thereof.

In a particular embodiment, the spacer 14 can be replaced by one or more microelectronic elements including a chip that is configured to perform a buffering function, such microelectronic element having a surface facing the first surface 21 of the substrate 20. In one example, such a buffering chip can be flip-chip bonded to contacts exposed at the first surface 21 of the substrate 20. Each such buffer element can be used to provide signal isolation between terminals of the package, particularly for the above-noted command address bus signals received at the first terminals of the package, and one or more of the microelectronic elements in the package. In one example, such a buffering chip or buffer element can be electrically connected to at least some of the terminals 25 and one or more of the microelectronic elements 30 in the microelectronic package 10, the buffer chip configured to regenerate at least one signal received at one or more of the terminals of the microelectronic package. Typically, the one or more buffer elements regenerate signals received at the first terminals, or which are received at the second terminals, and transfers the regenerated signals to the microelectronic elements in the package.

In a particular example, such a buffering chip can be configured to buffer the address information, or in one example, the command signals, address signals, and clock signals that are transferred to one or more of the microelectronic elements 30a and 30b. Alternatively, or in addition to regenerating signals as described above, in a particular example, such an additional microelectronic element can be configured to partially or fully decode at least one of address information or command information received at the terminals, such as at the first terminals. The decoding chip can then output the result of such partial or full decoding for transfer to one or more of the microelectronic elements 30a and 30b.

In a particular embodiment, instead of or in addition to the aforementioned buffering chip and/or the decoding chip, one or more decoupling capacitors can be disposed in at least a portion of the space occupied by the spacer 14, and such decoupling capacitors can be electrically connected to internal power supply and/or ground buses inside the microelectronic package 10.

One or more adhesive layers 13 can be positioned between the first microelectronic element 30a and the substrate 20, between the first and second microelectronic elements 30a and 30b, between the second microelectronic element 30b and the spacer 14, and between the spacer 14 and the substrate 20. Such adhesive layers 13 can include adhesive for bonding the aforementioned components of the microelectronic package 10 to one another. In a particular embodiment, the one or more adhesive layers 13 can extend between the first surface 21 of the substrate 20 and the front surface 31 of the first microelectronic element 30a. In one embodiment, the one or more adhesive layers 13 can attach at least a portion of the front surface 31 of the second microelectronic element 30b to at least a portion of the rear surface 33 of the first microelectronic element 30a.

In one example, each adhesive layer 13 can be partly or entirely made of a die attachment adhesive and can be comprised of a low elastic modulus material such as silicone elastomer. In one embodiment, the die attachment adhesive can be compliant. In another example, each adhesive layer 13 can be entirely or partly made of a thin layer of high elastic modulus adhesive or solder if the two microelectronic elements are conventional semiconductor chips formed of the same material, because the microelectronic elements will tend to expand and contract in unison in response to temperature changes. Regardless of the materials employed, each of the adhesive layers 13 can include a single layer or multiple layers therein. In a particular embodiment where the spacer 14 is made from an adhesive, the adhesive layers 13 positioned between the spacer 14 and the second microelectronic element 30b and the substrate 20 can be omitted.

The microelectronic package 10 can also include an encapsulant 50 that can optionally cover, partially cover, or leave uncovered the rear surfaces 33 of the microelectronic elements 30. For example, in the microelectronic package 10 shown in FIG. 5B, an encapsulant can be flowed, stenciled, screened or dispensed onto the rear surfaces 33 of the microelectronic elements 30. In another example, the encapsulant 50 can be a mold compound which is formed thereon by overmolding.

The microelectronic package 10 can further include an encapsulant (not shown) that can optionally cover the wire bonds 40 and the conductive elements 24 of the substrate 20. Such an encapsulant can also optionally extend into the apertures 26, and it can cover the contacts 35 of the microelectronic elements 30.

In a particular embodiment, the microelectronic package 10 can be configured to be assembled with another such microelectronic package and a circuit panel such as the circuit panel 60 described below, such that each of the microelectronic packages is assembled to an opposing surface of the circuit panel.

Figure 5E:
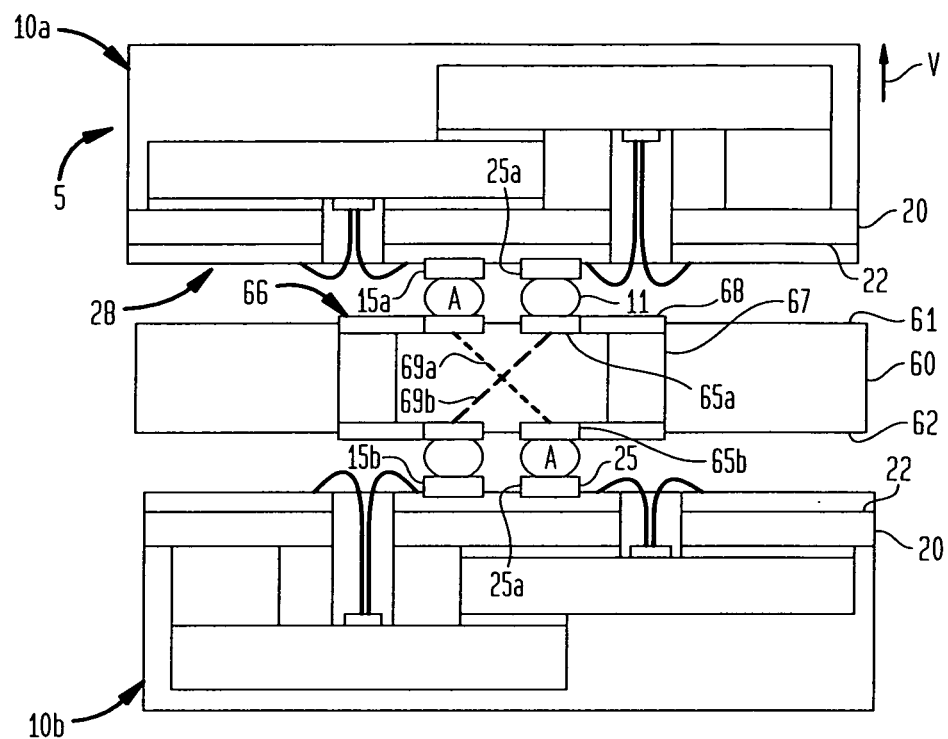
FIG. 5E is one possible side sectional view of a microelectronic assembly including two microelectronic packages as shown in FIG. 5A, taken along the line A-A of FIG. 5A.

Referring now to FIG. 5E, a microelectronic assembly 5 can include two or more microelectronic packages 10, for example, first and second microelectronic packages 10a, 10b, that can be mounted to a common circuit panel 60. The circuit panel 60 can have first and second opposing surfaces 61 and 62 and pluralities of electrically conductive first and second panel contacts 65a and 65b (collectively panel contacts 65) exposed at the respective first and second surfaces. The microelectronic packages 10 can be mounted to the panel contacts 65, for example, by the joining units 11 that can extend between the terminals 25 and the panel contacts. As shown in FIG. 5E, the second surface 22 of the substrate 20 of the first microelectronic package 10a and the second surface of the substrate of the second microelectronic package 10b can overlie at least 90% of one another. In a particular example, the circuit panel 60 can include an element having a CTE less than 30 ppm/° C. In one embodiment, such an element can consist essentially of semiconductor, glass, ceramic or liquid crystal polymer material.

The first terminals 25a of the first microelectronic package 10a can be electrically connected to the first terminals of the second microelectronic package 10b through the circuit panel 60. The first terminals 25a of the first microelectronic package 10a can be arranged at positions of a first grid 15a, and the first terminals 25b of the second microelectronic package 10b can be arranged at positions of a second grid 15b. As shown in FIG. 5A, the first terminals 25a of the first grid 15a of the first microelectronic package 10a can be aligned within one ball pitch of the corresponding first terminals 25b to which they are connected of the second grid 15b of the second microelectronic package 10b.

As used herein, alignment within a particular number of ball pitches means aligned within the particular number of ball pitches with respect to a horizontal direction perpendicular to the first surface of the substrate. In an exemplary embodiment, each pair of electrically connected terminals of the grids 15a, 15b of the respective first and second packages 10a, 10b can be aligned within one ball pitch of one another in orthogonal x and y directions parallel to the first surface 61 of the circuit panel 60.

In one embodiment, the grids 15a and 15b of the respective first and second microelectronic packages 10a and 10b can be functionally and mechanically matched, such that each of the grids 15a and 15b can have the same pattern of first terminals 25a at the second surface 22 of the substrate 20 of the respective microelectronic package 10a or 10b with the same function, although the particular dimensions of the length, width, and height of each microelectronic package 10 can be different than that of the other microelectronic packages. In such an embodiment having functionally and mechanically matched grids 15a and 15b, the first terminals 25a of each microelectronic package 10 can be oriented such that a functional top end 19 of the grid of the first microelectronic package 10a (that can be seen in FIG. 5A) can overlie the functional top end 19 of the grid of the second microelectronic package 10b.

In a particular example (not shown), a spatial distribution of the first terminals 25a along the second surface 22 of the substrate 20 of at least one of the first and second microelectronic packages 10 can be different from a spatial distribution of the corresponding panel contacts 65 to which they are electrically connected, such that at least one of the first terminals 25a does not directly overlie the corresponding panel contact 65 to which it is electrically connected.

As shown in FIG. 5E and in the other microelectronic assembly side sectional figures herein, the second terminals are omitted from the figures for clarity. In FIG. 5E, for example, although the second terminals are not shown in the figure, the second terminals can be present in the peripheral regions 28 of the second surface 22 of each microelectronic package 10. The second terminals of each microelectronic package 10 can be mounted to corresponding ones of the panel contacts 65, for example, by joining units such as the joining units 11 that can extend between the second terminals and the panel contacts.

As shown in FIG. 5E, the circuit panel 60 of the microelectronic assembly 5 can include one or more routing layers 66, e.g., a layer of electrically conductive traces thereon, for routing of all of the command signals, address signals, bank address signals, and clock signals. As shown in FIG. 5E, metalized vias 67 extending through the circuit panel 60 can be coupled to the panel contacts 65 by conductive structure 68 (e.g., traces) of the routing layer 66. In a particular example, the total combined length of the conductive elements (e.g., the vias 67 and the conductive structure 68) connecting a pair of electrically coupled first and second panel contacts 65a and 65b exposed at the respective first and second surfaces 61 and 62 of the circuit panel 60 can be less than seven times a minimum pitch of the panel contacts 65.

In one example, in a microelectronic assembly embodiment having microelectronic packages with grids 15 each having first terminals 25a arranged in two parallel columns 16, the circuit panel 60 may include no more than two routing layers 66 required for routing of all of the command signals, address signals, bank address signals, and clock signals. However, the circuit panel 60 may include more than two routing layers for the routing of signals other than the particular signals carried by the first terminals 25a.

In the embodiment shown in FIG. 5E, the first panel contacts 65a can be joined to the first terminals 25a of the first microelectronic package 10a and can be arranged in first and second linearly extending columns exposed at the first surface 61 of the circuit panel 60, and the second panel contacts 65b can be joined to the first terminals 25a of the second microelectronic package 10b and can be arranged in first and second linearly extending columns exposed at the second surface 62 of the circuit panel 60. The first column of the first panel contacts 65a, shown bonded to joining units 11 labeled with an 'A', can be aligned with the second column of the second panel contacts 65b in a direction of a thickness of the circuit panel, and the second column of the first panel contacts 65a can be aligned in the direction of the circuit panel thickness with the first column of the second panel contacts 65b, also shown bonded to joining units labeled with an 'A'.

Each of the first panel contacts 65a at the first surface 61 labeled with an 'A' can be electrically coupled to a corresponding second panel contact 65b at the second surface 62 labeled with an 'A', such that each panel contact 65 in the first column at each surface 61, 62 can be coupled to a corresponding panel contact in the first column at the opposite surface. In FIG. 5E, a schematic of the electrical connections between corresponding ones of the panel contacts 65 are shown via dotted lines 69a and 69b. Also, each panel contact 65 in the second column at each surface 61, 62 can be coupled to a corresponding panel contact in the second column at the opposite surface.

In the microelectronic assembly 5, each first terminal 25a of the first microelectronic package 10a can be electrically coupled through the circuit panel 60 to a corresponding first terminal of the second microelectronic package 10b having the same function, with a relatively short stub length. As used herein, "stub length" means the total length of the shortest electrical connection between a terminal 25 of a microelectronic package 10 at a first surface of the circuit panel and a corresponding terminal of a microelectronic package at the second opposed surface of the circuit panel. In one example, stub lengths of the electrical connections between the first and second microelectronic packages 10a and 10b can be less than seven times a minimum pitch of the first terminals 25a of each microelectronic package.

Figure 5F:
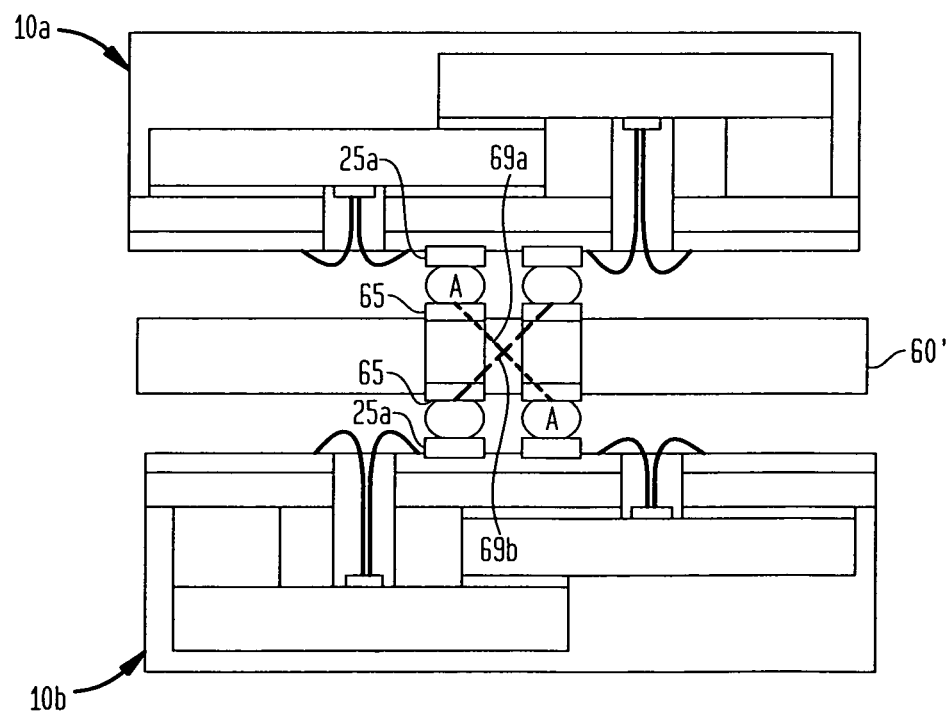
FIG. 5F is another possible side sectional view of a microelectronic assembly including two microelectronic packages as shown in FIG. 5A, taken along the line A-A of FIG. 5A.

FIG. 5F illustrates a variation of the embodiment described above relative to FIG. 5E, in which the metalized vias 67' extending through the circuit panel 60' are arranged in a common vertical plane with the first terminals 25a of each of the first and second microelectronic elements 10a, 10b. Although the vias 67' and the first terminals 25a are in a common vertical plane, corresponding first terminals 25a in each of the first and second microelectronic packages 10a and 10b can be horizontally offset from one another, so that horizontally and vertically extending conductive structure (e.g., traces and metalized vias) of the circuit panel can electrically connect the corresponding first terminals. Similar to FIG. 5E, a schematic of the electrical connections between corresponding ones of the panel contacts 65 in FIG. 5F are shown via dotted lines 69a and 69b.

Figure 5G:
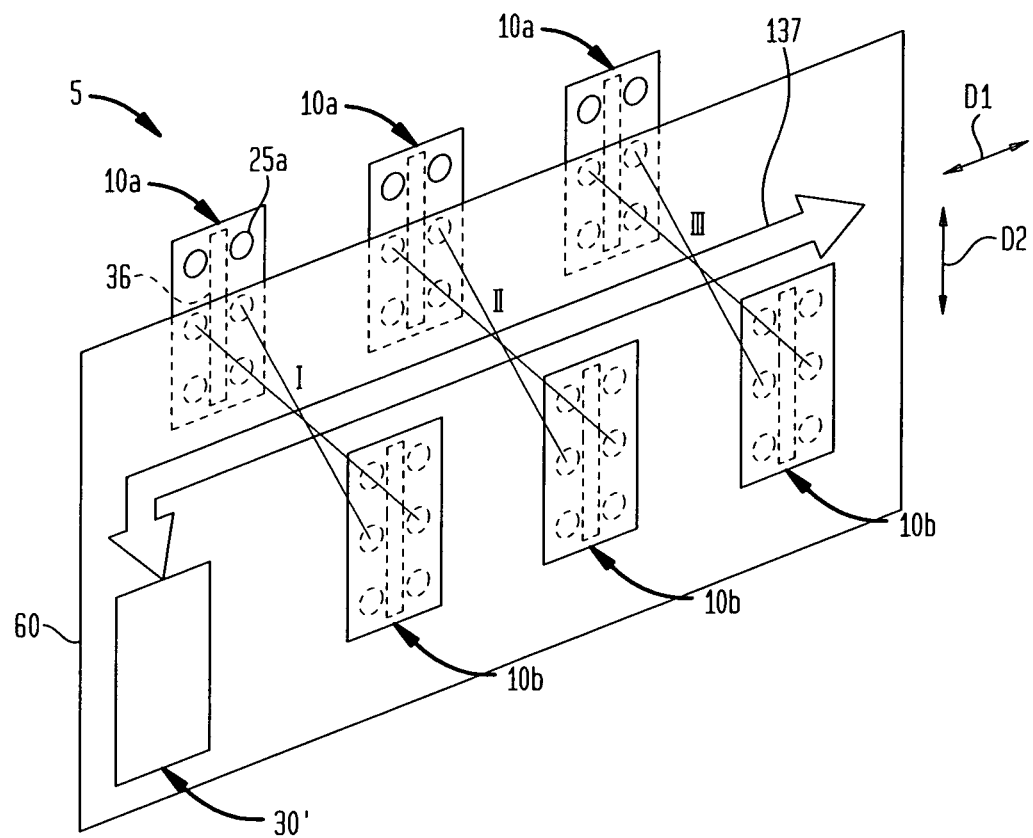
FIG. 5G is a possible diagrammatic perspective view of the microelectronic assembly of FIG. 5E showing electrical connections between terminals of the microelectronic packages.

In a particular embodiment of the microelectronic assembly 5, as shown in FIG. 5G, the command-address bus signals can be routed in at least one direction D1 between connection sites on a circuit panel such as the circuit panel 60 at which a plurality of microelectronic packages 10a, 10b are connected, such that signals of the command-address bus 137 reach each pair of packages 10a and 10b at respective connection sites I, II or III at slightly different times. As seen in FIG. 5G, the at least one direction D1 can be transverse or orthogonal to a direction D2 in which at least one column 36 of a plurality of contacts 35 on at least one microelectronic element 30 extends. In such a way, the signal conductors of the command-address bus 137 on (i.e., on or within) the circuit panel 60 can in some cases be spaced apart from one another in the direction D2 that is parallel to the at least one column 36 of contacts 35 on a microelectronic element 30 within a package 10a or 10b connected to, or to be connected to the circuit panel 60.

Such a configuration, particularly when the first terminals 25a of each microelectronic package 10a, 10b are arranged in one or more columns extending in such direction D2, may help simplify the routing of signal conductors of one or more routing layers on the circuit panel 60 used to route command-address bus signals. For example, it may be possible to simplify routing of the command-address bus signals on a circuit panel when relatively few first terminals are disposed at the same vertical layout position on each package. Thus, in the example shown in FIG. 5A, only two first terminals 25a are disposed at the same vertical layout position on each package, such as the first terminals configured to receive address signals A3 and A1.

In an exemplary embodiment, the microelectronic assembly 5 can have a microelectronic element 30' that can include a semiconductor chip configured predominantly to perform a logic function, such as a solid state drive controller, and one or more of the microelectronic elements 30 in the microelectronic packages 10a and 10b can each include memory storage elements such as nonvolatile flash memory. The microelectronic element 30' can include a special purpose processor that is configured to relieve a central processing unit of a system such as the system 1300 (FIG. 13) from supervision of transfers of data to and from the memory storage elements included in the microelectronic elements 30. Such a microelectronic element 30' including a solid state drive controller can provide direct memory access to and from a data bus on a motherboard (e.g., the circuit panel 1302 shown in FIG. 13) of a system such as the system 1300. In a particular embodiment, the microelectronic element 30' can be configured to perform a buffering function, e.g., the microelectronic element 30' can be configured to regenerate the above-noted command-address bus signals for transfer to each of the microelectronic packages 10a and 10b. Such a microelectronic element 30' can be configured to help provide impedance isolation for each of the microelectronic elements 30 with respect to components external to the microelectronic assembly 5.

In such an embodiment of the microelectronic assembly 5 having a microelectronic element 30' that includes a controller function and/or a buffering function, the command-address bus signals can be routed between the microelectronic element 30' and each pair of packages 10a and 10b at respective connection sites I, II or III. In the particular example shown in FIG. 5G, a portion of the command address bus 137 that extends past the connection sites I, II or III can extend in the direction D2 or in another direction transverse to the direction D1 to reach contacts of the microelectronic element 30'. In one embodiment, the command-address bus 137 can extend in the direction D1 to reach contacts of the microelectronic element 30'.

Figure 6A:
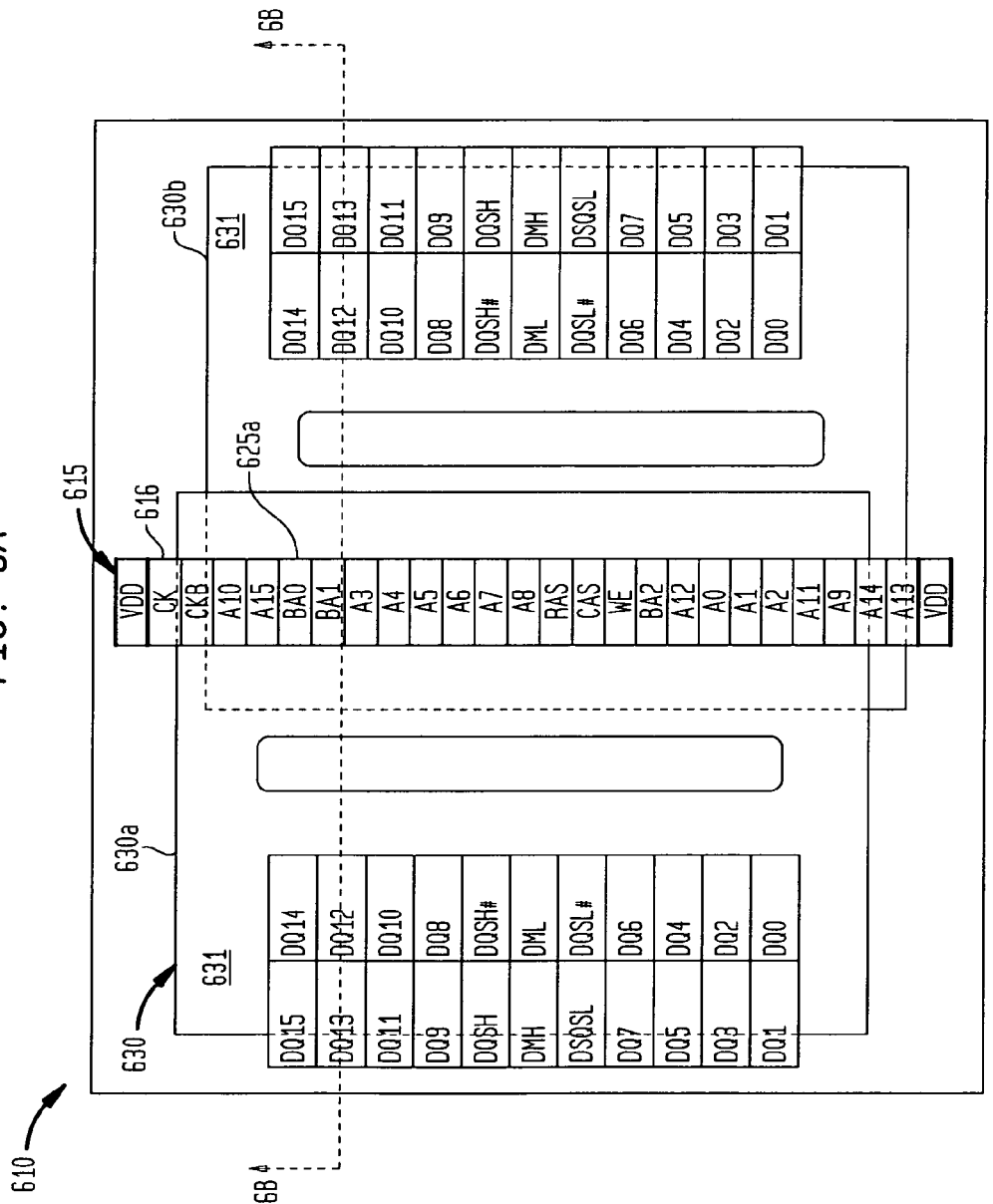
FIG. 6A is a diagrammatic bottom plan view of a microelectronic package according to another embodiment having a grid of terminals arranged in a single column.

FIG. 6A illustrates a variation of the embodiment described above relative to FIG. 5A, in which the first terminals 625a of the microelectronic package 610 are arranged in a grid 615 having a single column 616. Although the grid 615 is shown extending beyond the outer boundaries of the front surface 631 of the microelectronic elements 630, that need not be the case. A potential advantage of such an embodiment can be seen in FIG. 6B, which shows a microelectronic assembly 605 that can include two or more microelectronic packages 610 that can be mounted to a common circuit panel 660. As shown in FIG. 6B, corresponding first terminals 625a in each of the first and second microelectronic packages 610a and 610b can be arranged in a common vertical plane. The circuit panel construction may also be simplified in a microelectronic assembly 605 having this construction, because the routing between each electrically connected pair of first terminals 625a can be mostly in a vertical direction, i.e., in a direction through the thickness of the circuit panel. That is, via connections on the circuit panel 660 may be all that is needed to electrically connect each pair of corresponding first terminals 625a of the microelectronic packages 610 mounted to the opposite surfaces 661, 662 of the circuit panel.

In such an embodiment, the corresponding first terminals 625a in each of the first and second microelectronic packages 610a and 610b may not be horizontally offset from one another (or can be minimally horizontally offset due to manufacturing tolerance, for example), so at least some of the electrical connections carrying the command signals, address signals, bank address signals, and clock signals through the circuit panel 660 between the first terminals 625a of the first and second microelectronic packages 610a and 610b can have an electrical length of approximately a thickness of the circuit panel. As used herein, "signals of fixed potential" include power and ground (reference potential) signals.

Moreover, the number of routing layers of wiring on the circuit panel 660 required to route the command-address bus signals along the circuit panel between connection sites where respective pairs of microelectronic packages 610 are connected can be reduced. Specifically, the number of routing layers required to route such signals along the circuit panel 660 may in some cases be reduced to two or fewer routing layers. In a particular example, there may be no more than one routing layer required to route such signals along the circuit panel 660. However, on and within the circuit panel 660, there may be a greater number of routing layers used for carrying other signals than the number of routing layers that are used for carrying the above-noted signals of the command-address bus.

Figure 7A:
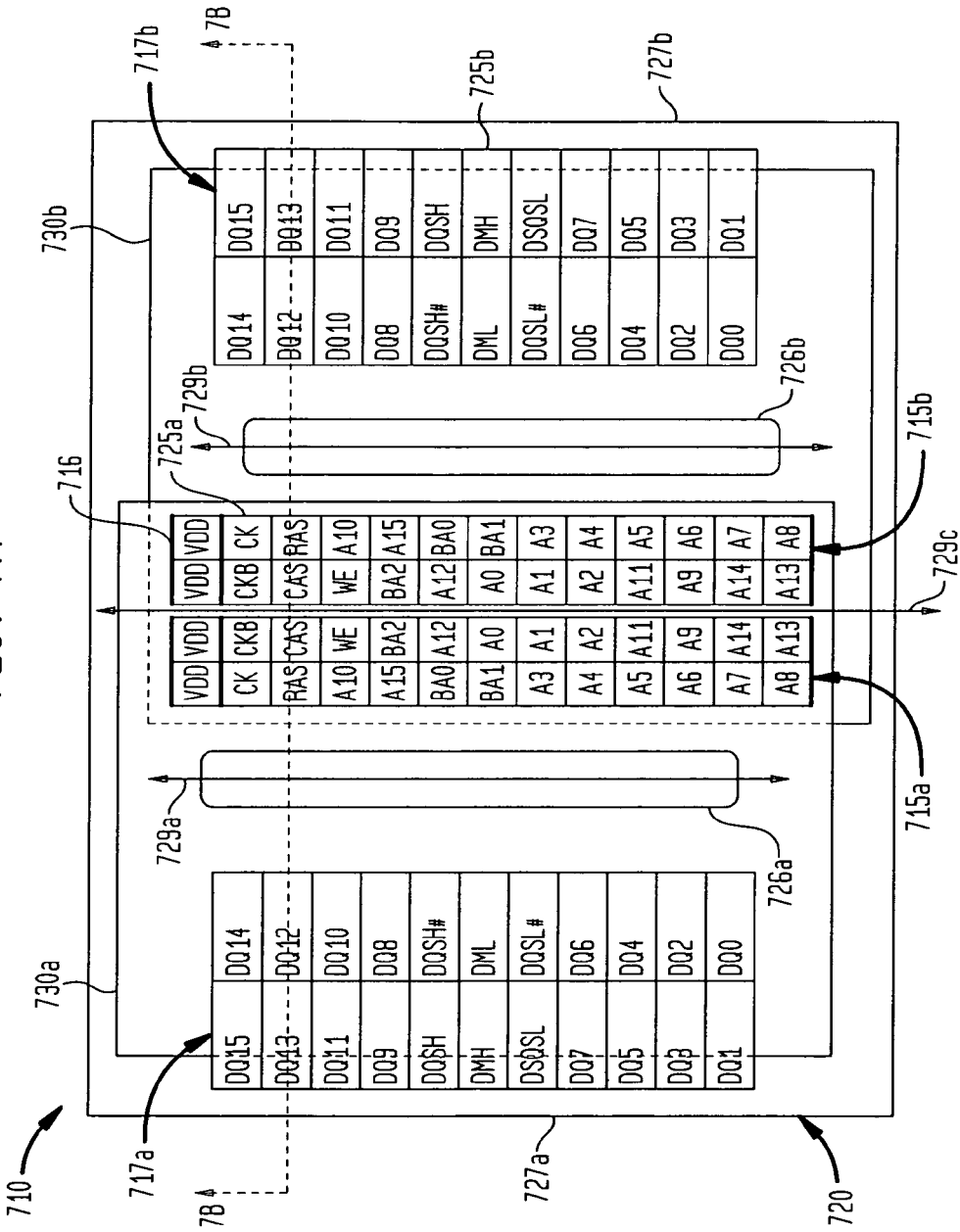
FIG. 7A is a diagrammatic bottom plan view of a microelectronic package according to yet another embodiment having two grids of terminals, each grid arranged in two columns.

FIG. 7A illustrates a variation of the embodiment described above relative to FIG. 5A, in which the first terminals 725a of the microelectronic package 710 are disposed in first and second sets of first terminals arranged in respective positions within first and second parallel grids 715a and 715b, each grid having two adjacent columns 716 of the first terminals. In this embodiment, the first terminals 725a in the first set arranged at positions within the first grid 715a can be configured to carry all of the same signal assignments as the first terminals in the second set arranged at positions within the second grid 715b, and the positions of corresponding ones of the first terminals in the first and second sets are shown mirrored about a third theoretical axis 729c between the first and second grids, the third theoretical axis being parallel to the first and second parallel axes 729a and 729b of the apertures 726a and 726b. In this embodiment, each first terminal 725a that is configured to carry a particular signal in the first set of first terminals arranged at positions within the first grid 715a can be symmetric about the third theoretical axis 729c with respect to a corresponding first terminal that is configured to carry the same signal in the second set of first terminals arranged at positions within the second grid 715b. Stated another way, the signal assignments of the first terminals 725a in the first set correspond to and are a mirror image of the signal assignments of the corresponding first terminals in the second set.

The third theoretical axis 729c about which the signal assignments of the first terminals 725a are symmetric can be located at various positions on the substrate 720. In a particular embodiment, the third axis 729c can be a central axis of the package that is located equidistant from first and second opposed edges 727a, 727b of the substrate, particularly when the columns 716 of the first terminals extend in a direction parallel to the edges 727a, 727b and the first and second grids 715a, 715b are disposed at locations that are symmetric about this central axis.

Alternatively, this axis of symmetry can be offset in a horizontal direction (a direction perpendicular to the third axis 729c) from the central axis that is equidistant between edges 727a, 727b. In one example, the third axis 729c can be located within one ball pitch of the first terminals 725a of a centerline of the second surface 722 of the substrate 720 located equidistant between first and second opposed edges 727a and 727b of the second surface.

In a particular example, the first terminals 725a of the first grid 715a can be electrically connected with the first microelectronic element 730a, and the first terminals of the second grid 715b can be electrically connected with the second microelectronic element 730b. In such case, the first terminals 725a of the first grid 715a may also be not electrically connected with the second microelectronic element 730b, and the first terminals 725a of the second grid 715b of the package 710 may also be not electrically connected with the first microelectronic element 730a. In yet another example, the first terminals 725a of each of the first and second grids 715a, 715b can be electrically connected with each of the first and second microelectronic elements 730a, 730b.

With the signal assignments in the second grid 715b being a mirror image of those in the first grid 715a, a first terminal 725a of the first grid that is assigned to carry the signal CK (clock) is in the same relative vertical position (a direction along the third axis 729c) within the grid as the corresponding first terminal of the second grid that is assigned to carry the signal CK. However, since the first grid 715a contains two columns 716 and the terminal of the first grid assigned to carry the signal CK is in the left column among the two columns of the first grid, the mirror image arrangement requires that the corresponding terminal of the second grid 715b assigned to carry the signal CK is in the right column among the two columns of the second grid.

In another example in accordance therewith, it is apparent that terminals assigned to carry address information shown as "A3" of each of the first and second grids 715a, 715b of first terminals (shown in FIG. 7A) designates a corresponding element contact (shown in FIG. 7B) of one or more microelectronic elements within the microelectronic package 710 which element contact has the name "A3". Thus, such corresponding first terminals 725a at the exterior of the microelectronic package 710 in each of the first and second sets of first terminals through which information is transferred to element contacts having the same name, e.g., "A3", are considered to have mirror image signal assignments, even if the names of the corresponding first terminals in the first and second sets are different. Thus, in one example, it is possible the signals assigned to each pair of first terminals 725a having mirror image signal assignments, e.g., the signal assignments designated "A3" in each of the first and second sets of first terminals, identify terminals that carry information to be input to element contacts having the name "A3" on microelectronic elements, although the names of the corresponding terminals in each of the first and second sets can be different, such as may be given the names A3L (A3 left) in the first set and A3R (A3 right) in the second set.

Further, the address information provided to the microelectronic package 710 at the corresponding pairs of first terminals shown as "A3" in FIG. 7A may in some cases originate from the identical output of driver circuitry at a location external to the microelectronic structure. As a result, a first terminal 725a of the first grid 715a that is assigned to carry the signal "A3" (i.e., as described above, for transfer of information thereon to an element contact named "A3" of a microelectronic element) is in the same relative vertical position (in direction 142) within the grid as the corresponding first terminal 725a of the second grid 715b that is assigned to carry the signal "A3".

Another result of this arrangement is that the terminal assigned to carry the signal WE (write enable) is also in the same relative vertical position within the grid in each of the first and second grids 715a, 715b. However, in the first grid 715a, the terminal assigned to carry WE is in the right column among the two columns 716 of the first grid, and the mirror image arrangement requires that the corresponding terminal of the second grid 715b assigned to carry the signal WE is in the left column among the two columns of the second grid. As can be seen in FIG. 7A, the same relationship applies for each first terminal 725a in each of the first and second grids 715a, 715b, at least for each first terminal assigned to carry a command-address bus signal as discussed above.

As shown in FIG. 7A, the second terminals 725b can be in first and second parallel grids 717a and 717b, and the positions of corresponding ones of the second terminals 725b in such first and second grids can be mirrored about the third axis 729c. In a particular example (not shown), some or all of the second terminals 725b can be arranged in the same grids 715a, 715b on the substrate 720 in which the first terminals 725a are arranged. Some or all of the second terminals 725b may be disposed in the same column or in different columns as some or all of the first terminals 725a. In some cases, one or more second terminals 725b can be interspersed with the first terminals 725a in the same grids or column thereof.

Figure 7B:
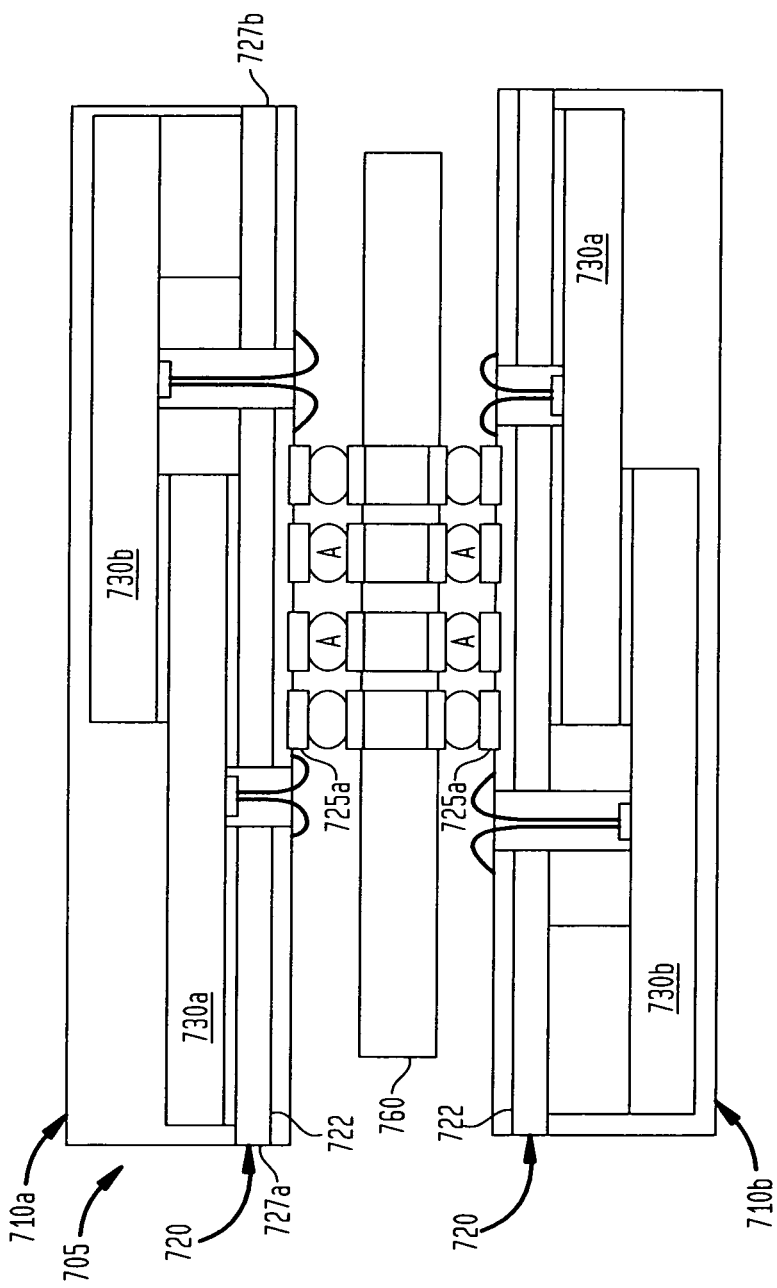
FIG. 7B is a possible side sectional view of a microelectronic assembly including two microelectronic packages as shown in FIG. 7A, taken along the line 7B-7B of FIG. 7A.

Similar to the embodiment of FIG. 6A, a potential advantage of the embodiment of FIG. 7A can be seen in FIG. 7B, which shows a microelectronic assembly 705 that can include two or more microelectronic packages 710 that can be mounted to a common circuit panel 760. As shown in FIG. 7B, corresponding first terminals 725a in each of the first and second microelectronic packages 710a and 710b can be arranged in a common vertical plane, which can allow at least some of the electrical connections carrying the command signals, address signals, bank address signals, and clock signals through the circuit panel 760 between the first terminals 725a of the first and second microelectronic packages 710a and 710b to have an electrical length of approximately a thickness of the circuit panel.

FIG. 8A illustrates a variation of the embodiment described above relative to FIG. 7A, in which the microelectronic package 810 includes three microelectronic elements 830. In this embodiment, the microelectronic package 810 includes first and second microelectronic elements 830a and 830b each having a front surface 831 arranged in a single plane parallel to the first surface 821 of the substrate 820, and a third microelectronic element 830c having a front surface 831 at least partially overlying the rear surface 833 of each of the first and second microelectronic elements. In one example, in such a microelectronic package having three microelectronic elements 830, the third microelectronic element 830c can be a NAND flash element.

The substrate 820 can have a third aperture 826c having a third axis 829c extending in a direction of the length of the third aperture, the third axis being parallel to the first and second axes 829a and 829b of the respective first and second apertures 826a and 826b. The third microelectronic element 830c can have a plurality of contacts 835 at the first surface 831 thereof aligned with at least one of the apertures 826.

Similar to the embodiment shown in FIG. 7A, the first terminals 825a of the microelectronic package 810 are arranged in first and second parallel grids 815a and 815b, each grid having two adjacent columns 816 of the first terminals, and the positions of corresponding ones of the terminals 825a in the first and second grids are shown mirrored about a fourth axis 829d (that may be coincident with the third axis 829c) between the first and second grids that is parallel to the first and second axes 829a and 829b.

In this variation, some of the second terminals 825b can be located in grids 817 oriented parallel to the grids 815 of the first terminals 825a, and some of the second terminals can be located in grids 817a and 817b oriented perpendicularly to the grids 815 of the first terminals 825a.

The grids 817, 817a, and 817b of second terminals 825b, which can overlie portions of the microelectronic elements 830a, 830b, and 830c and can be electrically connected therewith, can have terminals disposed in any suitable arrangement, there being no requirement to place these second terminals in grids in which the signal assignments in one of the grids are a mirror image of the signal assignments of the terminals another one of the grids. In the particular example shown in FIG. 8A, the signal assignments of the two grids 817 are symmetric about the fourth axis 829d with respect to one another, where the fourth axis extends in a direction between these grids 817.

Also, as shown in FIG. 8A, the signal class assignments of the second terminals 825b in the grid 817a can be symmetric about the fourth axis 829d, and the signal class assignments of the second terminals in the grid 817b can be symmetric about the fourth axis. As used herein, two signal class assignments can be symmetric with respect to one another if the signal assignments are in the same class of assignments, even if the numerical index within the class differs. Exemplary signal class assignments can include data signals, data strobe signals, data strobe complement signals, and data mask signals. In a particular example, in the grid 817b, the second terminals 825b having signal assignments DQSH# and DQSL# are symmetric about the fourth axis 829d with respect to their signal class assignment, which is data strobe complement, even though those second terminals have different signal assignments.

As further shown in FIG. 8A, the assignments of the data signals to the spatial positions of the second terminals 825b in the grids 817a and 817b on the microelectronic package 810, such as for data signals DQ0, DQ1, . . . , for example, can have modulo-X symmetry about a vertical axis such as the fourth axis 829d. The modulo-X symmetry can help preserve signal integrity in an assembly 5 such as seen in FIG. 5E, in which one or more pairs of first and second packages are mounted opposite one another to a circuit panel, and the circuit panel electrically connects corresponding pairs of second terminals of those first and second packages in each oppositely-mounted package pair. As used herein, when the signal assignments of terminals have "modulo-X symmetry" about an axis, terminals that carry signals that have the same index number "modulo-X" are disposed at positions that are symmetric about the axis. Thus, in such assembly 5 such as in FIG. 5E, modulo-X symmetry can permit electrical connections to be made through the circuit panel so that a terminal DQ0 of a first package can be electrically connected through the circuit panel to a terminal DQ8 of the second package that has the same index number modulo X (X being 8 in this case), so that the connection can be made in a direction essentially straight through, i.e., normal to, the thickness of the circuit panel.

In one example, "X" can be a number $2^n$ (2 to the power of n), wherein n is greater than or equal to 2, or X can be 8×N, N being two or more. Thus, in one example, X may be equal to the number of bits in a half-byte (4 bits), byte (8 bits), multiple bytes (8×N, N being two or more), a word (32 bits) or multiple words. In such way, in one example, when there is modulo-8 symmetry as shown in FIG. 8A, the signal assignment of a package terminal DQ0 in grid 817*b* configured to carry data signal DQ0 is symmetric about the fourth axis 829*d* with the signal assignment of another package terminal configured to carry data signal DQ8. Moreover, the same is true for the signal assignments of package terminals DQ1 and DQ9 in grid 817*a*. As further seen in FIG. 8A, the signal assignments of package terminals DQ2 and DQ10 in grid 817*b* have modulo-8 symmetry about the fourth axis 829*d*, and the same is also true for terminals DQ3 and DQ11 in grid 817*a*. Modulo-8 symmetry such as described herein can be seen in grids 817*a* and 817*b* with respect to each of the signal assignments of package terminals DQ0 through DQ15.

It is important to note that, although not shown, the modulo number "X" can be a number other than $2^n$ (2 to the power of n) and can be any number greater than two. Thus, the modulo number X upon which the symmetry is based can depend upon how many bits are present in a data size for which the package is constructed or configured. For example, when the data size is 10 bits instead of 8, then the signal assignments may have modulo-10 symmetry. It may even be the case that when the data size has an odd number of bits, the modulo number X can have such number.

Figure 8B:
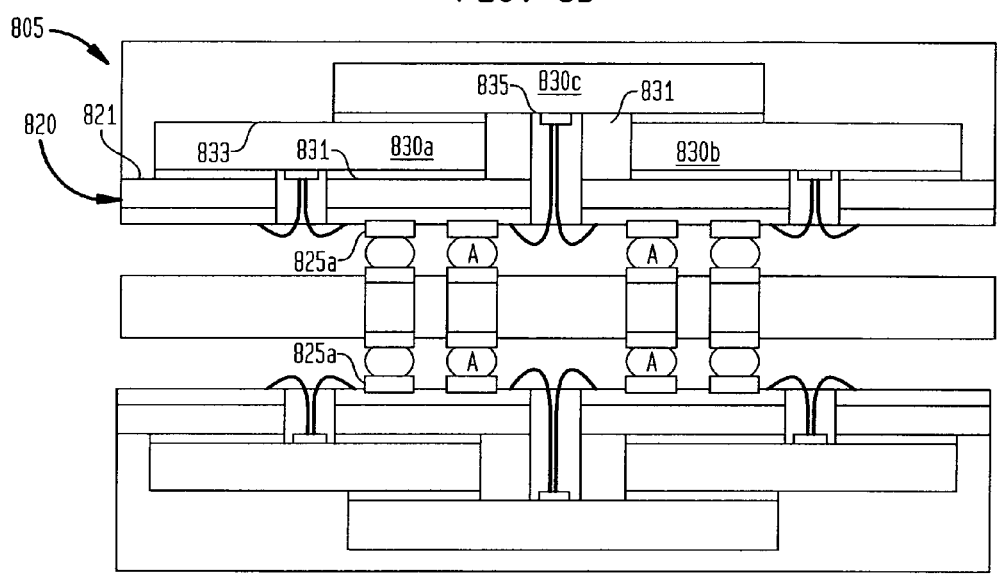
FIG. 8B is a possible side sectional view of a microelectronic assembly including two microelectronic packages as shown in FIG. 8A, taken along the line 8B-8B of FIG. 8A.

A potential advantage of such an embodiment can be seen in FIG. 8B, which shows a microelectronic assembly 805 that can include two or more microelectronic packages 810 that can be mounted to a common circuit panel 860. As shown in FIG. 8B, corresponding first terminals 825*a* in each of the first and second microelectronic packages 810*a* and 810*b* can be arranged in a common vertical plane.

In such an embodiment, the corresponding first terminals 825*a* in each of the first and second microelectronic packages 810*a* and 810*b* may not be horizontally offset from one another (or can be minimally horizontally offset due to manufacturing tolerance, for example), so at least some of the electrical connections carrying the command signals, address signals, bank address signals, and clock signals through the circuit panel 860 between the first terminals 825*a* of the first and second microelectronic packages 810*a* and 810*b* can have an electrical length of approximately a thickness of the circuit panel.

FIG. 9A illustrates a variation of the embodiment described above relative to FIG. 8A, in which the microelectronic package 910 includes four microelectronic elements 930. In this embodiment, the microelectronic package 910 includes first and third microelectronic elements 930*a* and 930*c* each having a front surface 931 arranged in a single plane parallel to the first surface 921 of the substrate 920, and second and fourth microelectronic elements 930*b* and 930*d* each having a front surface 931 at least partially overlying the rear surface 933 of at least one of the first and third microelectronic elements.

The substrate 920 can have a fourth aperture 926*d* having a fourth axis 929*d* extending in a direction of the length of the fourth aperture, the fourth axis being parallel to the first, second, and third axes 929*a*, 929*b*, and 929*c* of the respective first, second, and third apertures 926*a*, 926*b*, and 926*c*. The fourth microelectronic element 930*c* can have a plurality of contacts 935 at the first surface 931 thereof aligned with at least one of the apertures 926.

Similar to the embodiment shown in FIG. 8A, the first terminals 925*a* of the microelectronic package 910 are arranged in first and second parallel grids 915*a* and 915*b*, each grid having two adjacent columns 916 of the first terminals, and the positions of corresponding ones of the terminals 925*a* in the first and second grids are shown mirrored about a fifth axis 929*e* between the first and second grids that is parallel to the first, second, third, and fourth parallel axes 929*a*, 929*b*, 929*c*, and 929*d*.

In such an embodiment having four microelectronic elements 930 and two grids 915 of first terminals 925*a* mirrored with respect to one another about an axis 929*e* therebetween, each of the grids can be electrically connected to at least two of the microelectronic elements.

A potential advantage of such an embodiment can be seen in FIG. 9B, which shows a microelectronic assembly 905 that can include two or more microelectronic packages 910 that can be mounted to a common circuit panel 960. As shown in FIG. 9B, corresponding first terminals 925*a* in each of the first and second microelectronic packages 910*a* and 910*b* can be arranged in a common vertical plane.

In a variation of the embodiment shown in FIGS. 9A and 9B (not shown), the fourth microelectronic element 930*d* may partially overlie the first microelectronic element 930*a*, but it may not overlie the third microelectronic element 930*c*. In such a variation, a second spacer such as the spacer 914 shown in FIG. 9B can be added to the microelectronic package 910. Such a second spacer can be disposed adjacent the third microelectronic element 930*c* and between the front surface 931 of the fourth microelectronic element 930*d* and the first surface 921 of the substrate 920. Such a spacer can provide additional mechanical support for the fourth microelectronic element 930*d*, in a manner similar to the spacer 914 shown in FIG. 9B that can provide some mechanical support to second microelectronic element 930*b*. This variation can include two adjacent overlapping pairs of microelectronic elements, which would have the appearance of two pairs of microelectronic elements 30*a*, 30*b* (FIG. 5B) disposed adjacent one another overlying the same substrate.

Figure 9C:
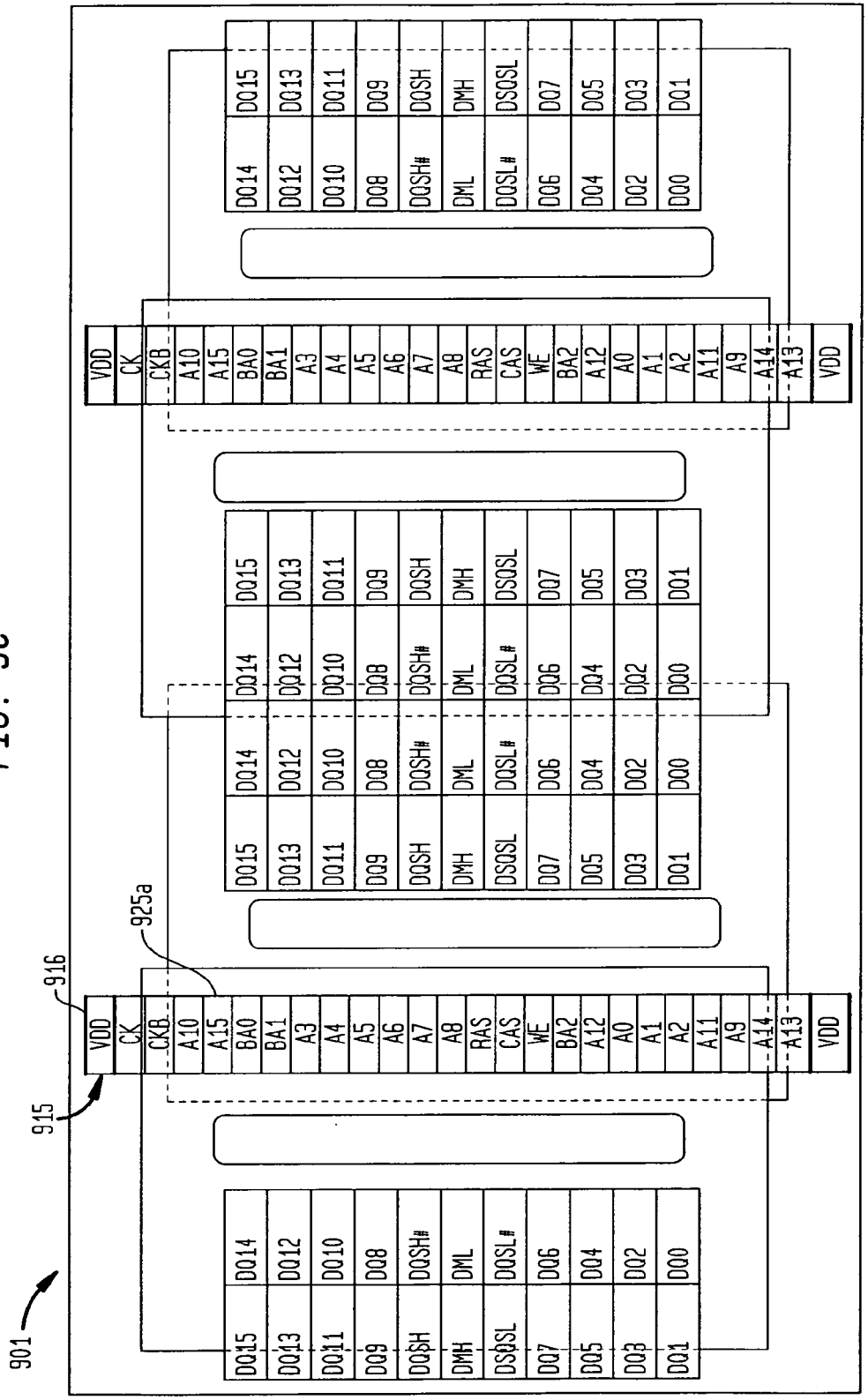
FIG. 9C is a variation of the microelectronic package of FIG. 9A having two grids of terminals, each grid arranged in a single column.

FIGS. 9C-9F show variations of the embodiment of the microelectronic package shown in FIG. 9A. FIG. 9C shows a microelectronic package 901 having first terminals 925*a* arranged in two parallel grids 915 each having a single column 916.

Figure 9D:
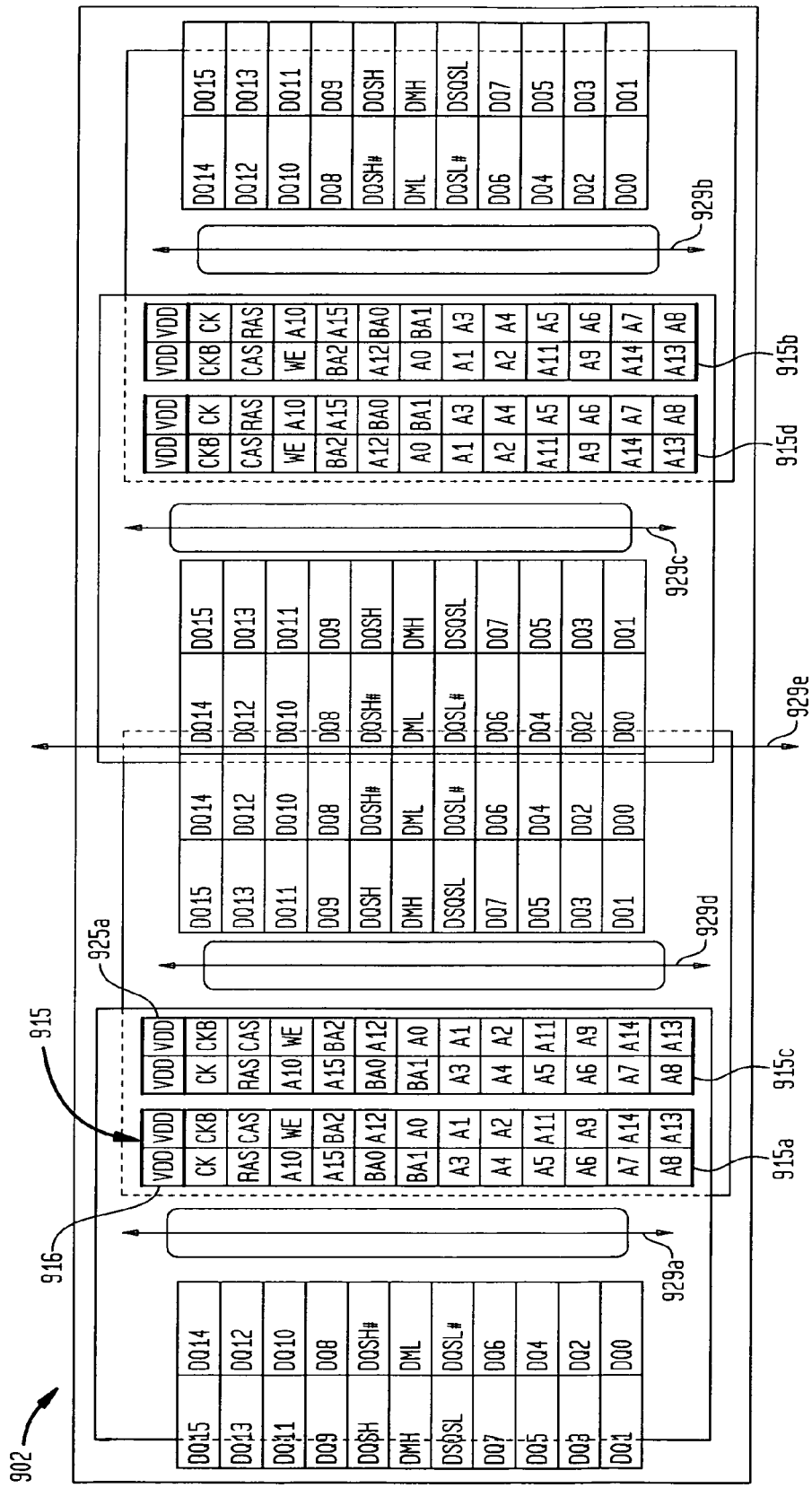
FIG. 9D is another variation of the microelectronic package of FIG. 9A having four grids of terminals, each grid arranged in two columns.

FIG. 9D shows a microelectronic package 902 having first terminals 925*a* arranged in four parallel grids 915 each having two columns 916. As shown in FIG. 9D, the two outer grids 915*a* and 915*b* can be mirrored with respect to one another about a fifth axis 929*e* between the outer grids that is parallel to the first, second, third, and fourth parallel axes 929*a*, 929*b*, 929*c*, and 929*d*, and the two inner grids 915*c* and 915*d* can be mirrored with respect to one another about the fifth axis. In a variant of FIG. 9D (not shown), each outer grid 915*a* and 915*b* can also be mirrored with respect to an adjacent one of the inner grids 915*c* and 915*d*.

FIGS. 9E-9H show microelectronic packages 903, 903', 904, and 904' having four microelectronic elements 930 each having a plurality of contacts 935 at the first surface 931 thereof aligned with at least one of the apertures 926, but the first and third apertures 926*a* and 926*c* have a common first axis 929*a* extending in a direction of the length of the first and third apertures, and the second and fourth apertures 926*b* and 926*d* have a common second axis 929*b* extending in a direction of the length of the second and fourth apertures. The first and second axes 929*a* and 929*b* can be parallel to one another.

Figure 9E:
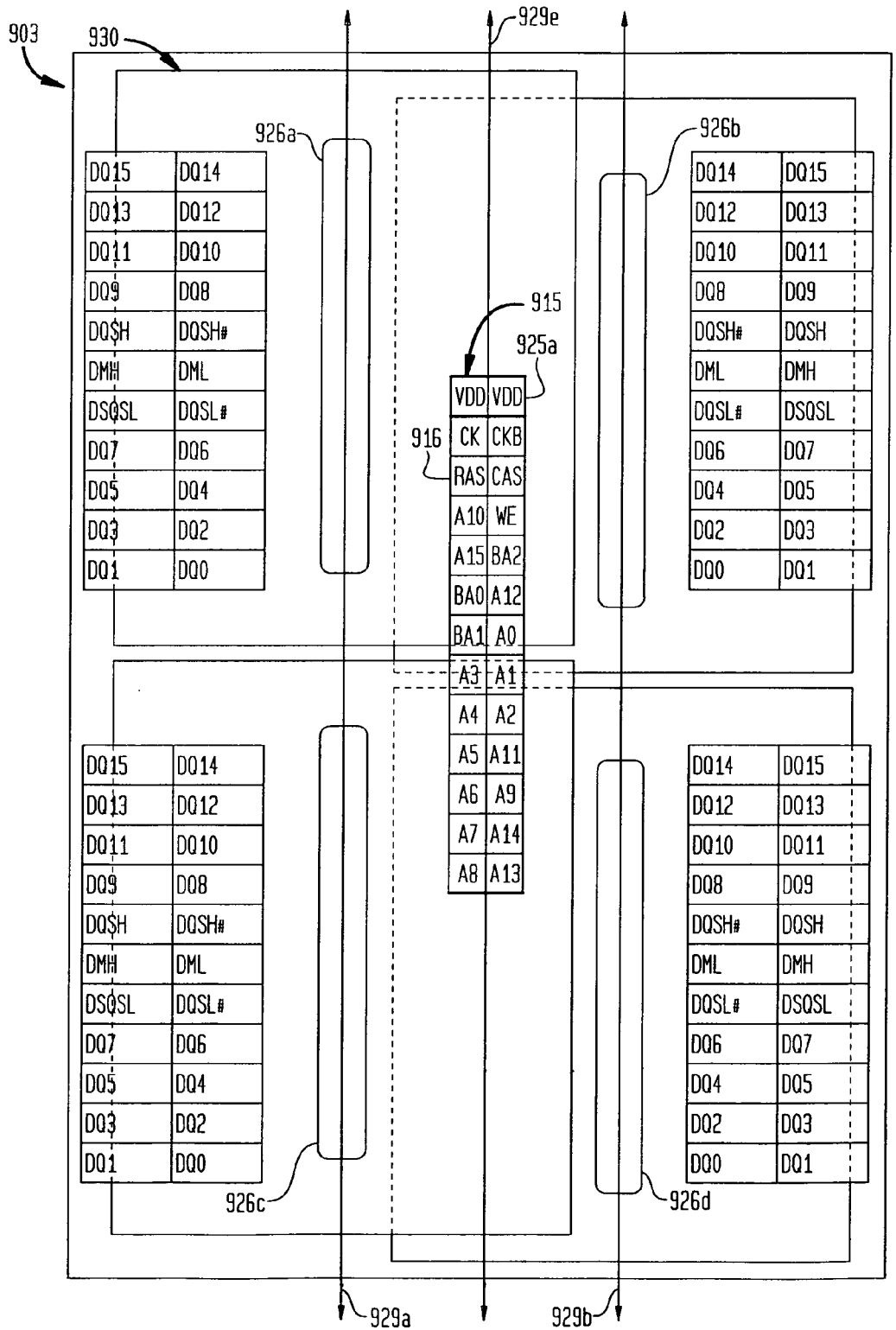
FIGS. 9E-9H are variations of the microelectronic package of FIG. 9A having four microelectronic elements aligned along two parallel axes.

The microelectronic package 903 shown in FIG. 9E has first terminals 925*a* arranged in a single grid 915 having two parallel columns 916. The microelectronic package 903' shown in FIG. 9F has first terminals 925*a* arranged in two parallel grids 915 mirrored with respect to one another about an axis 929e extending therebetween, each grid having two parallel columns 916.

Figure 9F:
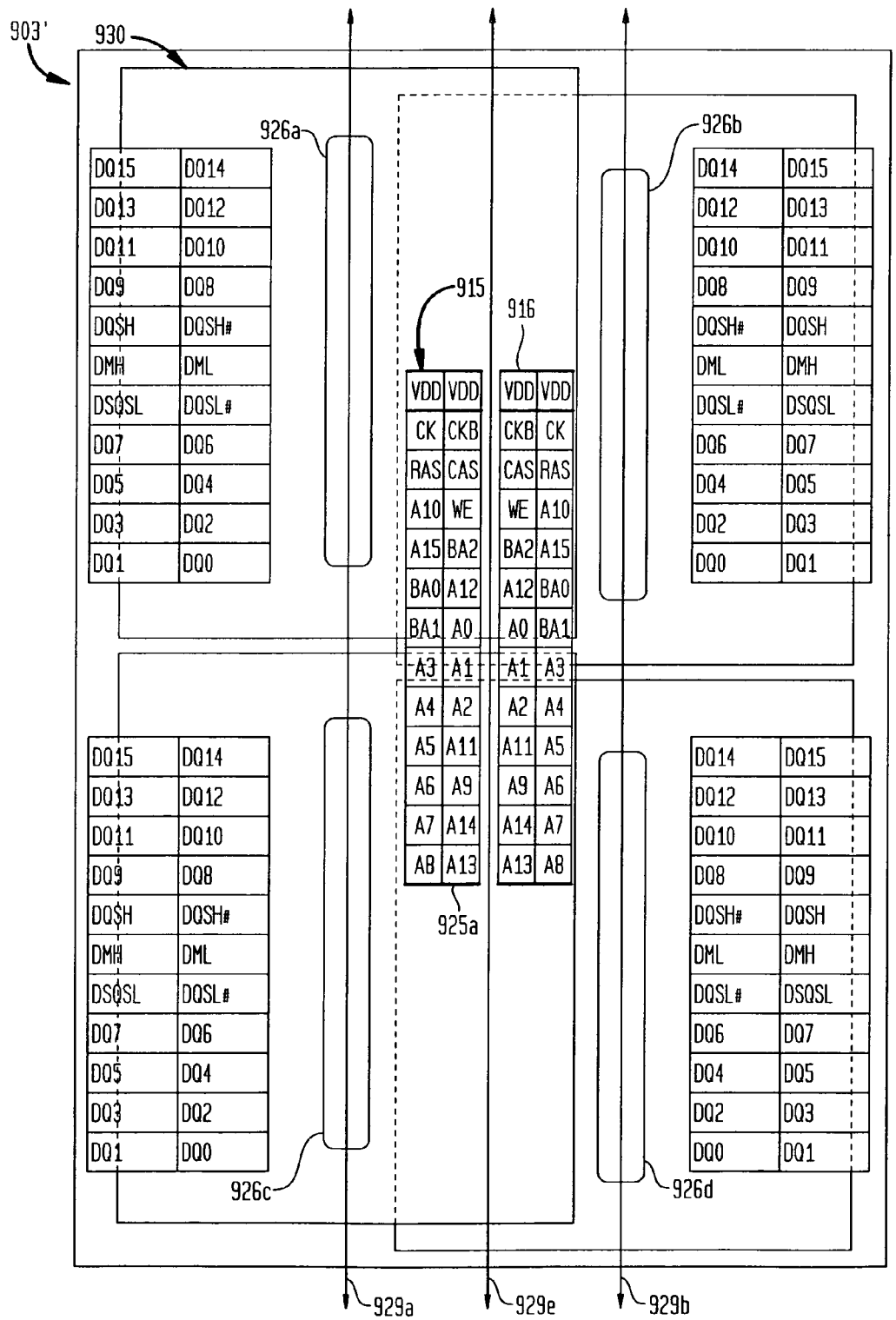
Figure 9G:
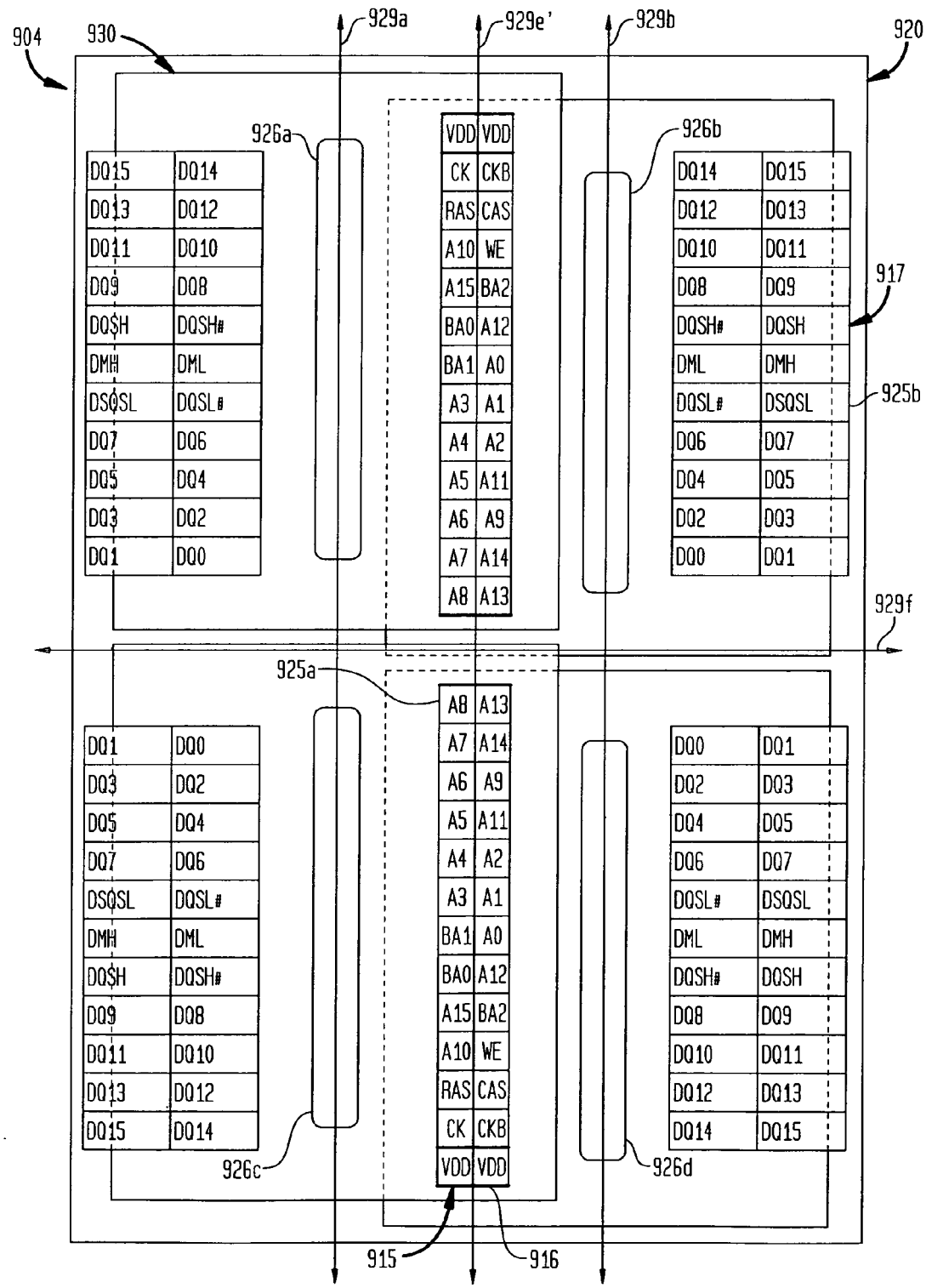

The microelectronic package 904 shown in FIG. 9G has first terminals 925a arranged in two grids 915 arranged along a first intermediate axis 929e', each grid having two parallel columns 916. The two grids 915 of first terminals 925a can be mirrored with respect to one another about a second intermediate axis 929f, the second intermediate axis being transverse (i.e., cross-wise) to the first intermediate axis. In one embodiment, the second intermediate axis 929f can be orthogonal to the first intermediate axis 929e'. Each of the grids 917 of second terminals 925b can also be mirrored with respect to another one of the grids 917 about the first intermediate axis 929e' and/or the second intermediate axis 929f, or each grid 917 can be mirrored with respect to one or more of the other grids 917 about any other intermediate axes extending between pairs of the grids 917.

Figure 9H:
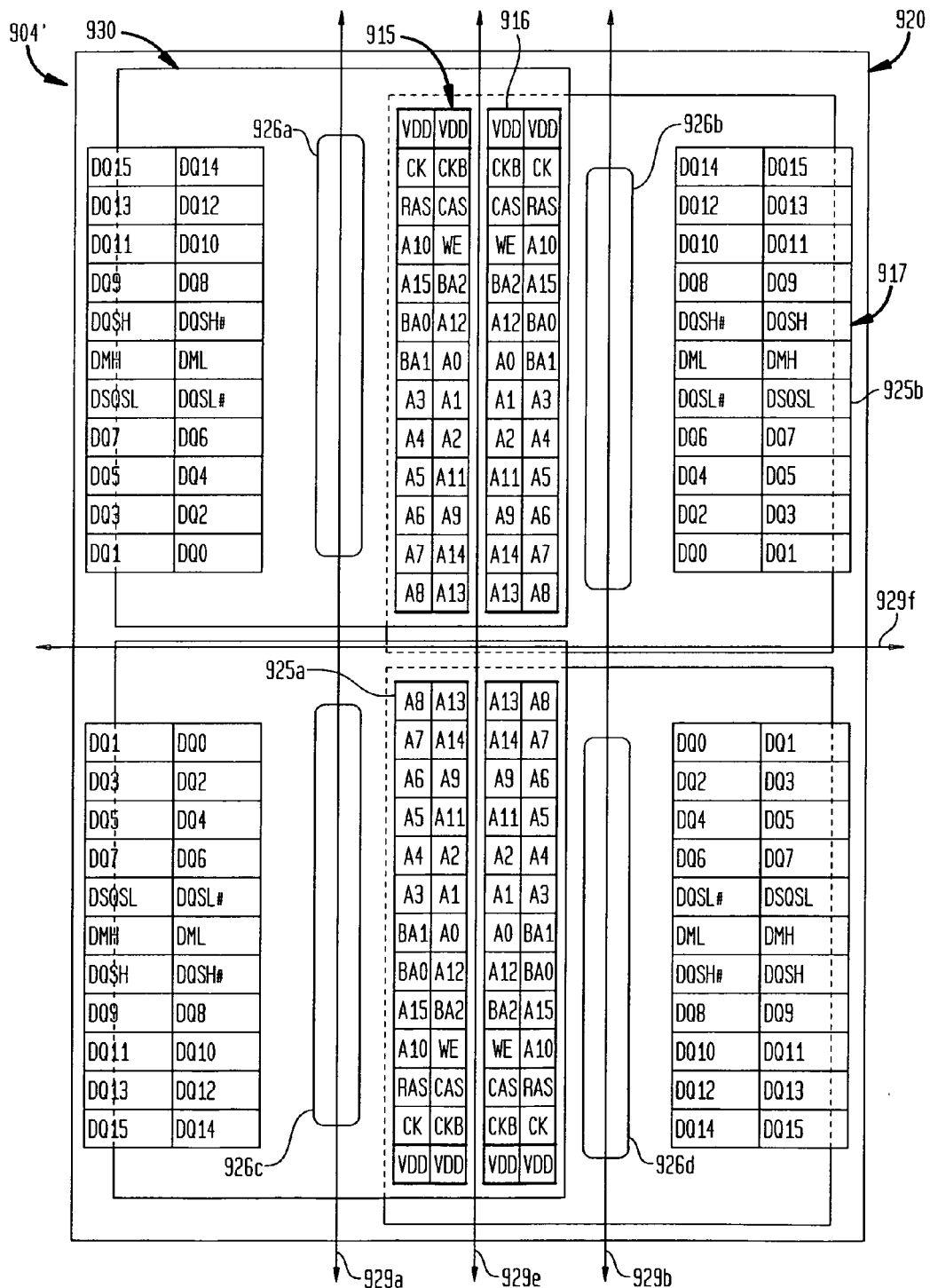

The microelectronic package 904' shown in FIG. 9H has first terminals 925a arranged in four parallel grids 915, each grid having two parallel columns 916, each grid 915 mirrored with respect to at least one additional grid 915 about a first intermediate axis 929e extending between adjacent grids 915 in a direction parallel to the first and second axes 929a and 929b and/or about a second intermediate axis 929f extending between adjacent grids 915 in a direction transverse to the first and second axes. In one embodiment, the second intermediate axis 929f can be orthogonal to the first and second axes 929a and 929b. Each of the grids 917 of second terminals 925b can also be mirrored with respect to another one of the grids 917 about the first intermediate axis 929e and/or the second intermediate axis 929f, or each grid 917 can be mirrored with respect to one or more of the other grids 917 about any other intermediate axes extending between pairs of the grids 917.

Figure 10A:
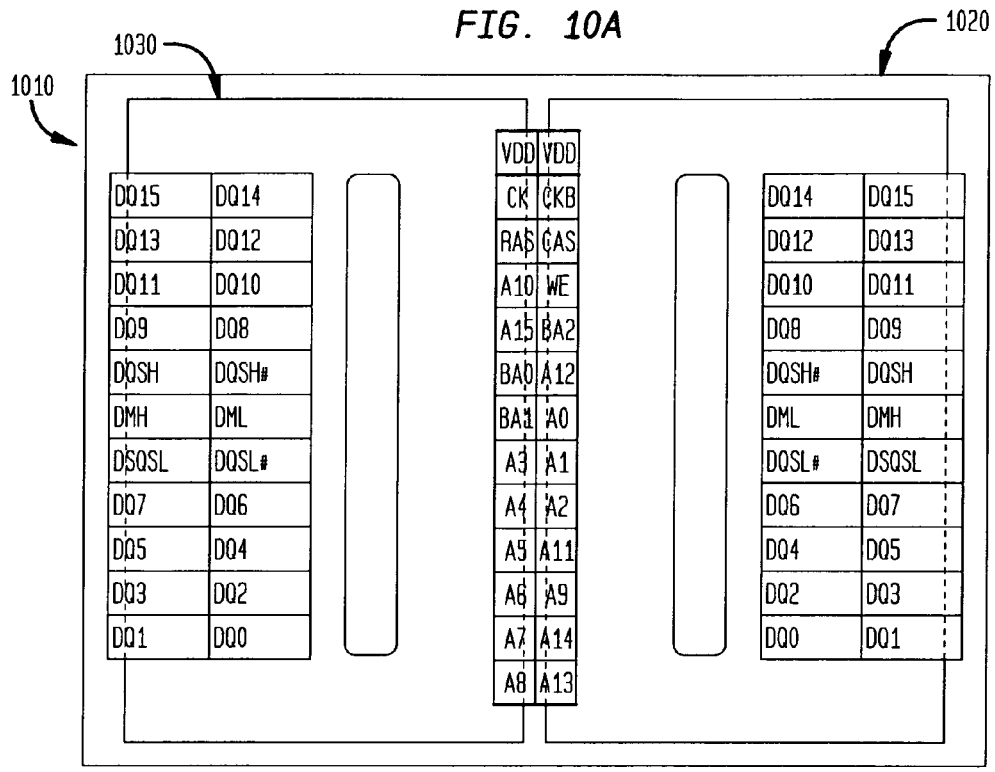
FIG. 10A is a diagrammatic bottom plan view of a microelectronic package according to yet another embodiment having two microelectronic elements oriented in a single plane.
Figure 10B:
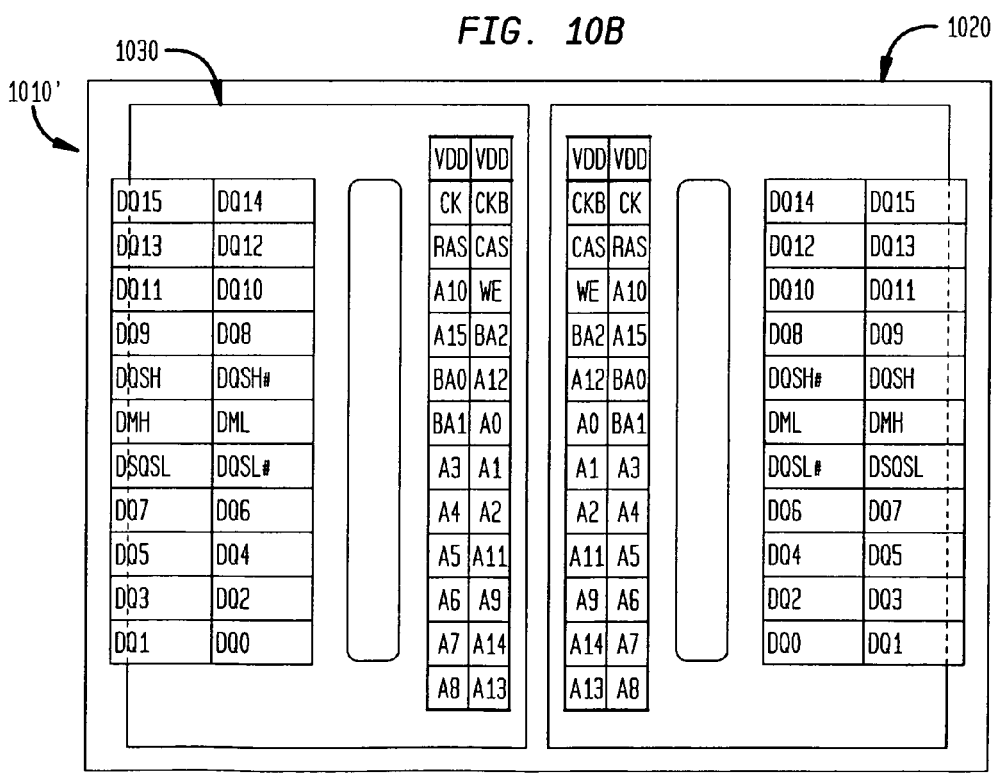
FIG. 10B is a variation of the microelectronic package of FIG. 10A having two grids of terminals, each grid arranged in two columns.

FIGS. 10A and 10B show variations of the embodiments of the microelectronic packages shown in FIGS. 5A and 7A, respectively. The microelectronic package 1010 shown in FIG. 10A is the same as the microelectronic package 10 shown in FIG. 5A, except that the microelectronic elements 1030 of the microelectronic package 1010 each have front surfaces 1031 arranged in a single plane parallel to the first surface 1021 of the substrate 1020. The microelectronic package 1010' shown in FIG. 10B is the same as the microelectronic package 710 shown in FIG. 7A, except that the microelectronic elements 1030 of the microelectronic package 1010' each have front surfaces 1031 arranged in a single plane parallel to the first surface 1021 of the substrate 1020.

FIG. 11 shows a variation of the embodiment of the microelectronic package shown in FIG. 8A. The microelectronic package 1110 shown in FIG. 11 is the same as the microelectronic package 810 shown in FIG. 8A, except that the microelectronic elements 1130 of the microelectronic package 1110 each have front surfaces 1131 arranged in a single plane parallel to the first surface 1121 of the substrate 1120.

Figure 12A:
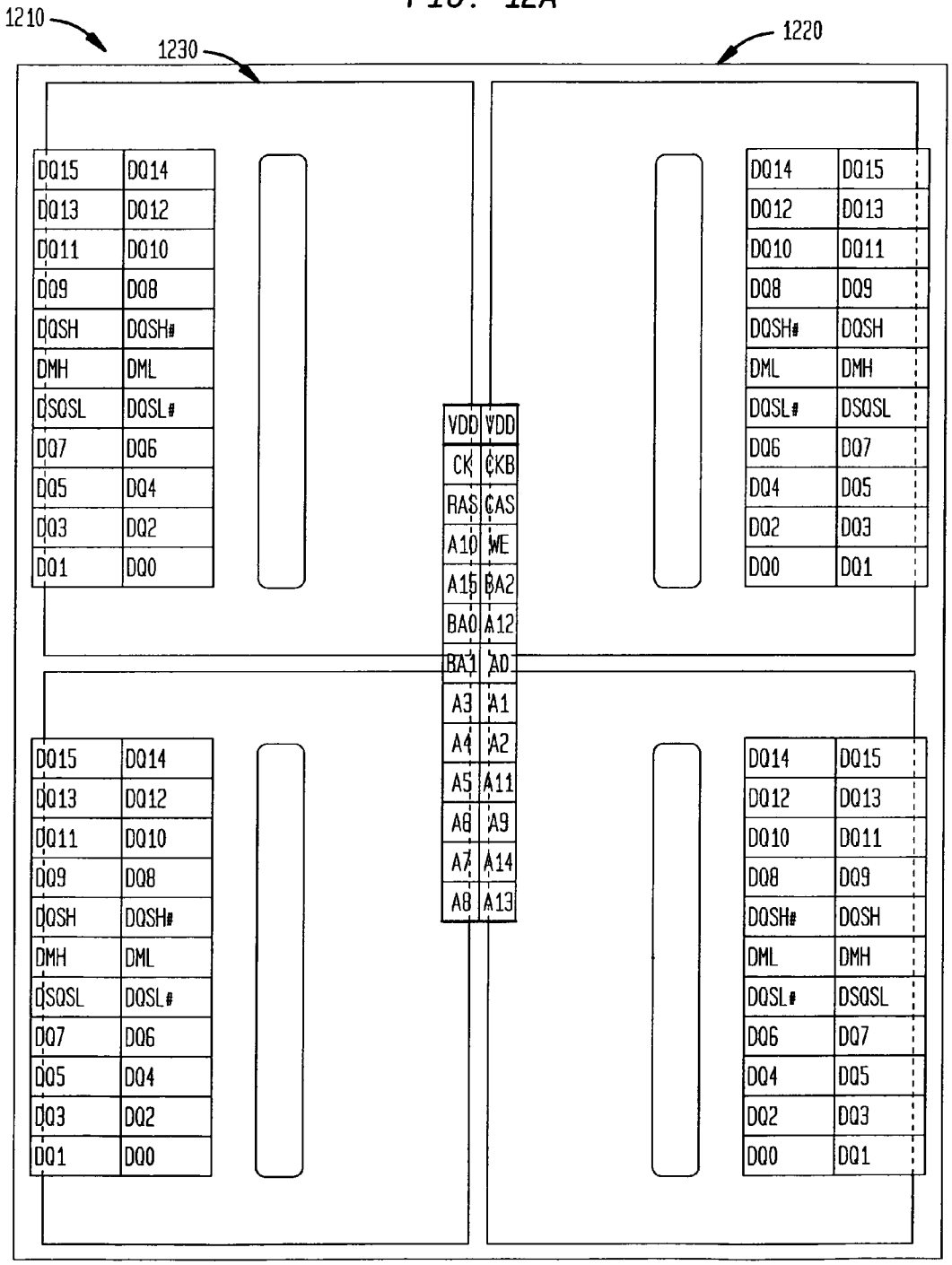
Figure 12B:
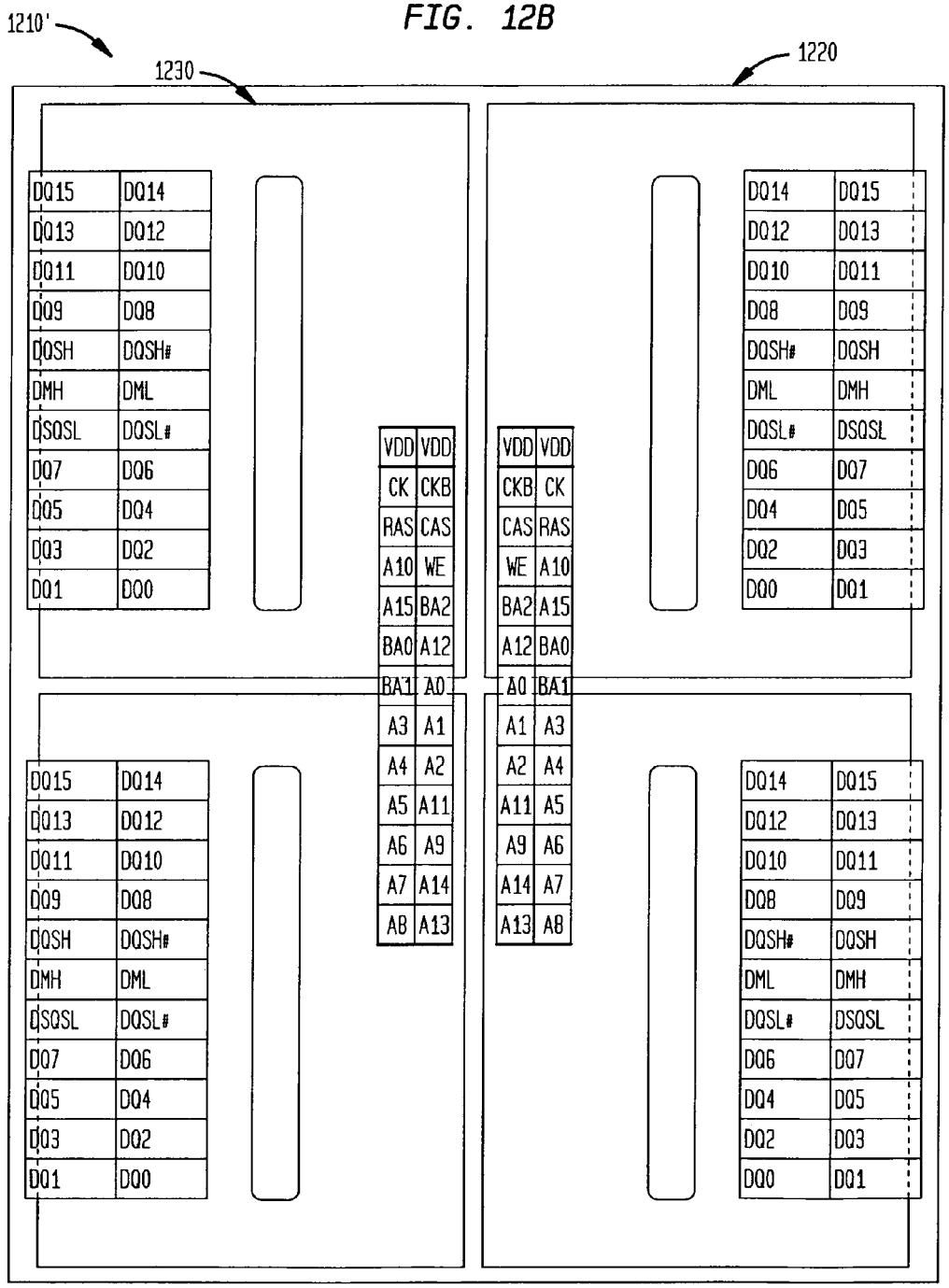

FIGS. 12A and 12B show variations of the embodiments of the microelectronic packages shown in FIGS. 9E and 9F, respectively. The microelectronic package 1210 shown in FIG. 12A is the same as the microelectronic package 903 shown in FIG. 9E, except that the microelectronic elements 1230 of the microelectronic package 1210 each have front surfaces 1231 arranged in a single plane parallel to the first surface 1221 of the substrate 1220. The microelectronic package 1210' shown in FIG. 12B is the same as the microelectronic package 903' shown in FIG. 9F, except that the microelectronic elements 1230 of the microelectronic package 1210' each have front surfaces 1231 arranged in a single plane parallel to the first surface 1221 of the substrate 1220.

FIGS. 12C and 12D show variations of the embodiments of the microelectronic packages shown in FIGS. 9G and 9H, respectively. The microelectronic package 1201 shown in FIG. 12C is the same as the microelectronic package 904 shown in FIG. 9G, except that the microelectronic elements 1230 of the microelectronic package 1201 each have front surfaces 1231 arranged in a single plane parallel to the first surface 1221 of the substrate 1220. The microelectronic package 1201' shown in FIG. 12D is the same as the microelectronic package 904' shown in FIG. 9H, except that the microelectronic elements 1230 of the microelectronic package 1201' each have front surfaces 1231 arranged in a single plane parallel to the first surface 1221 of the substrate 1220.

Figure 13:
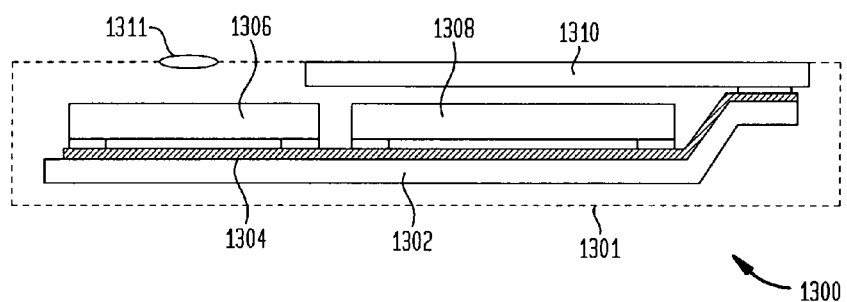
FIG. 13 is a schematic sectional view illustrating a system according to an embodiment of the invention

The microelectronic packages and microelectronic assemblies described above with reference to FIGS. 5A through 12D can be utilized in construction of diverse electronic systems, such as the system 1300 shown in FIG. 13. For example, the system 1300 in accordance with a further embodiment of the invention includes a plurality of modules or components 1306 such as the microelectronic packages and/or microelectronic assemblies as described above in conjunction with other electronic components 1308 and 1310.

In the exemplary system 1300 shown, the system can include a circuit panel, motherboard, or riser panel 1302 such as a flexible printed circuit board, and the circuit panel can include numerous conductors 1304, of which only one is depicted in FIG. 13, interconnecting the modules or components 1306 with one another. Such a circuit panel 1302 can transport signals to and from each of the microelectronic packages and/or microelectronic assemblies included in the system 1300. However, this is merely exemplary; any suitable structure for making electrical connections between the modules or components 1306 can be used.

In a particular embodiment, the system 1300 can also include a processor such as the semiconductor chip 1308, such that each module or component 1306 can be configured to transfer a number N of data bits in parallel in a clock cycle, and the processor can be configured to transfer a number M of data bits in parallel in a clock cycle, M being greater than or equal to N.

In one example, the system 1300 can include a processor chip 1308 that is configured to transfer thirty-two data bits in parallel in a clock cycle, and the system can also include four modules 1306 such as the microelectronic package 10 described with reference to FIG. 5A, each module 1306 configured to transfer eight data bits in parallel in a clock cycle (i.e., each module 1306 can include first and second microelectronic elements, each of the two microelectronic elements being configured to transfer four data bits in parallel in a clock cycle).

In another example, the system 1300 can include a processor chip 1308 that is configured to transfer sixty-four data bits in parallel in a clock cycle, and the system can also include four modules 1306 such as the microelectronic package 910 described with reference to FIG. 9A, each module 1306 configured to transfer sixteen data bits in parallel in a clock cycle (i.e., each module 1306 can include four microelectronic elements, each of the four microelectronic elements being configured to transfer four data bits in parallel in a clock cycle).

In the example depicted in FIG. 13, the component 1308 is a semiconductor chip and component 1310 is a display screen, but any other components can be used in the system 1300. Of course, although only two additional components 1308 and 1310 are depicted in FIG. 13 for clarity of illustration, the system 1300 can include any number of such components.

Modules or components 1306 and components 1308 and 1310 can be mounted in a common housing 1301, schematically depicted in broken lines, and can be electrically interconnected with one another as necessary to form the desired circuit. The housing 1301 is depicted as a portable housing of the type usable, for example, in a cellular telephone or personal digital assistant, and screen 1310 can be exposed at the surface of the housing. In embodiments where a structure 1306 includes a light-sensitive element such as an imaging chip, a lens 1311 or other optical device also can be provided for routing light to the structure. Again, the simplified system shown in FIG. 13 is merely exemplary; other systems, including systems commonly regarded as fixed structures, such as desktop computers, routers and the like can be made using the structures discussed above.

Figure 14:
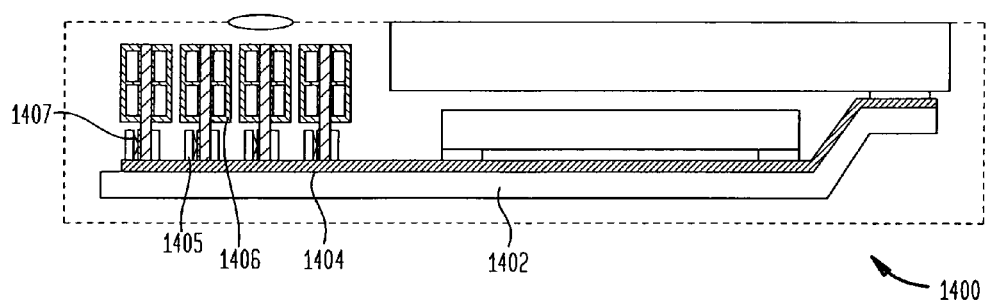
FIG. 14 is a schematic sectional view illustrating a system according to an embodiment of the invention.

The microelectronic packages and microelectronic assemblies described above with reference to FIGS. 5A through 12D can also be utilized in construction of an electronic system such as the system 1400 shown in FIG. 14. For example, the system 1400 in accordance with a further embodiment of the invention is the same as the system 1300 shown in FIG. 13, except the component 1306 has been replaced by a plurality of components 1406.

Each of the components 1406 can be or can include one or more of the microelectronic packages or microelectronic assemblies described above with reference to FIGS. 5A through 12D. In a particular example, one or more of the components 1406 can be a variation of the microelectronic assembly 5 shown in FIG. 5A, in which the circuit panel 60 includes exposed edge contacts, and the circuit panel 60 of each microelectronic assembly 5 can be suitable for insertion into a socket 1405.

Each socket 1405 can include a plurality of contacts 1407 at one or both sides of the socket, such that each socket 1405 can be suitable for mating with corresponding exposed edge contacts of a corresponding component 1406 such as the above-described variation of the microelectronic assembly 5. In the exemplary system 1400 shown, the system can include a second circuit panel 1402 or motherboard such as a flexible printed circuit board, and the second circuit panel can include numerous conductors 1404, of which only one is depicted in FIG. 14, interconnecting the components 1406 with one another.

In a particular example, a module such as the system 1400 can include a plurality of components 1406, each component 1406 being the above-described variation of the microelectronic assembly 5. Each component 1406 can be mounted to, and electrically connected with the second circuit panel 1402 for transport of signals to and from each component 1406. The specific example of the system 1400 is merely exemplary; any suitable structure for making electrical connections between the components 1406 can be used.

In any or all of the microelectronic packages described in the foregoing, the rear surface of one or more of the microelectronic elements can be at least partially exposed at an exterior surface of the microelectronic package after completing fabrication. Thus, in the microelectronic package 10 described above with respect to FIG. 5A, the rear surface of the microelectronic elements can be partially or fully exposed at an exterior surface of an encapsulant in the completed microelectronic package 10.

In any of the embodiments described above, the microelectronic packages and microelectronic assemblies may include a heat spreader partly or entirely made of any suitable thermally conductive material. Examples of suitable thermally conductive material include, but are not limited to, metal, graphite, thermally conductive adhesives, e.g., thermally-conductive epoxy, a solder, or the like, or a combination of such materials. In one example, the heat spreader can be a substantially continuous sheet of metal.

In the example shown in FIG. 5B, the microelectronic package 10 can include a heat sink or heat spreader 55 that can be thermally coupled to a surface of one or more of the microelectronic elements 30a and 30b, e.g., the rear surface 33 of the second microelectronic element 30b, such as through a thermally conductive material such as thermal adhesive, thermally conductive grease, or solder, among others. In a particular example (not shown), the heat spreader 55 can include a plurality of fins at one or more surfaces thereof.

In one embodiment, the heat spreader can include a metallic layer disposed adjacent to one or more of the microelectronic elements. The metallic layer may be exposed at a rear surface of the microelectronic package. Alternatively, the heat spreader can include an overmold or an encapsulant covering at least the rear surface of one or more of the microelectronic elements. In one example, the heat spreader can be in thermal communication with at least one of the front surface and rear surface of one or more of the microelectronic elements' such as the microelectronic elements 30a and 30b shown in FIGS. 5A and 5B. In some embodiments, the heat spreader can extend between adjacent edges of adjacent ones of the microelectronic elements. The heat spreader can improve heat dissipation to the surrounding environment.

In a particular embodiment, a pre-formed heat spreader made of metal or other thermally conductive material may be attached to or disposed on the rear surface of one or more of the microelectronic elements with a thermally conductive material such as thermally conductive adhesive or thermally conductive grease. The adhesive, if present, can be a compliant material that permits relative movement between the heat spreader and the microelectronic element to which it is attached, for example, to accommodate differential thermal expansion between the compliantly attached elements. The heat spreader may be a monolithic structure. Alternatively, the heat spreader may include multiple spreader portions spaced apart from one another. In a particular embodiment, the heat spreader may be or include a layer of solder joined directly to at least a portion of a rear surface of one or more of microelectronic elements such as the microelectronic elements 30a and 30b shown in FIGS. 5A and 5B.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

INDUSTRIAL APPLICABILITY

The present invention enjoys wide industrial applicability including, but not limited to, microelectronic packages and methods of fabricating microelectronic packages.

The invention claimed is:

1. A microelectronic package, comprising:
a substrate having first and second opposed surfaces, first and second opposed edges extending between the first and second surfaces, and first and second apertures extending between the first and second surfaces, the apertures having first and second parallel axes extending in directions of the lengths of the respective apertures, the second surface having a central region between the first and second axes and first and second peripheral regions between the central region and the respective first and second edges;
first and second microelectronic elements each having a surface facing the first surface of the substrate and contacts exposed at the surface of the respective microelectronic element and aligned with at least one of the apertures, each microelectronic element having memory storage array function;
terminals exposed at the second surface and configured for connecting the microelectronic package to at least one component external to the microelectronic package; and
leads electrically connected between the contacts of each microelectronic element and the terminals, each lead having a portion aligned with at least one of the apertures,
wherein the terminals include first terminals configured to carry address information, the first terminals including a first set thereof disposed in the first peripheral region and a second set thereof disposed in the second peripheral region, and
wherein the first terminals of the first set are electrically connected with the first microelectronic element and not electrically connected with the second microelectronic element, and the first terminals of the second set are electrically connected with the second microelectronic element and not electrically connected with the first microelectronic element.

2. The microelectronic package as claimed in claim 1, wherein the first terminals are configured to carry all of the address information usable by circuitry within the microelectronic package.

3. The microelectronic package as claimed in claim 1, wherein the first set of first terminals and the second set of first terminals are each configured to carry all of the same signals.

4. The microelectronic package as claimed in claim 1, wherein the signal assignments of corresponding ones of the first terminals in the first and second sets are symmetric about a theoretical third axis between the first and second sets, the third axis being parallel to the first and second axes.

5. The microelectronic package as claimed in claim 4, wherein the third axis is located within one ball pitch of the terminals of a centerline of the substrate located equidistant between the first and second opposed edges.

6. The microelectronic package as claimed in claim 1, wherein the first terminals of the first and second sets are disposed at positions within respective first and second grids, and columns of the first terminals in the first and second grids extend in a direction parallel to the first and second opposed edges of the substrate.

7. The microelectronic package as claimed in claim 1, wherein the terminals further include second terminals disposed in the central region and configured to carry second information, the second information being other than the information carried by the first terminals, the second information including data signals.

8. The microelectronic package as claimed in claim 7, wherein the second terminals include a first set thereof disposed on a first side of a theoretical third axis and a second set thereof disposed on a second side of the third axis opposite from the first side, each of the first and second sets configured to carry the same data signals.

9. The microelectronic package as claimed in claim 8, wherein the signal assignments of corresponding ones of the second terminals in the first and second sets are symmetric about the third axis, the third axis being parallel to the first and second axes.

10. The microelectronic package as claimed in claim 8, wherein the third axis is located within one ball pitch of the terminals of a centerline of the substrate located equidistant between the first and second opposed edges.

11. The microelectronic package as claimed in claim 8, wherein the second terminals of the first and second sets are disposed at positions within respective first and second grids, and columns of the second terminals in the first and second grids extend in a direction parallel to the first and second opposed edges of the substrate.

12. The microelectronic package as claimed in claim 1, wherein at least some of the second terminals that are configured to carry information other than the address information are exposed at the second surface in at least one of the peripheral regions.

13. The microelectronic package as claimed in claim 1, wherein each of the microelectronic elements embodies a greater number of active devices to provide memory storage array function than any other function.

14. The microelectronic package as claimed in claim 1, wherein the surface of the first microelectronic element confronts the first surface of the substrate, and wherein the surface of the second microelectronic element at least partially overlies a rear surface of the first microelectronic element.

15. The microelectronic package as claimed in claim 1, wherein the surfaces of all of the microelectronic elements are arranged in a single plane parallel to the first surface of the substrate.

16. The microelectronic package as claimed in claim 1, wherein at least some of the leads include wire bonds extending through at least one of the apertures.

17. The microelectronic package as claimed in claim 1, wherein the first terminals are configured to carry information that controls an operating mode of the microelectronic elements.

18. The microelectronic package as claimed in claim 1, wherein the first terminals are configured to carry all of the command signals transferred to the microelectronic package, the command signals being write enable, row address strobe, and column address strobe signals.

19. The microelectronic package as claimed in claim 1, wherein the first terminals are configured to carry clock signals transferred to the microelectronic package, the clock signals being clocks used for sampling signals carrying the address information.

20. The microelectronic package as claimed in claim 1, wherein the first terminals are configured to carry all of the bank address signals transferred to the microelectronic package.

21. A system comprising a microelectronic package according to claim 1 and one or more other electronic components electrically connected to the microelectronic package.

22. The system as claimed in claim 21, further comprising a housing, the microelectronic package and the one or more other electronic components being assembled with the housing.

* * * * *